(12) United States Patent
Mori et al.

(10) Patent No.: US 10,503,068 B2
(45) Date of Patent: Dec. 10, 2019

(54) METHOD FOR FORMING RESIST PATTERN

(71) Applicant: TOKYO OHKA KOGYO CO., LTD., Kawasaki-shi (JP)

(72) Inventors: Takayoshi Mori, Kawasaki (JP); Ryoji Watanabe, Kawasaki (JP); Yoichi Hori, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 216 days.

(21) Appl. No.: 15/366,244

(22) Filed: Dec. 1, 2016

(65) Prior Publication Data
US 2017/0168396 A1 Jun. 15, 2017

(30) Foreign Application Priority Data
Dec. 10, 2015 (JP) .................................. 2015-241538

(51) Int. Cl.
| G03F 7/004 | (2006.01) |
| G03F 7/039 | (2006.01) |
| G03F 7/16  | (2006.01) |
| G03F 7/20  | (2006.01) |
| G03F 7/32  | (2006.01) |
| G03F 7/00  | (2006.01) |

(52) U.S. Cl.
CPC .......... *G03F 7/0397* (2013.01); *G03F 7/0035* (2013.01); *G03F 7/162* (2013.01); *G03F 7/168* (2013.01); *G03F 7/2006* (2013.01); *G03F 7/322* (2013.01); *G03F 7/0045* (2013.01)

(58) Field of Classification Search
CPC ...... G03F 7/0035; G03F 7/0045; G03F 7/031; G03F 7/38; G03F 7/322
USPC ............................................. 430/330, 273.1
See application file for complete search history.

(56) References Cited

U.S. PATENT DOCUMENTS

| 8,623,739 B2 * | 1/2014 | Lee .......................... G03F 7/40 438/400 |
| 2010/0248167 A1 | 9/2010 | Konno |
| 2013/0011619 A1 | 1/2013 | Fujii et al. |
| 2013/0122425 A1 * | 5/2013 | Yoshida .................. G03F 7/405 430/285.1 |
| 2013/0209941 A1 | 8/2013 | Motoike et al. |
| 2015/0253670 A1 | 9/2015 | Fukami |
| 2016/0062232 A1 | 3/2016 | Hong et al. |
| 2016/0299427 A1 | 10/2016 | Kim et al. |

FOREIGN PATENT DOCUMENTS

| JP | 2002-006512 A | 1/2002 |
| JP | 2004-093652 A | 3/2004 |
| JP | 2008039811 A * | 2/2008 | ................ G03F 7/11 |
| JP | 2011-221501 A | 11/2011 |
| JP | A-2013-164509 | 8/2013 |
| JP | 2013-225026 A | 10/2013 |
| JP | 2015-180920 A | 10/2015 |
| JP | 2016-048373 A | 4/2016 |
| WO | WO 2009/078207 A1 | 6/2009 |

OTHER PUBLICATIONS

English Translation of JP2008039811A, Feb. 2008, Resist undercoat film material, and resist undercoat film substrate and pattern forming method using the same.*

Office Action issued in Japanese Patent Application No. 2015-241538, dated Sep. 3, 2019.

* cited by examiner

*Primary Examiner* — Daborah Chacko-Davis
(74) *Attorney, Agent, or Firm* — Knobbe, Martens, Olson & Bear LLP

(57) ABSTRACT

A method for forming a resist pattern including forming a first contact hole pattern including a hole portion and a hole-unformed portion, which includes alkali developing the exposed positive-type resist film; preparing a structure including the first contact hole pattern and a first layer which covers the first contact hole pattern, which includes forming a first layer by applying a solution including an acid or a thermal acid generator onto a support on which the first contact hole pattern is formed; forming organic solvent-soluble and organic solvent-insoluble regions on the hole-unformed portion, which includes heating the structure; and forming a second contact hole pattern on the hole-unformed portion, which includes developing the heated structure with an organic solvent.

4 Claims, 4 Drawing Sheets

FIG. 2B1

METHOD FOR FORMING RESIST PATTERN

CROSS-REFERENCE TO RELATED APPLICATIONS

This application claims priority to Japanese Patent Application No. 2015-241538, filed Dec. 10, 2015, the content of which is incorporated herein by reference.

BACKGROUND OF THE INVENTION

Field of the Invention

The present invention relates to a method for forming a resist pattern.

Background Art

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film.

A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have led to rapid progress in the field of pattern miniaturization.

Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use an exposure light source having a wavelength shorter (energy higher) than these excimer lasers, such as electron beam, extreme ultraviolet radiation (EUV), and X ray.

As means for providing a further fine pattern, a double patterning process is suggested, in which patterning is performed a plurality of times to form a resist pattern. According to the double patterning process, for example, a first resist pattern is formed by performing patterning on a support using a first resist composition and then patterning is performed on the support on which the first resist pattern is formed using a second resist composition, so as to be able to form a resist pattern with higher resolution than that of the resist pattern formed by performing patterning once.

First, Japanese Unexamined Patent Application, Publication No. 2013-164509 discloses a method in which a first resist pattern is formed on a support, a $SiO_2$ film is formed on the support where the first resist pattern is formed, etching is performed using the $SiO_2$ film as a sacrifice film, and then the first resist pattern is removed to form a second pattern of the $SiO_2$ film.

SUMMARY OF THE INVENTION

However, the aforementioned method has a problem in that exposure is required a plurality of times or a treatment is complicated because of a number of steps, and the method for forming a fine pattern needs to be more improved.

The present invention has been made in view of the aforementioned circumstances and an object thereof is to provide a method for forming a resist pattern which can form a fine pattern more simply.

According to the aspect of the present invention, there is provided a method for forming a resist pattern including: a step A of forming a first contact hole pattern including a hole portion and a hole-unformed portion, which includes forming a positive-type resist film on a support, exposing the positive-type resist film, and alkali developing the exposed positive-type resist film; a step B of preparing a structure including the first contact hole pattern and a first layer which covers the first contact hole pattern, which includes forming a first layer by applying a solution including an acid or a thermal acid generator onto a support on which the first contact hole pattern is formed so as to cover the first contact hole pattern; a step C of forming an organic solvent-soluble region and an organic solvent-insoluble region on the hole-unformed portion, which includes heating the structure to cause the action of an acid generated from the thermal acid generator or an acid in the first layer; and a step D of forming a second contact hole pattern on the hole-unformed portion, which includes developing the heated structure by an organic solvent to remove the organic solvent-soluble region while maintaining the hole portion of the first contact hole pattern.

In this case, it is possible to provide a method for forming a resist pattern which can form a fine pattern.

DETAILED DESCRIPTION OF THE INVENTION

Figure 1A:
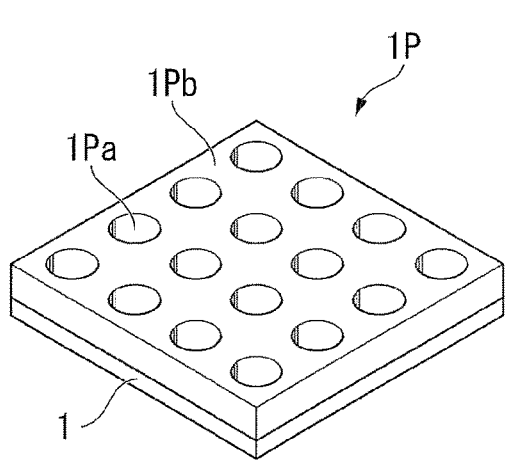
FIGS. 1A to 1D are views illustrating a first embodiment of the method for forming a resist pattern of the invention.

In the present description and claims, the term "aliphatic" is a relative concept used in relation to the term "aromatic", and defines a group or a compound that has no aromaticity.

The term "alkyl group" includes a linear, branched or cyclic, monovalent saturated hydrocarbon group, unless otherwise specified. The same applies for an alkyl group within an alkoxy group.

The term "alkylene group" includes a linear, branched or cyclic, divalent saturated hydrocarbon group, unless otherwise specified.

A "halogenated alkyl group" is a group in which a part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which a part or all of the hydrogen atoms of an alkyl group or an alkylene group is substituted with a fluorine atom.

The term "structural unit" refers to a monomer unit that contributes to the formation of a polymeric compound (resin, polymer, copolymer).

A "structural unit derived from an acrylic ester" refers to a structural unit that is formed by the cleavage of the ethylenic double bond of an acrylic ester.

An "acrylic ester" refers to a compound in which the terminal hydrogen atom of the carboxy group of acrylic acid ($CH_2$=CH—COOH) is substituted with an organic group.

With respect to the acrylic ester, the hydrogen atom bonded to the carbon atom present on the α-position may be substituted with a substituent. The substituent ($R^α$) that may substitute the hydrogen atom bonded to the carbon atom present on the α-position is an atom other than the hydrogen atom or a group, and examples thereof include an alkyl group having 1 to 5 carbon atoms, a halogenated alkyl group having 1 to 5 carbon atoms, and a hydroxyalkyl group. A carbon atom on the α-position of an acrylic ester refers to the carbon atom bonded to the carbonyl group, unless specified otherwise.

Hereinafter, an acrylic ester having a substituent which substitutes the hydrogen atom bonded to the carbon atom present on the α-position is sometimes referred to as "α-substituted acrylic ester". Further, acrylic esters and α-substituted acrylic esters are collectively referred to as "(α-substituted) acrylic ester".

A "structural unit derived from a hydroxystyrene derivative" refers to a structural unit that is formed by the cleavage of the ethylenic double bond of hydroxystyrene or a hydroxystyrene derivative.

The term "hydroxystyrene derivative" includes compounds in which the hydrogen atom at the α-position of hydroxystyrene is substituted with a substituent such as an alkyl group or a halogenated alkyl group; and derivatives thereof. Examples of the derivatives thereof include hydroxystyrene in which the hydrogen atom of the hydroxyl group is substituted with an organic group and which may have a substituent which substitutes the hydrogen atom on the α-position; and hydroxystyrene which has a substituent other than a hydroxyl group bonded to the benzene ring and may have a substituent which substitutes the hydrogen atom on the α-position. Here, the α-position (carbon atom on the α-position) refers to the carbon atom having the benzene ring bonded thereto, unless specified otherwise.

As the substituent which substitutes the hydrogen atom on the α-position of hydroxystyrene, the same substituents as those described above for the substituent on the α-position of the aforementioned α-substituted acrylic ester can be exemplified.

A "structural unit derived from vinylbenzoic acid or a vinylbenzoic acid derivative" refers to a structural unit that is formed by the cleavage of the ethylenic double bond of vinylbenzoic acid or a vinylbenzoic acid derivative.

The term "vinylbenzoic acid derivative" includes a compound in which the hydrogen atom at the α-position of vinylbenzoic acid is substituted with other substituents such as an alkyl group or a halogenated alkyl group; and derivatives thereof. Examples of the derivatives thereof include vinylbenzoic acid in which the hydrogen atom of the carboxy group is substituted with an organic group and may have a substituent which substitutes the hydrogen atom on the α-position; and vinylbenzoic acid which has a substituent other than a hydroxyl group and a carboxy group bonded to the benzene ring and may have a substituent which substitutes the hydrogen atom on the α-position. Here, the α-position (carbon atom on the α-position) refers to the carbon atom having the benzene ring bonded thereto, unless specified otherwise.

The term "styrene derivative" includes a compound in which the hydrogen atom on the α-position of styrene is substituted with other substituents such as an alkyl group and a halogenated alkyl group.

A "structural unit derived from styrene" or "structural unit derived from a styrene derivative" refers to a structural unit that is formed by the cleavage of the ethylenic double bond of styrene or a styrene derivative.

As for the alkyl group as a substituent on the α-position, a linear or branched alkyl group is preferable, and examples thereof include alkyl groups having 1 to 5 carbon atoms, such as a methyl group, an ethyl group, a propyl group, an isopropyl group, an n-butyl group, an isobutyl group, a tert-butyl group, a pentyl group, an isopentyl group and a neopentyl group.

Examples of the halogenated alkyl group as the substituent on the α-position include a group in which a part or all of the hydrogen atoms of the aforementioned "alkyl group as the substituent on the α-position" is substituted with halogen atoms. Examples of the halogen atom include a fluorine atom, a chlorine atom, a bromine atom and an iodine atom, and a fluorine atom is particularly preferable.

Examples of the hydroxyalkyl group as the substituent on the α-position include a group in which a part or all of the hydrogen atoms of the aforementioned "alkyl group as the substituent on the α-position" is substituted with a hydroxyl group. The number of hydroxyl groups in the hydroxyalkyl group is preferably 1 to 5, and most preferably 1.

A case with the description "may have a substituent" includes both of the case where the hydrogen atom (—H) is substituted with a monovalent group and the case where the methylene group (—$CH_2$—) is substituted with a divalent group.

The term "exposure" is used as a general concept that includes irradiation with any form of radiation.

Method for Forming a Resist Pattern

A first aspect of the method for forming a resist pattern of the invention includes a step A of forming a first contact hole pattern including a hole portion and a hole-unformed portion, which includes forming a positive-type resist film on a support, exposing the positive-type resist film, and alkali developing the exposed positive-type resist film; a step B of preparing a structure including the first contact hole pattern and a first layer which covers the first contact hole pattern, which includes forming a first layer by applying a solution including an acid or a thermal acid generator onto a support on which the first contact hole pattern is formed so as to cover the first contact hole pattern; a step C of forming an organic solvent-soluble region and an organic solvent-insoluble region on the hole-unformed portion, which includes heating the structure to cause the action of acid generated from the thermal acid generator or an acid in the first layer; and a step D of forming a second contact hole pattern on the hole-unformed portion, which developing the heated structure by an organic solvent to remove the organic solvent-soluble region while maintaining the hole portion of the first contact hole pattern.

Hereinafter, a method for forming a resist pattern of this aspect is described with reference to drawings.

First Embodiment

FIG. 1A to 1D schematically illustrate steps of the method for forming a resist pattern of a first embodiment. FIGS. 1A to 1D respectively illustrate a perspective view of the resist pattern.

First, as illustrated in FIG. 1A, a first contact hole pattern 1P including a hole portion 1Pa and a hole-unformed portion 1Pb is formed on a support 1 by using a positive-type resist composition (step A).

Figure 1B:
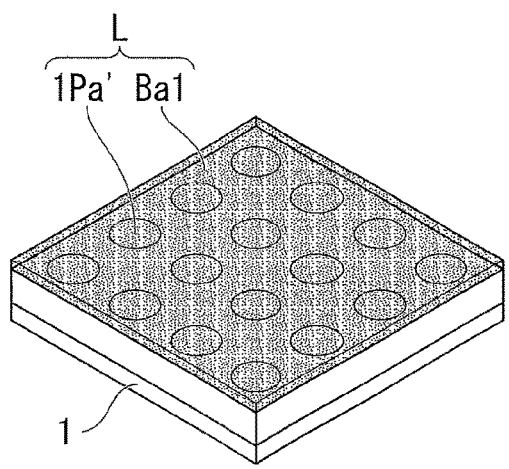

Next, as illustrated in FIG. 1B, a solution including an acid or a thermal acid generator is applied thereto so as to cover the first contact hole pattern 1P, and a structure including the first contact hole pattern 1P and a first layer L which covers the first contact hole pattern 1P is obtained (step B).

Figure 1C:
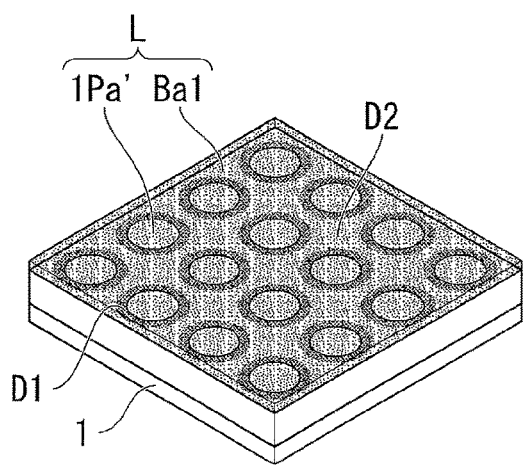

Thereafter, as illustrated in FIG. 1C, the structure is heated to change solubility of the surface of the first contact hole pattern 1P in a developing solution, and an organic solvent-soluble region D2 and an organic solvent-insoluble region D1 are formed on the hole-unformed portion 1Pb (step C).

Figure 1D:
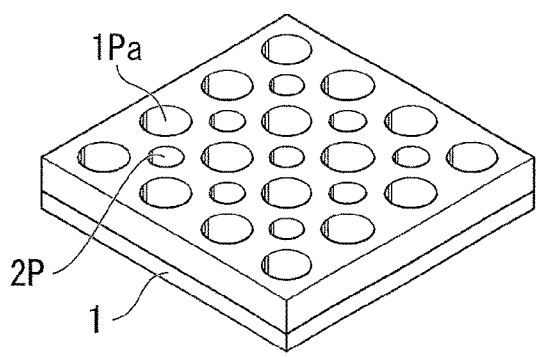

Thereafter, the portion shown by D2 in FIG. 1C is removed by performing organic solvent development, and accordingly, the organic solvent-soluble region D2 is removed while maintaining the hole portion 1Pa of the first contact hole pattern, so as to form a second contact hole pattern on the hole-unformed portion 1Pb as illustrated in FIG. 1D (step D).

Step A

In the step A, the positive-type resist composition is applied on the support to forma positive-type resist film, and the positive-type resist film is exposed and alkali developed to form a first contact hole pattern. The positive-type resist composition used in the step A is described below.

As illustrated in FIG. 1A, the first contact hole pattern 1P including the hole portion 1Pa and the hole-unformed portion 1Pb is formed on the support.

The positive-type resist film can be formed by a conventionally known method. Specifically, for example, the positive-type resist composition is applied to the support by a spinner or the like and baked at a temperature of 80° C. to 150° C. for 40 to 120 seconds, preferably 60 to 90 seconds (prebake (post applied bake (PAB))) so as to be able to form a positive-type resist film.

The thickness of the positive-type resist film is not particularly limited, and is preferably 30 to 250 nm and more preferably 50 to 150 nm.

The support is not particularly limited and a conventionally known support can be used. For example, supports for electronic components, and supports having wiring patterns formed thereon can be used. Specific examples thereof include supports made of metals such as silicon wafer, copper, chromium, iron and aluminum; and glass. Examples of the materials for the wiring pattern include copper, aluminum, nickel, and gold.

Further, as the support, any supports provided with an inorganic and/or organic film on the aforementioned substrates may be used. As the inorganic film, an inorganic antireflection film (inorganic BARC) can be used. As the organic film, an organic antireflection film (organic BARC) and an organic film such as a lower-layer organic film used in a multilayer resist method can be used.

Here, a multilayer resist method is a method in which at least one layer of an organic film (lower-layer organic film) and at least one layer of a resist film (upper-layer resist film) are provided on a substrate, and a resist pattern formed on the upper-layer resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and a fine pattern with a high aspect ratio can be formed.

The multilayer resist method is broadly classified into a method in which a double-layer structure including an upper-layer resist film and a lower-layer organic film is formed (double-layer resist method), and a method in which a multi layer structure having at least three layers including an upper-layer resist film, a lower-layer organic film and at least one intermediate layer (thin metal film or the like) provided between the upper-layer resist film and the lower-layer organic film is formed (triple-layer resist method).

The wavelength to be used for exposure is not particularly limited and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays. The resist composition is especially useful as a resist composition for KrF excimer laser, ArF excimer laser, EB or EUV.

The exposure of the resist film can be either a general exposure (dry exposure) conducted in air or an inert gas such as nitrogen, or liquid immersion exposure (Liquid Immersion Lithography).

In liquid immersion lithography, the region between the resist film and the lens at the lowermost point of the exposure apparatus is pre-filled with a solvent (liquid immersion medium) that has a larger refractive index than the refractive index of air, and the exposure (immersion exposure) is conducted in this state.

The liquid immersion medium preferably exhibits a refractive index larger than the refractive index of air but smaller than the refractive index of the resist film to be exposed. The refractive index of the medium is not particularly limited as long as it satisfies the aforementioned ranges.

Examples of the medium which exhibits a refractive index that is larger than the refractive index of air but smaller than the refractive index of the resist film include water, fluorine-based inert liquids, silicon-based solvents and hydrocarbon-based solvents.

Examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point of 70° C. to 180° C. and preferably 80° C. to 160° C. A fluorine-based inert liquid having a boiling point within the aforementioned range is preferable in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly preferable. Specific examples of these perfluoroalkyl compounds include perfluoroalkylether compounds and perfluoroalkylamine compounds.

Specifically, one example of a perfluoroalkylether compound is perfluoro (2-butyl-tetrahydrofuran) (boiling point 102° C.), and an example of a perfluoroalkylamine compound is perfluorotributylamine (boiling point 174° C.)

As the liquid immersion medium, water is preferably used, from a viewpoint of cost, safety, environment and versatility.

Examples of the alkali developing solution used for alkali developing include a 0.1% to 10% by mass aqueous solution of tetramethylammonium hydroxide (TMAH).

The developing treatment can be performed by a conventional developing method. Examples thereof include a method in which the support is immersed in the developing solution for a predetermined time (a dip method), a method in which the developing solution is cast up on the surface of the support by surface tension and maintained for a predetermined period (a puddle method), a method in which the developing solution is sprayed onto the surface of the support (spray method), and a method in which the developing solution is continuously ejected from a developing solution ejecting nozzle while scanning at a constant rate to apply the developing solution onto the support while rotating the support at a constant rate (dynamic dispense method).

The rinse treatment using a rinse liquid (cleansing treatment) can be conducted by a conventional rinse method. Examples of the rinse treating method include a method in which the rinse liquid is continuously applied to the support while rotating the support at a constant rate (rotary coating method), a method in which the support is immersed in the rinse liquid for a predetermined time (dip method), and a method in which the rinse liquid is sprayed onto the surface of the support (spray method).

Step B

In the step B, the solution including an acid or a thermal acid generator is applied onto the support on which the first contact hole pattern is formed so as to cover the first contact hole pattern, whereby a structure including the first contact hole pattern and a first layer which covers the first contact hole pattern is obtained.

Specifically, in the step B, the first layer L is formed such that the first layer formed by applying the solution including an acid or a thermal acid generator is in contact with the surface 1 Pa' in a radial direction of the pattern of the first resist pattern as illustrated in FIG. 1B. At this time, the first layer L is preferably formed so as to cover the pattern upper surface Ba1 of the first resist pattern.

In the embodiment, the first layer L formed by applying the solution including an acid or a thermal acid generator preferably indicates solubility in an organic solvent used for organic solvent developing.

The first layer L is applied in such a film thickness that solubility of the pattern upper surface of the first resist pattern in an organic solvent is not changed. For example, the applied film thickness of the first layer L is preferably 0.1 to 1.5, more preferably 0.8 to 1.4, and particularly preferably 0.9 to 1.2, with the pattern height of the first resist pattern being taken as 1.

The solution including an acid or a thermal acid generator used in the step B is described below.

Step C

In the step C, the structure is heated to cause the action of an acid generated from the thermal acid generator or an acid in the first layer and thereby change the solubility of the first resist pattern in an organic solvent, whereby an organic solvent-soluble region and an organic solvent-insoluble region are formed on the hole-unformed portion. The heating treatment in the step C may be appropriately adjusted depending on a desired pattern size. For example, the heating temperature is preferably 80° C. to 150° C. The heating time may be, for example, 50 to 120 seconds.

In the step C, as illustrated in FIG. 1C, solubility of the resist film in the periphery of the hole portion of the first contact hole pattern in an organic solvent is changed to form an organic solvent-insoluble region D1 in the periphery of the hole portion of the first contact hole pattern.

In the step A, the first contact hole pattern 1P is formed by alkali developing the positive-type resist composition. That is, the first contact hole pattern is alkali-insoluble.

In the step C, by heating the structure including the first resist pattern and obtained in the step A to step B, the acid generated from the thermal acid generator or an acid acts on a base component (A) in the periphery of the hole portion 1Pa of the first contact hole pattern 1P. Due to this action, an organic solvent-insoluble region D1 whose solubility in an organic solvent is reduced is formed. That is, the periphery of the hole portion 1Pa of the first contact hole pattern becomes the organic solvent-insoluble region D1, and the organic solvent-soluble region D2 is formed in the remaining hole-unformed portion.

In FIG. 1C, the width of the organic solvent-insoluble region D1 or the width of the organic solvent-soluble region D2 can be controlled by each composition of the positive-type resist composition to be used (a base component (A), an acid generator component, or the like), an acid strength of the acid generated from the thermal acid generator or the acid, or the heating conditions in the step C.

Among these, the width of the organic solvent-insoluble region D1 or the width of the organic solvent-soluble region D2 is preferably controlled by the heating conditions in the step C.

Specifically, in the step C, the heating treatment at a temperature of 85° C. to 95° C. for 50 to 120 seconds causes the acid generated from the thermal acid generator or the acid to act gently and accordingly, the width of the organic solvent-insoluble region tends to be formed narrowly and the width of the organic solvent-soluble region tends to be formed broadly. Thus, a second contact hole pattern having a larger hole diameter than that of the first contact hole pattern is formed.

In addition, in the step C, the heating treatment at a temperature of 95° C. to 105° C. for 50 to 120 seconds causes the acid generated from the thermal acid generator or the acid to act appropriately and accordingly, the width of the organic solvent-insoluble region and the width of the organic solvent-soluble region tend to be formed equally. Thus, a second contact hole pattern having a hole diameter equal to that of the first contact hole pattern is formed.

Furthermore, in the step C, the heating treatment at a temperature of 105° C. to 115° C. for 50 to 120 seconds causes the acid generated from the thermal acid generator or the acid to act strongly and accordingly, the width of the organic solvent-insoluble region tends to be formed broadly and the width of the organic solvent-soluble region tends to be formed narrowly. Thus, a second contact hole pattern having a smaller hole diameter than that of the first contact hole pattern is formed.

Step D

In the step D, the heated structure is developed by an organic solvent, and the organic solvent-soluble region is removed while maintaining the hole portion of the first contact hole pattern, thereby forming a second contact hole pattern on the hole-unformed portion. In the step D, the organic solvent-soluble region D2 and the first layer L are removed by organic solvent developing.

Accordingly, a second contact hole pattern 2P can be formed in the hole-unformed portion of the first contact hole pattern, while maintaining the hole portion 1Pa of the first contact hole pattern, as illustrated in FIG. 1D.

Organic Solvent

The organic solvent used for developing can be appropriately selected from the conventionally known organic solvent, as long as it is a solvent in which the first layer L and a layer 2L including the organic solvent-soluble region D2 and an acid diffusion control agent described below can be dissolved. Examples thereof include ketone-based solvents, ester-based solvents, and nitrile-based solvents. As the ester-based solvent, butyl acetate is preferable. As the ketone-based solvent, methyl amyl ketone (2-heptanone) is preferable.

The ketone-based solvent is an organic solvent including C—C(=O)—C in the structure. The ester-based solvent is an organic solvent including C—C(=O)—O—C in the structure. An alcohol-based solvent is an organic solvent including an alcoholic hydroxyl group in the structure, the "alcoholic hydroxyl group" means a hydroxyl group boded to a carbon atom of an aliphatic hydrocarbon group. An amide-based solvent is an organic solvent including an amide group in the structure. An ether-based solvent is an organic solvent including C—O—C in the structure. Among the organic solvents, an organic solvent exists which includes a plurality of functional groups, which characterizes the aforementioned each solvent, in the structure, but in this case, the functional groups included in the organic solvent fall under any types of the solvent. For example, diethylene glycol monomethyl ether falls under any types of the alcohol-based solvent and an ether-based solvent in the aforementioned classification. In addition, a hydrocarbon-based solvent is composed of a hydrocarbon and is a hydrocarbon solvent not having a substituent (a group or an atom other than the hydrogen atom and the hydrocarbon group).

Specific examples of each solvent are described below. Examples of the ketone-based solvent include 1-octanone, 2-octanone, 1-nonanone, 2-nonanone, acetone, 4-heptanone, 1-hexanone, 2-hexanone, diisobutyl ketone, cyclohexanone, methyl cyclohexanone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, propylene carbonate, γ-butyrolactone, and methyl amyl ketone (2-heptanone).

Examples of the ester-based solvent include methyl acetate, butyl acetate, ethyl acetate, isopropyl acetate, amyl acetate, isoamyl acetate, methoxyacetic acid ethyl, ethoxyacetic acid ethyl, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propylpyruvate, butyl pyruvate, methyl acetoacetate, ethyl acetoacetate, methyl propionate, ethyl propionate, propyl propionate, isopropyl propionate, 2-hydroxypropionic acid methyl, 2-hydroxypropionic acid ethyl, methyl-3-methoxypropionate, ethyl-3-methoxypropionate, ethyl-3-ethoxypropionate, and propyl-3-methoxypropionate.

Examples of the nitrile-based solvent include acetonitrile, propioditolyl, valeronitrile, and butyroditolyl.

In an organic developing solution, a conventionally known surfactant can be blended as an additive, if necessary.

The developing treatment using the organic developing solution can be performed by a conventional developing method. Examples thereof include a method in which the support is immersed in the developing solution for a predetermined time (a dip method), a method in which the developing solution is cast up on the surface of the support by surface tension and maintained for a predetermined period (a puddle method), a method in which the developing solution is sprayed onto the surface of the support (spray method), and a method in which the developing solution is continuously ejected from a developing solution ejecting nozzle while scanning at a constant rate to apply the developing solution onto the support while rotating the support at a constant rate (dynamic dispense method).

After the development treatment and before performing drying, a rinse treatment can be performed using a rinse liquid containing an organic solvent. By performing rinsing, a satisfactory pattern can be formed.

As an example of the organic solvent used in the rinse liquid, among the organic solvents exemplified as organic solvents used in the developing, an organic solvent in which the resist pattern is unlikely dissolved can be appropriately selected and used. Normally, at least one solvent selected from the hydrocarbon-based solvent, the ketone-based solvent, the ester-based solvent, the alcohol-based solvent, the amide-based solvent and the ether-based solvent is used. Among these, at least one type selected from the hydrocarbon-based solvent, the ketone-based solvent, the ester-based solvent, the alcohol-based solvent and the amide-based solvent is preferable, at least one type selected from the alcohol-based solvent and the ester-based solvent is more preferable, and the alcohol-based solvent is particularly preferable.

As the alcohol-based solvent used in the rinse liquid, monovalent alcohol having 6 to 8 carbon atoms is preferable, and the monovalent alcohol may be linear, branched, or cyclic. Specific examples thereof include 1-hexanol, 1-heptanol, 1-octanol, 2-hexanol, 2-heptanol, 2-octanol, 3-hexanol, 3-heptanol, 3-octanol, 4-octanol, and benzyl alcohol. Among these, 1-hexanol, 2-heptanol, or 2-hexanol is preferable, and 1-hexanol or 2-hexanol is more preferable.

These organic solvents may be used alone or two or more thereof may be used in mixture. In addition, these organic solvents may be used by mixing with an organic solvent other than the above or water. However, in consideration of development properties, the blending amount of water in the rinse liquid is preferably 30% by mass or less, more preferably 10% by mass or less, still more preferably 5% by mass or less, and particularly preferably 3% by mass or less with respect to the total amount of the rinse liquid.

A conventionally known additive can be blended in the organic developing solution. As one example of the additive, a surfactant is exemplified. Examples of the surfactant include the same surfactants as exemplified in the above, and nonionic surfactants are preferable, fluorine-based surfactants or silicon-based surfactants are more preferable.

In a case where the surfactant is blended, the blending amount thereof is normally 0.001% to 5% by mass, preferably 0.005% to 2% by mass, and more preferably 0.01% to 0.5% by mass with respect to the total amount of the rinse liquid.

The rinse treatment using a rinse liquid (cleansing treatment) can be conducted by a conventional rinse method.

Examples of the method include a method in which the rinse liquid is continuously applied to the support while rotating the support at a constant rate (rotary coating method), a method in which the support is immersed in the rinse liquid for a predetermined time (dip method), and a method in which the rinse liquid is sprayed onto the surface of the support (spray method).

According to the method for forming a resist pattern of the first embodiment, a second contact hole pattern can be formed in the hole-unformed portion of the first contact hole pattern. Thus, a fine pattern can be formed more simply.

Second Embodiment

FIGS. 2A to 2D schematically illustrate steps of the method for forming a resist pattern of a second embodiment. FIGS. 2A to 2D respectively illustrate a perspective view.

Figure 2A:
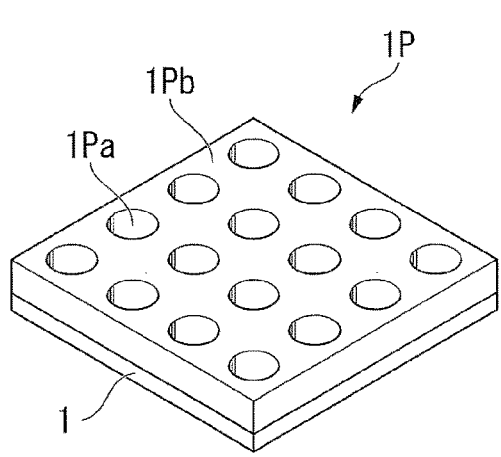
FIGS. 2A to 2D are views illustrating a second embodiment of the method for forming a resist pattern of the invention.

First, as illustrated in FIG. 2A, the contact hole pattern 1P is formed on the support 1 using the positive-type resist composition (step A).

Figure 2B:
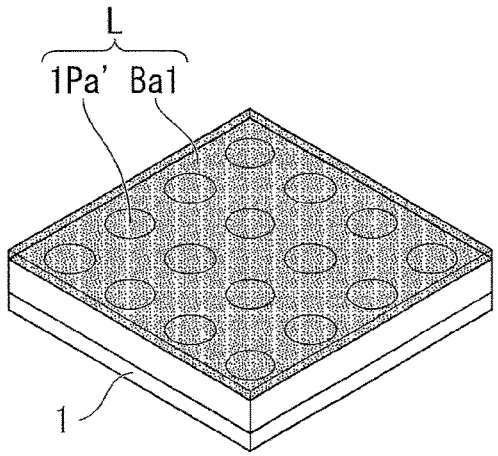

Next, as illustrated in FIG. 2B, the solution including an acid or a thermal acid generator is applied so as to cover the contact hole pattern 1P, and the structure including the first contact hole pattern 1P and the first layer L which covers the first contact hole pattern 1P is obtained (step B).

Next, as illustrated in FIG. 2B1, the solution including an acid diffusion control agent is applied so as to cover the structure including the first contact hole pattern 1P and the first layer L which covers the first contact hole pattern 1P. Due to the above, as illustrated in FIG. 2B1, a layer 2L including an acid diffusion control agent is formed on the first layer L.

Figure 2C:
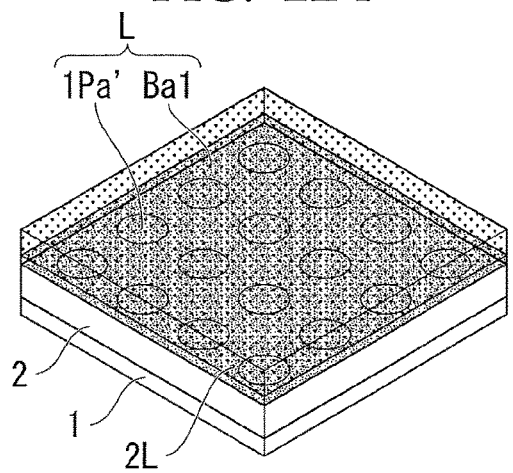
Figure 2C:
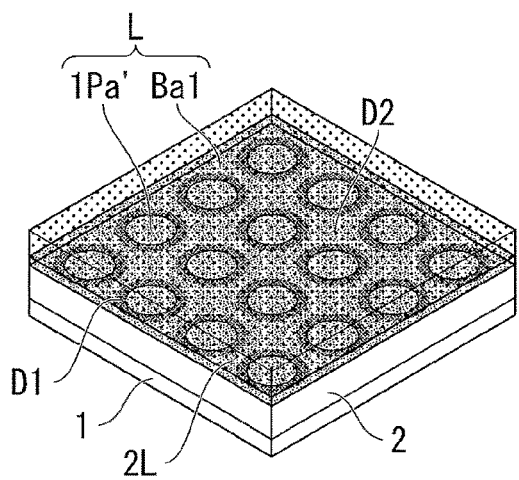

Thereafter, the structure and the layer 2L including an acid diffusion control agent are heated, as illustrated in FIG. 2C, solubility of the resist film in the periphery of the hole portion of the first contact hole pattern in an organic solvent is changed to form the organic solvent-insoluble region D1 in the periphery of the hole portion of the first contact hole pattern.

Figure 2D:
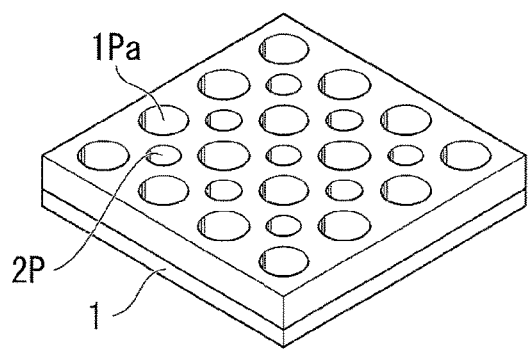

Thereafter, the portion shown by D2 in FIG. 2C is removed by performing organic solvent development, and accordingly, the organic solvent-soluble region is removed while maintaining the hole portion 1Pa of the first contact hole pattern, so as to form a second contact hole pattern 2P in the hole-unformed portion as illustrated in FIG. 2D (step D).

Steps (A) and (B)

Each of the steps (A) and (B) shown in FIGS. 2A and 2B can be executed by the same operation as the aforementioned steps (A) and (B) in the first embodiment.

In the step (B) of the second embodiment, the applied film thickness of the first layer is not particularly limited as long as at least part of the first resist pattern is covered, and for example, the applied film thickness of the first layer is preferably 0.1 to 2.0, more preferably 0.8 to 1.6, and particularly preferably 0.9 to 1.4, with the pattern height of the first resist pattern being taken as 1.

Step B1

The second embodiment includes a step B1 after the step B.

In the step B1, the solution including the acid diffusion control agent is applied so as to cover the first layer.

As illustrated in FIG. 2B1, the solution including the acid diffusion control agent is applied so as to cover the structure including the first resist pattern 1P and the first layer L which covers the first resist pattern 1P. Due to the above, as illustrated in FIG. 2B1, the layer 2L including the acid diffusion control agent is formed on the first layer L.

By forming the layer 2L including an acid diffusion control agent, in particular, in the upper portion of the first contact hole pattern 1P, an action of the acid generated from the thermal acid generator or the acid included in the first layer L formed in the step B is appropriately weakened on the base component (A) in the first contact hole pattern 1P. The solution including an acid diffusion control agent is applied so as to cover the first layer L and a part of the solution may be mixed with the upper portion of the first layer L.

In the step B1, by applying the solution including an acid diffusion control agent so as to cover the first layer L and the first contact hole pattern, it is possible to cause the acid generated from the thermal acid generator or the acid in the first layer, which is a side surface of the first contact hole pattern, to act, while controlling the action of the acid in the first layer, which is on the upper portion of the first contact hole pattern on the base component (A) in the first contact hole pattern 1P. Thus, it is possible to control solubility of each upper surface portion and side wall portion of the first contact hole pattern in a developing solution. Accordingly, the organic solvent-soluble region and the organic solvent-insoluble region can be formed satisfactorily, and the second contact hole pattern can be formed satisfactorily.

Steps (C) and (D)

Each of the steps (C) and (D) shown in FIGS. 2C and 2D can be executed by the same operation as the aforementioned steps (C) and (D) in the first embodiment.

The second contact hole pattern can be formed on the hole-unformed portion of the first contact hole pattern by the method for forming a resist pattern of the second embodiment. Thus, a fine pattern can be formed more simply.

In addition, inclusion of the step B1 causes the organic solvent-soluble region D2 to be removed easily at the time of developing in the step D compared to the first embodiment, and a resist pattern having a satisfactory pattern shape can be obtained.

Other Embodiments

Figure 3A:
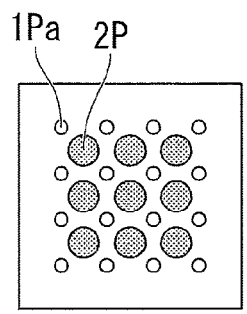
FIGS. 3A to 3C are views illustrating other embodiments of the method for forming a resist pattern of the invention.
Figure 3B:
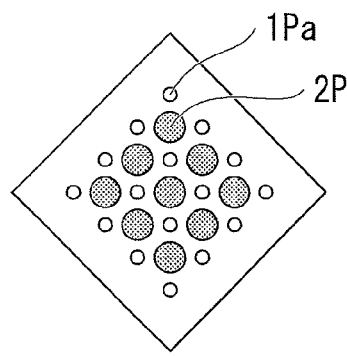
Figure 3C:
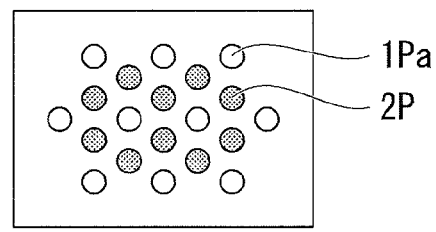

In the aforementioned first embodiment and the second embodiment, a case where a pattern with the contact hole pattern squarely arrayed or rhombically arrayed as illustrated in FIG. 3A and FIG. 3B is formed is described, but the invention is not limited thereto. For example, as illustrated in FIG. 3C, a pattern with the second contact hole pattern hexagonally arrayed can be formed.

Hereinafter, each material used in the method for forming a resist pattern of the embodiment is described.

<Resist Composition>

Hereinbelow, the resist composition for forming the resist pattern will be described.

In the present embodiment, the resist composition is preferably a resist composition which generates an acid upon exposure and exhibits changed solubility in a developing solution under the action of an acid.

In the present embodiment, the resist composition preferably contains a base component (A) (hereafter, referred to as "component (A)") which exhibits changed solubility in a developing solution under the action of an acid.

When a resist film is formed using the resist composition and the formed resist film is subjected to a selective exposure, an acid is generated at exposed portions, and the generated acid acts on the component (A) to change the solubility of the component (A) in a developing solution, whereas the solubility of the component (A) in a developing solution is not changed at unexposed portions, thereby generating difference in solubility in a developing solution between exposed portions and unexposed portions. Therefore, by subjecting the resist film to development, the exposed portions are dissolved and removed to form a positive-tone resist pattern in the case of a positive resist, whereas the unexposed portions are dissolved and removed to form a negative-tone resist pattern in the case of a negative resist.

In the present specification, a resist composition which forms a positive resist pattern by dissolving and removing the exposed portions is called a positive resist composition, and a resist composition which forms a negative resist pattern by dissolving and removing the unexposed portions is called a negative resist composition.

In the present embodiment, the resist composition may be either a positive resist composition or a negative resist composition.

Further, in the present embodiment, the resist composition may be applied to an alkali developing process using an alkali developing solution in the developing treatment in forming a resist pattern, or a solvent developing process using a developing solution containing an organic solvent (organic developing solution) in the developing treatment, and preferably a solvent developing process.

The resist composition used to form a resist pattern has a function of generating an acid upon exposure, and in the resist composition, the component (A) may generate an acid upon exposure, or an additive component other than the component (A) may generate an acid upon exposure.

More specifically, in the present embodiment, the resist composition may be a resist composition (1) containing an acid generator component (B) which generates an acid upon exposure (hereafter, referred to as "component (B)";

a resist composition (2) in which the component (A) is a component which generates an acid upon exposure; or a resist composition (3) in which the component (A) is a component which generates an acid upon exposure, and further containing an acid generator component (B).

That is, when the resist composition of the present embodiment is the resist composition (2) or (3), the component (A) is a "base component which generates an acid upon exposure and exhibits changed solubility in a developing solution under the action of an acid". In the case where the component (A) is a base component which generates an acid upon exposure and exhibits changed solubility in a developing solution under the action of an acid, the component (A1) described later is preferably a polymeric compound which generates an acid upon exposure and exhibits changed solubility in a developing solution under the action of an acid. As the polymeric compound, a resin having a structural unit which generates an acid upon exposure can be used. As the structural unit which generates an acid upon exposure, a conventional structural unit can be used.

In the present embodiment, it is particularly desirable that the resist composition is the resist composition (1).

<Component (A)>

In the present embodiment, the term "base component" refers to an organic compound capable of forming a film, and is preferably an organic compound having a molecular weight of 500 or more. When the organic compound has a molecular weight of 500 or more, the film-forming ability is improved, and a photosensitive resin pattern of nano level can be easily formed.

The organic compound used as the base component is broadly classified into non-polymers and polymers.

In general, as a non-polymer, any of those which have a molecular weight in the range of 500 to less than 4,000 is used. Hereafter, a "low molecular weight compound" refers to a non-polymer having a molecular weight in the range of 500 to less than 4,000.

As a polymer, any of those which have a molecular weight of 1,000 or more is generally used. Hereafter, a "resin" refers to a polymer having a molecular weight of 1,000 or more. As the molecular weight of the polymer, the weight average molecular weight in terms of the polystyrene equivalent value determined by gel permeation chromatography (GPC) is used.

As the component (A), a resin, a low molecular weight compound, or a combination thereof may be used.

The component (A) is a base component which exhibits increased solubility in a developing solution under the action of an acid.

In the present embodiment, the component (A) may be a component that generates an acid upon exposure.

In the present embodiment, the component (A) preferably contains a polymer compound (A1) having a structural unit containing an acid decomposable group that exhibits increased polarity by the action of an acid (hereafter, sometimes referred to as "structural unit (a1)"), and a structural unit containing an —$SO_2$— containing cyclic group, a lactone-containing cyclic group, a carbonate-containing cyclic group or other heterocyclic groups (hereafter, sometimes referred to as "structural unit (a2)").

(Structural Unit (a1))

The structural unit (a1) is a structural unit containing an acid decomposable group that exhibits increased polarity by the action of an acid.

The term "acid decomposable group" refers to a group in which at least a part of the bond within the structure thereof is cleaved by the action of an acid.

Examples of acid decomposable groups which exhibit increased polarity by the action of an acid include groups which are decomposed by the action of an acid to form a polar group. Examples of the polar group include a carboxy group, a hydroxyl group, an amino group and a sulfo group (—$SO_3H$). Among these, a polar group containing —OH in the structure thereof (hereafter, referred to as "OH-containing polar group") is preferable, a carboxy group or a hydroxyl group is more preferable, and a carboxy group is particularly desirable.

More specifically, as an example of an acid decomposable group, a group in which the aforementioned polar group has been protected with an acid dissociable group (such as a group in which the hydrogen atom of the OH-containing polar group has been protected with an acid dissociable group) can be given. Here, the "acid dissociable group" includes:

(i) a group in which the bond between the acid dissociable group and the adjacent atom is cleaved by the action of an acid; and (ii) a group in which one of the bonds is cleaved by the action of an acid, and then a decarboxylation reaction occurs, thereby cleaving the bond between the acid dissociable group and the adjacent atom.

It is necessary that the acid dissociable group that constitutes the acid decomposable group is a group which exhibits a lower polarity than the polar group generated by the dissociation of the acid dissociable group. Thus, when the acid dissociable group is dissociated by the action of an acid, a polar group exhibiting a higher polarity than that of the acid dissociable group is generated, thereby increasing the polarity. As a result, the polarity of the entire component (A1) is increased. By the increase in the polarity, the solubility in an alkali developing solution changes and, the solubility in an organic developing solution is relatively decreased.

The acid dissociable group is not particularly limited, and any of the groups that have been conventionally proposed as acid dissociable groups for the base resins of chemically amplified resists can be used.

Examples of the acid dissociable group for protecting the carboxy group or hydroxy group as a polar group include the acid dissociable group represented by general formula (a1-r-1) shown below (hereafter, for the sake of convenience, sometimes referred to as "acetal-type acid dissociable group").

[Chemical formula 1]

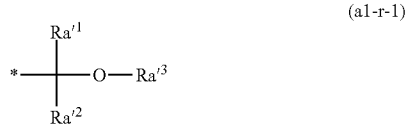

(a1-r-1)

In the formula, $Ra'^1$ and $Ra'^2$ represent a hydrogen atom or an alkyl group; and $Ra'^3$ represents a hydrocarbon group, provided that $Ra'^3$ may be bonded to $Ra'^1$ or $Ra'^2$ to form a ring. * represents a valence bond.

In the formula (a1-r-1), as the alkyl group for $Ra'^1$ and $Ra'^2$, the same alkyl groups as those described above the alkyl groups as the substituent which may be bonded to the carbon atom on the α-position of the aforementioned α-substituted alkyl ester can be used, a methyl group or ethyl group is preferable, and a methyl group is particularly desirable.

The hydrocarbon group for $Ra'^3$ is preferably an alkyl group having 1 to 20 carbon atoms, more preferably an alkyl group having 1 to 10 carbon atoms, and still more preferably a linear or branched alkyl group. Specific examples thereof include a methyl group, an ethyl group, a propyl group, an isopropyl group, an n-butyl group, an isobutyl group, a tert-butyl group, a pentyl group, an isopentyl group, a neopentyl group, a 1,1-dimethylethyl group, a 1,1-diethylpropyl group, a 2,2-dimethylpropyl group and a 2,2-dimethylbutyl group.

In the case where $Ra'^3$ represents a cyclic hydrocarbon group, the cyclic hydrocarbon group may be aliphatic or aromatic, and may be polycyclic or monocyclic. As the monocyclic aliphatic hydrocarbon group, a group in which one hydrogen atom has been removed from a monocycloalkane is preferable. The monocycloalkane preferably has 3 to 8 carbon atoms, and specific examples thereof include cyclopentane, cyclohexane and cyclooctane. As the polycyclic aliphatic hydrocarbon group, a group in which one hydrogen atom has been removed from a polycycloalkane is preferable, and the polycycloalkane preferably has 7 to 12 carbon atoms. Examples of the polycycloalkane include adamantane, norbornane, isobornane, tricyclodecane and tetracyclododecane.

In the case where the hydrocarbon group is an aromatic hydrocarbon group, examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which one hydrogen atom has been removed from the aforementioned aromatic hydrocarbon ring (aryl group); and a group in which one hydrogen atom of the aforementioned aryl group has been substituted with an alkylene group (an arylalkyl group such as a benzyl group, a phenethyl group, a 1-naphthylmethyl group, a 2-naphthylmethyl group, a 1-naphthylethyl group or a 2-naphthylethyl group). The alkylene group (alkyl chain within the arylalkyl group) preferably has 1 to 4 carbon atom, more preferably 1 or 2, and most preferably 1.

In the case where $Ra'^3$ is bonded to $Ra'^1$ or $Ra'^2$ to form a ring, the cyclic group is preferably a 4 to 7-membered ring, and more preferably a 4 to 6-membered ring. Specific examples of the cyclic group include tetrahydropyranyl group and tetrahydrofuranyl group.

Examples of the acid dissociable group for protecting the carboxy group as a polar group include the acid dissociable group represented by general formula (a1-r-2) shown below (hereafter, with respect to the acid dissociable group represented by the following formula (a1-r-2), the acid dissociable group constituted of alkyl groups is referred to as "tertiary alkyl ester-type acid dissociable group").

[Chemical formula 2]

(a1-r-2)

In the formula (a1-r-2), $Ra'^4$ to $Ra'^6$ each independently represents a hydrocarbon group, provided that $Ra'^5$ and $Ra'^6$ may be mutually bonded to form a ring. * represents a valence bond.

As the hydrocarbon group for $Ra'^4$ to $Ra'^6$, the same groups as those described above for $Ra'^3$ can be mentioned. $Ra'^4$ is preferably an alkyl group having 1 to 5 carbon atoms. In the case where $Ra'^5$ and $Ra'^6$ are mutually bonded to form a ring, a group represented by general formula (a1-r2-1) shown below can be mentioned.

On the other hand, in the case where $Ra'^4$ to $Ra'^6$ are not mutually bonded and independently represent a hydrocarbon group, the group represented by general formula (a1-r2-2) shown below can be mentioned.

[Chemical formula 3]

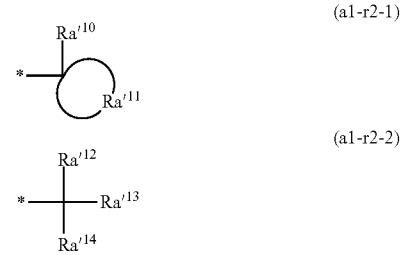

In the formula (a1-r2-1) or (a1-r2-2), $Ra'^{10}$ represents an alkyl group having 1 to 10 carbon atoms; $Ra'^{11}$ is a group which forms an aliphatic cyclic group together with a carbon atom having Ra'¹⁰ bonded thereto; and Ra'¹² to Ra'¹⁴ each independently represents a hydrocarbon group. * represents a valence bond.

In the formula (a1-r2-1), as the alkyl group having 1 to 10 carbon atoms for Ra'¹⁰, the same groups as described above for the linear or branched alkyl group for Ra'³ in the formula (a1-r-1) are preferable. In the formula (a1-r2-1), as the aliphatic cyclic group which is formed by Ra'¹¹, the same groups as those described above for the cyclic alkyl group for Ra'³ in the formula (a1-r-1) are preferable.

In the formula (a1-r2-2), it is preferable that Ra'¹² and Ra'¹⁴ each independently represents an alkyl group having 1 to 10 carbon atoms, and it is more preferable that the alkyl group is the same group as the described above for the linear or branched alkyl group for Ra'³ in the formula (a1-r-1), it is still more preferable that the alkyl group is a linear alkyl group having 1 to 5 carbon atoms, and it is particularly preferable that the alkyl group is a methyl group or an ethyl group.

In the formula (a1-r2-2), it is preferable that Ra'¹³ is the same group as described above for the linear, branched or cyclic alkyl group exemplified as the hydrocarbon group for Ra'³ in the formula (a1-r-1). Among these, the same cyclic alkyl group as those described above for Ra'³ is more preferable.

Specific examples of the formula (a1-r2-1) are shown below. In the formulae shown below, "*" represents a valence bond.

[Chemical formula 4]

 (r-pr-m1)

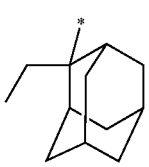 (r-pr-m2)

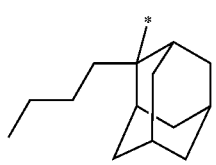 (r-pr-m3)

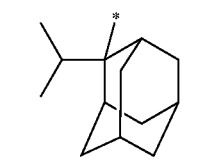 (r-pr-m4)

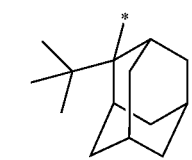 (r-pr-m5)

-continued

 (r-pr-m6)

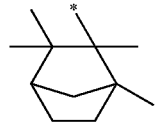 (r-pr-m7)

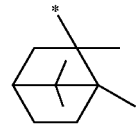 (r-pr-m8)

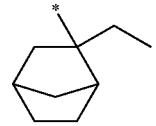 (r-pr-m9)

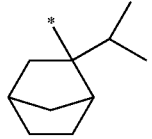 (r-pr-m10)

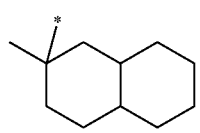 (r-pr-m11)

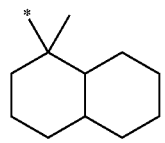 (r-pr-m12)

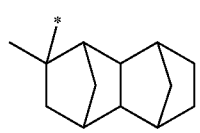 (r-pr-m13)

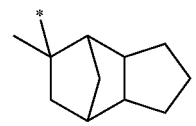 (r-pr-m14)

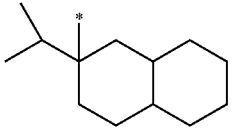 (r-pr-m15)

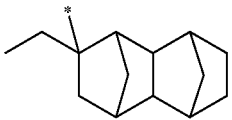 (r-pr-m16)

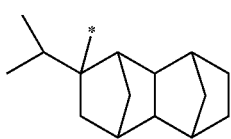 (r-pr-m17)
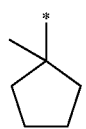 (r-pr-s1)
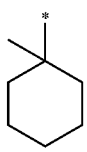 (r-pr-s2)
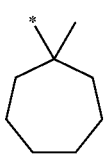 (r-pr-s3)
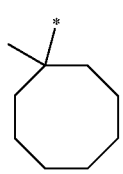 (r-pr-s4)
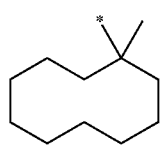 (r-pr-s5)
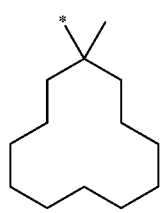 (r-pr-s6)
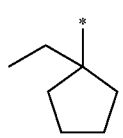 (r-pr-s7)
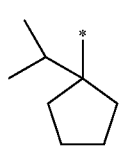 (r-pr-s8)
 (r-pr-s9)
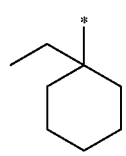 (r-pr-s10)
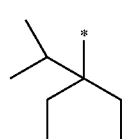 (r-pr-s11)
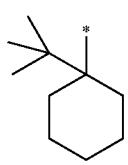 (r-pr-s12)
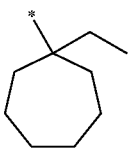 (r-pr-s13)
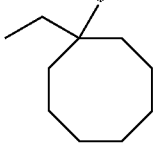 (r-pr-s14)
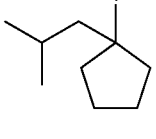 (r-pr-s15)
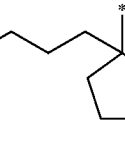 (r-pr-s16)
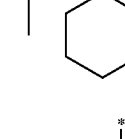 (r-pr-s17)
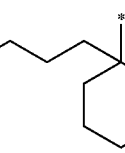 (r-pr-s18)

Specific examples of the formula (a1-r2-2) are shown below.
[Chemical formula 5]
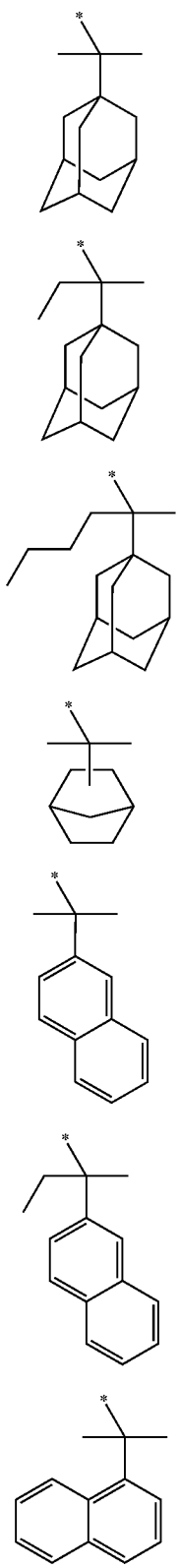
(r-pr-cm1)
(r-pr-cm2)
(r-pr-cm3)
(r-pr-cm4)
(r-pr-cm5)
(r-pr-cm6)
(r-pr-cm7)
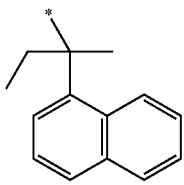
(r-pr-cm8)
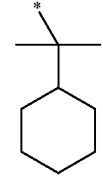
(r-pr-cs1)
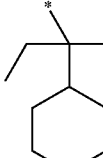
(r-pr-cs2)
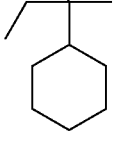
(r-pr-cs3)
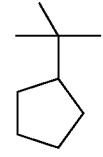
(r-pr-cs4)
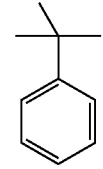
(r-pr-cs5)
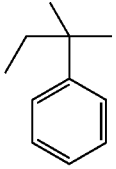
(r-pr-c1)
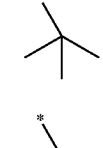
(r-pr-c2)
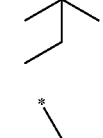
(r-pr-c3)
Examples of the acid dissociable group for protecting a hydroxy group as a polar group include the acid dissociable group represented by general formula (a1-r-3) shown below (hereafter, referred to as "tertiary alkyloxycarbonyl-type acid dissociable group").

[Chemical formula 6]

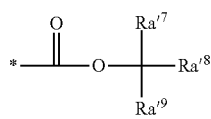

(a1-r-3)

In the formula (a1-r-3), $Ra'^7$ to $Ra'^9$ each independently represents an alkyl group. * represents a valence bond.

In the formula (a1-r-3), $Ra'^7$ to $Ra'^9$ is preferably an alkyl group having 1 to 5 carbon atoms, and more preferably an alkyl group having 1 to 3 carbon atoms.

Further, the total number of carbon atoms within the alkyl group is preferably 3 to 7, more preferably 3 to 5, and most preferably 3 or 4.

Examples of the structural unit (a1) include a structural unit derived from an acrylate ester which may have the hydrogen atom bonded to the carbon atom on the α-position substituted with a substituent and contains an acid decomposable group which exhibits increased polarity by the action of an acid; a structural unit derived from hydroxystyrene or a hydroxystyrene derivative in which at least a part of the hydrogen atom of the hydroxy group is protected with a substituent containing an acid decomposable group; and a structural unit derived from vinylbenzoic acid or a vinylbenzoic acid derivative in which at least a part of the hydrogen atom within —C(=O)—OH is protected with a substituent containing an acid decomposable group.

As the structural unit (a1), a structural unit derived from an acrylate ester which may have the hydrogen atom bonded to the carbon atom on the α-position substituted with a substituent is preferable.

As the structural unit (a1), structural units represented by general formula (a1-1) or (a1-2) shown below are preferable.

[Chemical formula 7]

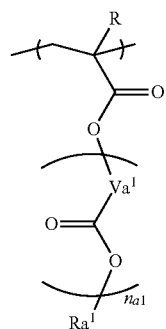

(a1-1)

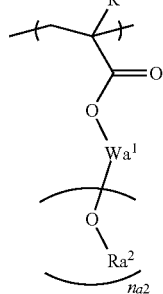

(a1-2)

In the formula (a1-1) or (a1-2), R represents a hydrogen atom, an alkyl group having 1 to 5 carbon atoms or a halogenated alkyl group having 1 to 5 carbon atoms; $Va^1$ represents a divalent hydrocarbon group which may have an ether bond, an urethane bond or an amide bond; $n_{a1}$ represents an integer of 0 to 2;

$Ra^1$ represents an acid dissociable group represented by the formula (a1-r-1) or (a1-r-2);

$Wa^1$ represents a hydrocarbon group having a valency of $n_{a2}+1$; $n_{a2}$ represents an integer of 1 to 3; and $Ra^2$ represents an acid dissociable group represented by the formula (a1-r-1) or (a1-r-3).

In the formula (a1-1), as the alkyl group having 1 to 5 carbon atoms for R, a linear or branched alkyl group having 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group. The halogenated alkyl group having 1 to 5 carbon atoms represented by R is a group in which part or all of the hydrogen atoms of the aforementioned alkyl group having 1 to 5 carbon atoms have been substituted with halogen atoms.

Examples of the halogen atom include a fluorine atom, a chlorine atom, a bromine atom and an iodine atom, and a fluorine atom is particularly desirable.

As R, a hydrogen atom, an alkyl group having 1 to 5 carbon atoms or a fluorinated alkyl group having 1 to 5 carbon atoms is preferable, and a hydrogen atom or a methyl group is particularly desirable in terms of industrial availability.

The hydrocarbon group for $Va^1$ may be either an aliphatic hydrocarbon group or an aromatic hydrocarbon group. An "aliphatic hydrocarbon group" refers to a hydrocarbon group that has no aromaticity. The aliphatic hydrocarbon group as the divalent hydrocarbon group for $Va^1$ may be either saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

Further, as the group for $Va^1$, a group in which the aforementioned divalent hydrocarbon group has been bonded via an ether bond, urethane bond or amide bond can be mentioned.

The linear or branched aliphatic hydrocarbon group preferably has 1 to 10 carbon atoms, more preferably 1 to 6, still more preferably 1 to 4, and most preferably 1 to 3. As the linear aliphatic hydrocarbon group, a linear alkylene group is preferable. Specific examples thereof include a methylene group [—CH$_2$—], an ethylene group [—(CH$_2$)$_2$—], a trimethylene group [—(CH$_2$)$_3$—], a tetramethylene group [—(CH$_2$)$_4$-] and a pentamethylene group [—(CH$_2$)$_5$—].

As the branched aliphatic hydrocarbon group, branched alkylene groups are preferred, and specific examples include various alkylalkylene groups, including alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, and —C(CH$_2$CH$_3$)$_2$—; alkylethylene groups such as —CH(CH$_3$) CH$_2$—, —CH(CH$_3$) CH(CH$_3$)—, —C(CH$_3$)$_2$CH$_2$—, —CH(CH$_2$CH$_3$) CH$_2$—, and —C(CH$_2$CH$_3$)$_2$—CH$_2$—; alkyltrimethylene groups such as —CH(CH$_3$) CH$_2$CH$_2$—, and —CH$_2$CH(CH$_3$) CH$_2$—; and alkyltetramethylene groups such as —CH(CH$_3$) CH$_2$CH$_2$CH$_2$—, and —CH$_2$CH(CH$_3$) CH$_2$CH$_2$—. As the alkyl group within the alkylalkylene group, a linear alkyl group having 1 to 5 carbon atoms is preferable.

As examples of the aliphatic hydrocarbon group containing a ring in the structure thereof, an alicyclic hydrocarbon group (a group in which two hydrogen atoms have been removed from an aliphatic hydrocarbon ring), a group in which the alicyclic hydrocarbon group is bonded to the terminal of the aforementioned linear or branched aliphatic hydrocarbon group, and a group in which the alicyclic hydrocarbon group is interposed within the aforementioned linear or branched aliphatic hydrocarbon group, can be given. As the linear or branched aliphatic hydrocarbon group, the same groups as those described above can be used.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic alicyclic hydrocarbon group, a group in which two hydrogen atoms have been removed from a polycycloalkane is preferable, and the polycycloalkane preferably has 7 to 12 carbon atoms. Examples of the polycycloalkane include adamantane, norbornane, isobornane, tricyclodecane and tetracyclododecane.

The aromatic hydrocarbon group is a hydrocarbon group having an aromatic ring.

The aromatic hydrocarbon group as the divalent hydrocarbon group for Va$^1$ preferably has 3 to 30 carbon atoms, more preferably 5 to 30, still more preferably 5 to 20, still more preferably 6 to 15, and most preferably 6 to 10. Here, the number of carbon atoms within a substituent(s) is not included in the number of carbon atoms of the aromatic hydrocarbon group.

Examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom.

Examples of the hetero atom within the aromatic hetero rings include an oxygen atom, a sulfur atom and a nitrogen atom. Specific examples of the aromatic hydrocarbon group include a group in which two hydrogen atoms have been removed from the aforementioned aromatic hydrocarbon ring (arylene group); and a group in which one hydrogen atom has been removed from the aforementioned aromatic hydrocarbon ring (aryl group) and one hydrogen atom has been substituted with an alkylene group (a group in which one hydrogen atom has been further removed from an aryl group in an arylalkyl group such as a benzyl group, a phenethyl group, a 1-naphthylmethyl group, a 2-naphthylmethyl group, a 1-naphthylethyl group, or a 2-naphthylethyl group). The alkylene group (alkyl chain within the arylalkyl group) preferably has 1 to 4 carbon atom, more preferably 1 or 2, and most preferably 1.

In the formula (a1-2), the hydrocarbon group for Wa$^1$ having a valency of $n_{a2}$+1 may be either an aliphatic hydrocarbon group or an aromatic hydrocarbon group. The aliphatic cyclic group refers to a hydrocarbon group that has no aromaticity, and may be either saturated or unsaturated, but is preferably saturated. Examples of the aliphatic hydrocarbon group include a linear or branched aliphatic hydrocarbon group, an aliphatic hydrocarbon group containing a ring in the structure thereof, and a combination of the linear or branched aliphatic hydrocarbon group and the aliphatic hydrocarbon group containing a ring in the structure thereof. As the specific examples thereof, the same groups as those described above for Va$^1$ in the formula (a1-1) can be mentioned.

The valency of $n_{a2}$+1 is preferably divalent, trivalent or tetravalent, and more preferably divalent or trivalent.

As the structural unit represented by the formula (a1-2), a structural unit represented by general formula (a1-2-01) shown below is particularly desirable.

[Chemical formula 8]

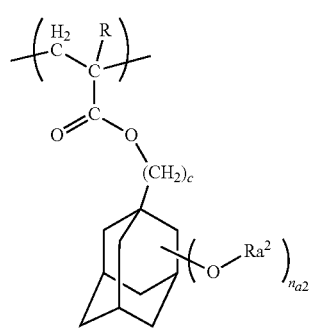

(a1-2-01)

In the formula (a1-2-01), Ra$^2$ represents an acid dissociable group represented by the formula (a1-r-1) or (a1-r-3); $n_{a2}$ is an integer of 1 to 3, preferably 1 or 2, and more preferably 1; c is an integer of 0 to 3, preferably 0 or 1, and more preferably 1; R is the same as defined above.

Specific examples of the structural units represented by the formulae (a1-1) and (a1-2) are shown below. In the formulae shown below, R$^\alpha$ represents a hydrogen atom, a methyl group or a trifluoromethyl group.

[Chemical formula 9]
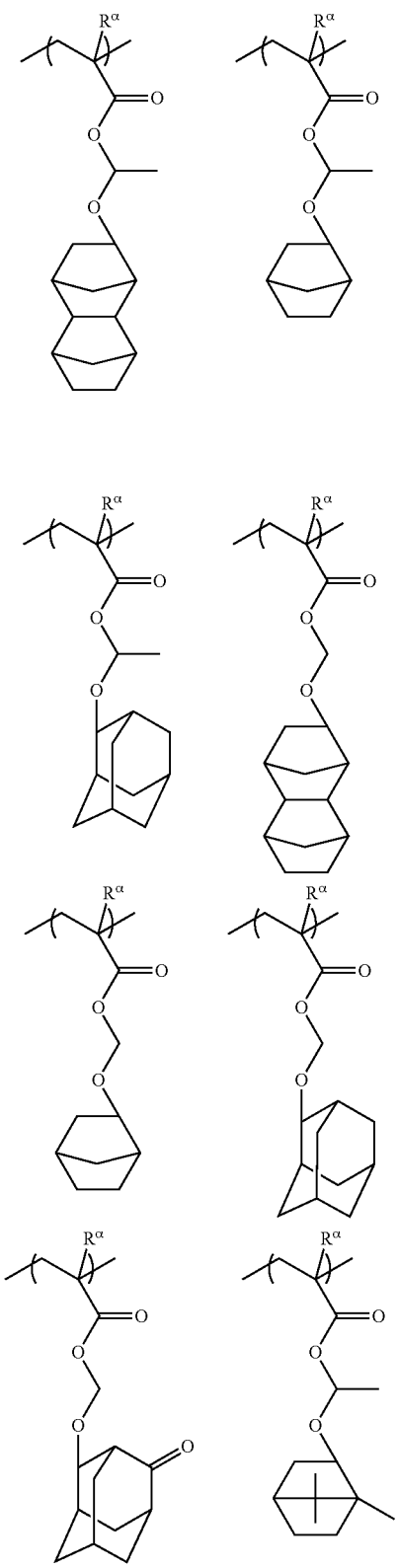
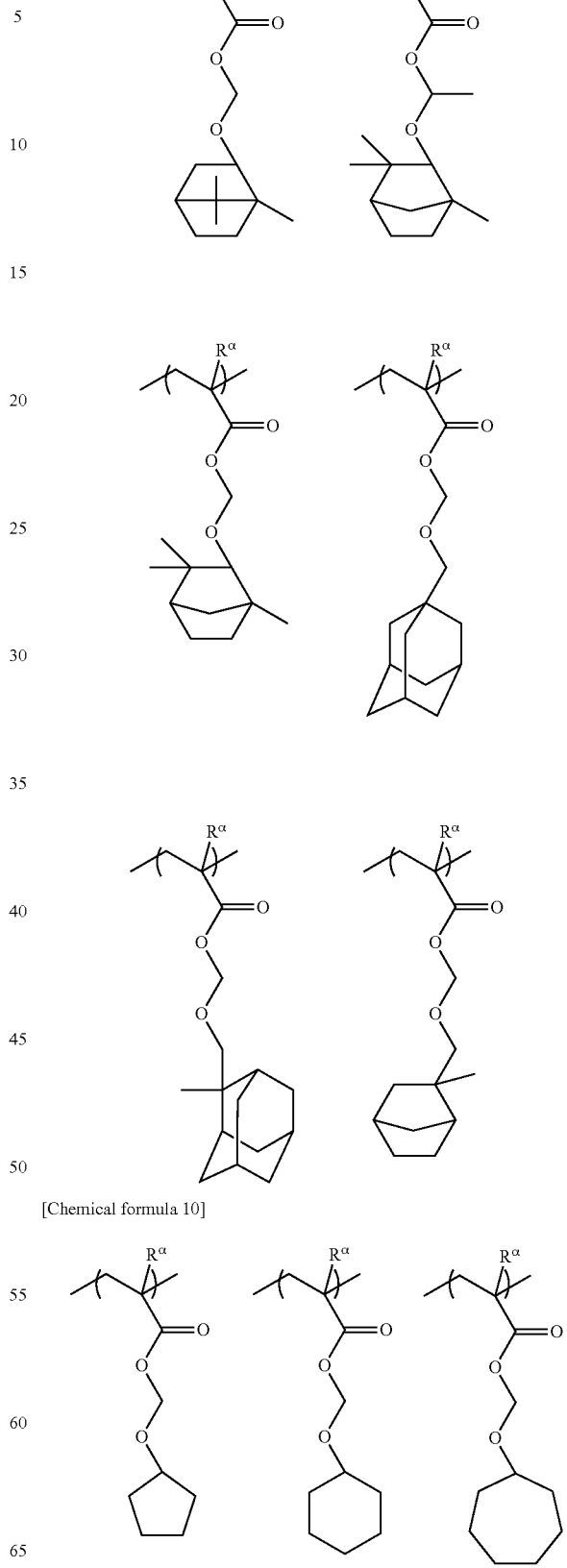
[Chemical formula 10]

29
-continued
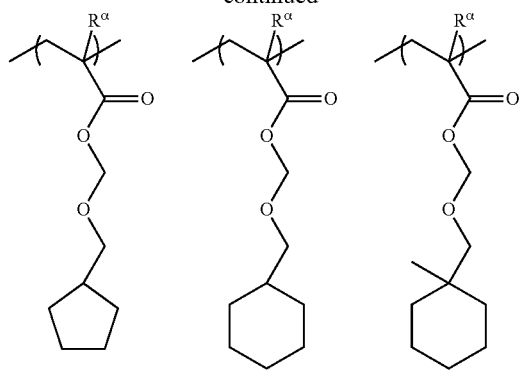
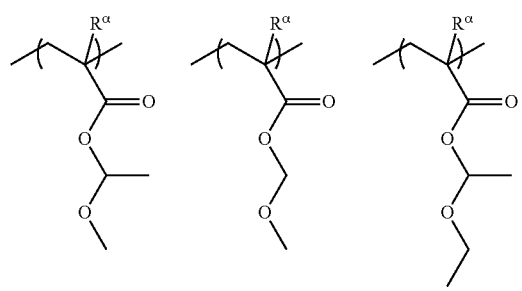
[Chemical formula 11]
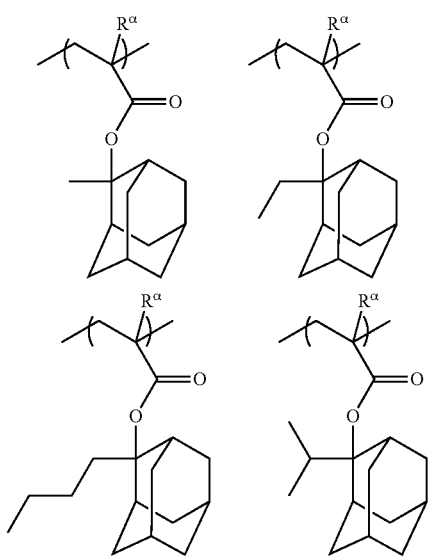
30
-continued
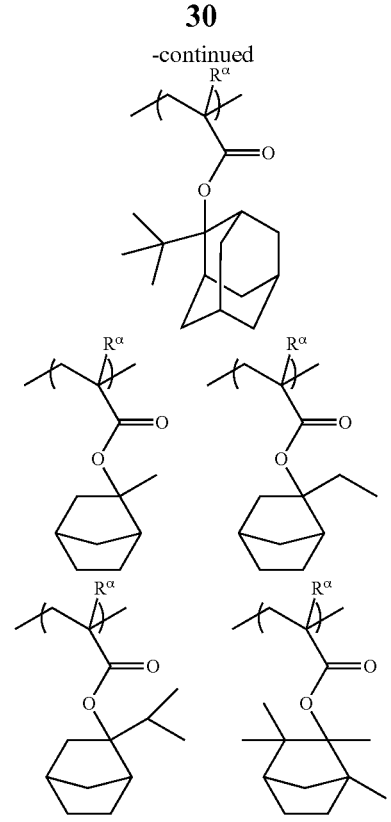
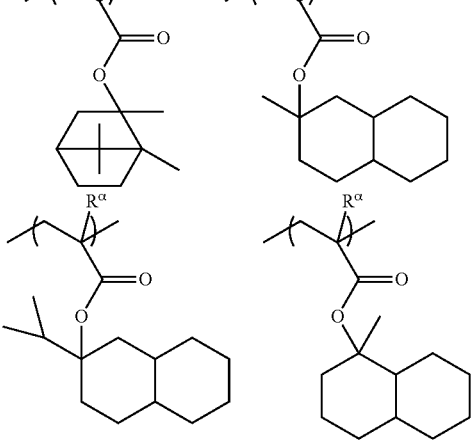
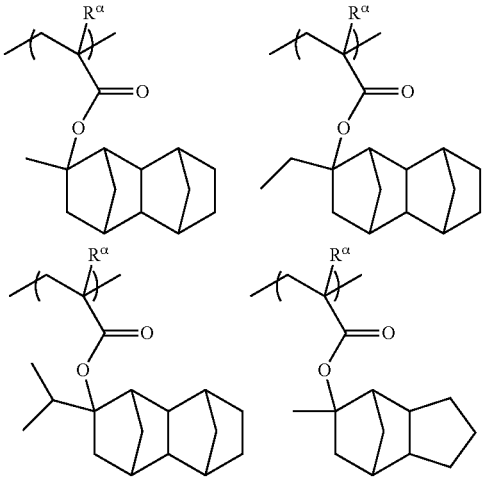

-continued
[Chemical formula 12]
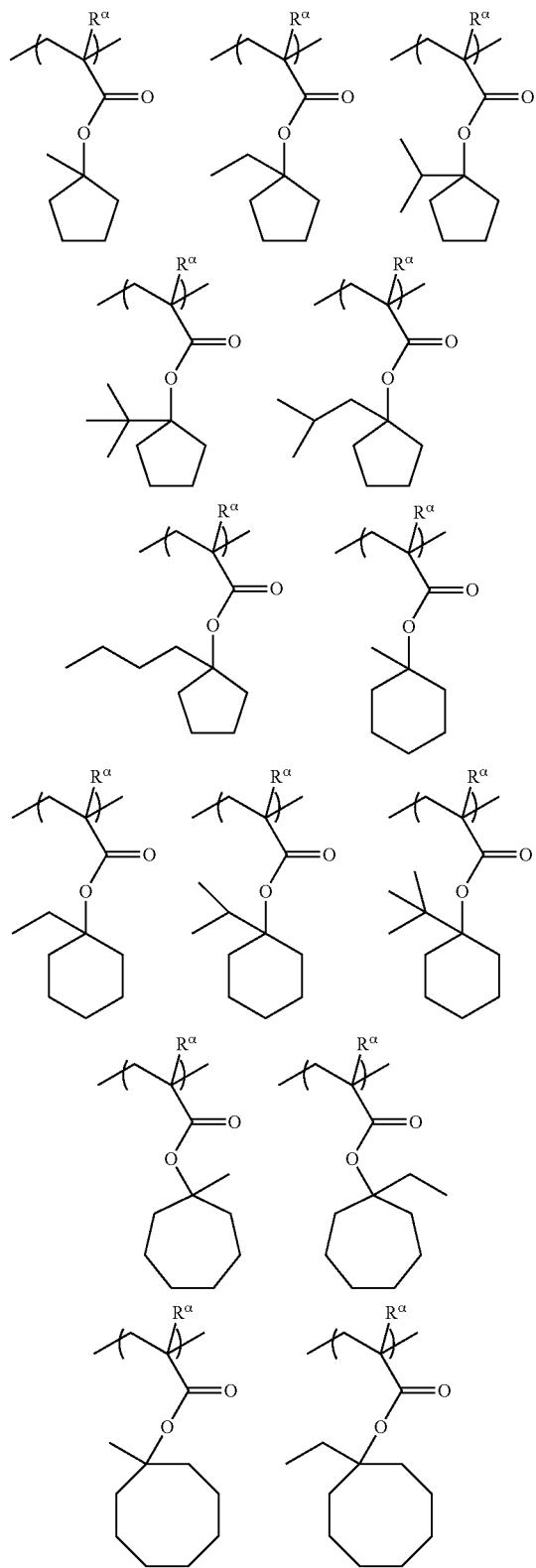
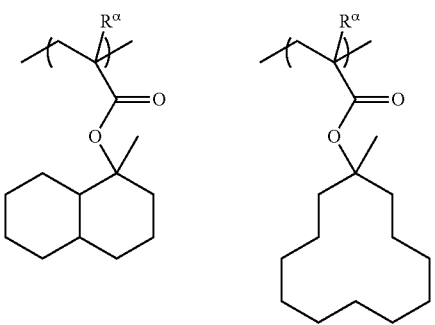
[Chemical formula 13]
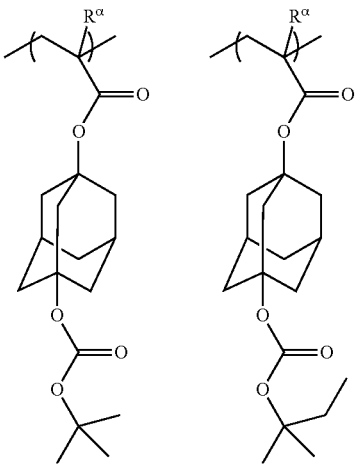
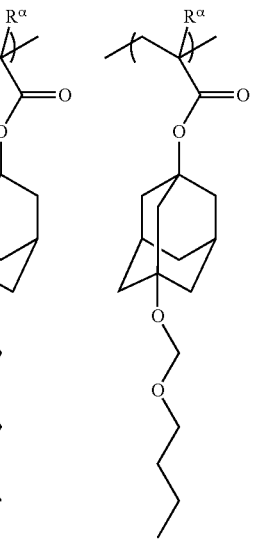

-continued

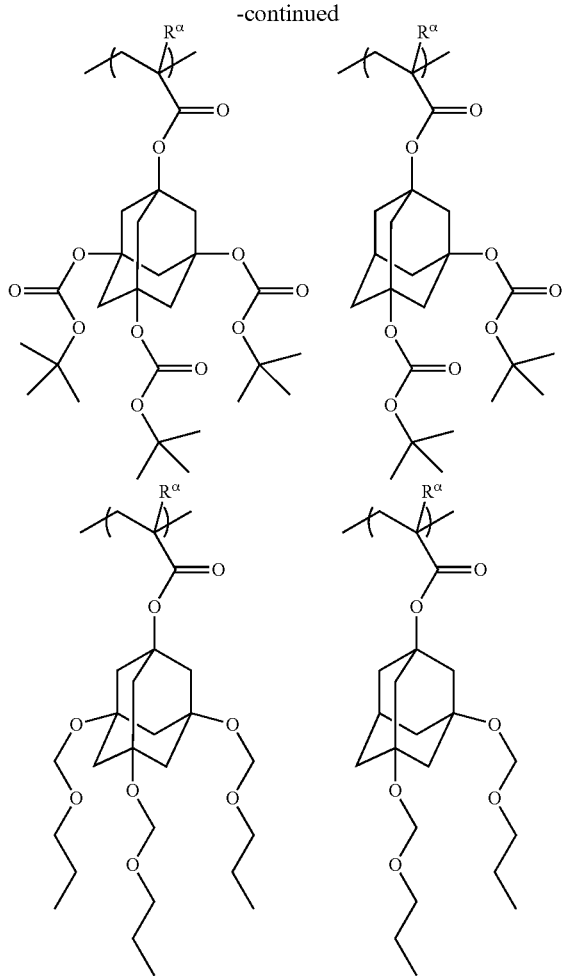

In the component (A), the amount of the structural unit (a1) based on the total of all the structural units constituting the component (A) is preferably 20 to 80 mol %, more preferably 20 to 75 mol %, and still more preferably 25 to 70 mol %. When the amount of the structural unit (a1) is not less than the lower limit of the above-mentioned range, various lithography properties such as sensitivity, resolution and LWR are improved, and when it is not more than the upper limit, a good balance can be achieved with the other structural units.

(Structural Unit (a2))

In the present embodiment, the base component preferably includes a structural unit (a2) containing a —SO$_2$-containing cyclic group, a lactone-containing cyclic group, carbonate-containing cyclic group or other heterocyclic groups.

When the component (A) is used for forming a resist film, the —SO$_2$— containing cyclic group, the lactone-containing cyclic group, the carbonate-containing cyclic group or other heterocyclic groups within the structural unit (a2) are effective in improving the adhesion between the resist film and the substrate.

The later-described structural unit (a1) which contains a —SO$_2$— containing cyclic group, a lactone-containing cyclic group, a carbonate-containing cyclic group or other heterocyclic groups may fall under the definition of the structural unit (a2); however, such a structural unit is regarded as a structural unit (a1), and does not fall under the definition of the structural unit (a2).

The structural unit (a2) is preferably a structural unit represented by general formula (a2-1) shown below.

[Chemical formula 14]

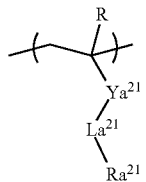

(a2-1)

In the formula (a2-1), R represents a hydrogen atom, an alkyl group having 1 to 5 carbon atoms, a halogenated alkyl group having 1 to 5 carbon atoms; $Ya^{21}$ represents a single bond or a divalent linking group; $La^{21}$ represents —O—, —COO—, —CON(R')—, —OCO—, —CONHCO— or —CONHCS—; and R' represents a hydrogen atom or a methyl group, provided that, when $La^{21}$ represents —O—, $Ya^{21}$ does not represent —CO—; and $Ra^{21}$ represents a —SO$_2$-containing cyclic group, a lactone-containing cyclic group, a carbonate-containing cyclic group or other heterocyclic groups.

The divalent linking group for $Ya^{21}$ is not particularly limited, and preferable examples thereof include a divalent hydrocarbon group which may have a substituent and a divalent linking group containing a hetero atom.

(Divalent Hydrocarbon Group which May have a Substituent)

The hydrocarbon group as a divalent linking group may be either an aliphatic hydrocarbon group or an aromatic hydrocarbon group.

An "aliphatic hydrocarbon group" refers to a hydrocarbon group that has no aromaticity. The aliphatic hydrocarbon group may be saturated or unsaturated. In general, the aliphatic hydrocarbon group is preferably saturated.

Examples of the aliphatic hydrocarbon group include a linear or branched aliphatic hydrocarbon group, and an aliphatic hydrocarbon group containing a ring in the structure thereof. Specifically, groups exemplified below for $Va^1$ in formula (a1-1) can be mentioned.

The linear or branched aliphatic hydrocarbon group may or may not have a substituent. Examples of the substituent include a fluorine atom, a fluorinated alkyl group having 1 to 5 carbon atoms, and a carbonyl group.

As examples of the aliphatic hydrocarbon group containing a ring in the structure thereof, a cyclic aliphatic hydrocarbon group containing a hetero atom in the ring structure thereof and which may have a substituent (a group in which two hydrogen atoms have been removed from an aliphatic hydrocarbon ring), a group in which the cyclic aliphatic hydrocarbon group is bonded to the terminal of the aforementioned linear or branched aliphatic hydrocarbon group, and a group in which the cyclic aliphatic hydrocarbon group is interposed within the aforementioned linear or branched aliphatic hydrocarbon group, can be given. As the linear or branched aliphatic hydrocarbon group, the same groups as those described above can be used.

The cyclic aliphatic hydrocarbon group preferably has 3 to 20 carbon atoms, and more preferably 3 to 12 carbon atoms.

Specific examples of the cyclic aliphatic hydrocarbon group include the same group exemplified above for $Va^1$ in the formula (a1-1).

The cyclic aliphatic hydrocarbon group may or may not have a substituent. Examples of the substituent include an alkyl group, an alkoxy group, a halogen atom, a halogenated alkyl group, a hydroxyl group and a carbonyl group.

The alkyl group as the substituent is preferably an alkyl group having 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

The cyclic aliphatic hydrocarbon group may have part of the carbon atoms constituting the ring structure thereof substituted with a substituent containing a hetero atom. As the substituent containing a hetero atom, —O—, —C(=O)—O—, —S—, —S(=O)$_2$— or —S(=O)$_2$—O— is preferable.

Specific examples of the aromatic hydrocarbon group as a divalent hydrocarbon group include the same group as exemplified above for Va$^1$ in the formula (a1-1).

With respect to the aromatic hydrocarbon group, the hydrogen atom within the aromatic hydrocarbon group may be substituted with a substituent. For example, the hydrogen atom bonded to the aromatic ring within the aromatic hydrocarbon group may be substituted with a substituent. Examples of substituents include an alkyl group, an alkoxy group, a halogen atom, a halogenated alkyl group and a hydroxyl group.

The alkyl group as the substituent is preferably an alkyl group having 1 to 5 carbon atoms, and a methyl group, an ethyl group, a propyl group, an n-butyl group or a tert-butyl group is particularly desirable.

As the alkoxy group, the halogen atom and the halogenated alkyl group for the substituent, the same groups as the aforementioned substituent groups for substituting a hydrogen atom within the cyclic aliphatic hydrocarbon group can be used.

(Divalent Linking Group Containing a Hetero Atom)

With respect to a divalent linking group containing a hetero atom, a hetero atom is an atom other than carbon and hydrogen, and examples thereof include an oxygen atom, a nitrogen atom, a sulfur atom and a halogen atom.

In the case where Ya$^{21}$ represents a divalent linking group containing a hetero atom, preferable examples of the linking group include —O—, —C(=O)—O—, —C(=O)—, —O—C(=O)—O—, —C(=O)—NH—, —NH—, —NH—C(=NH)— (wherein H may be substituted with a substituent such as an alkyl group or an acyl group), —S—, —S(=O)$_2$—, —S(=O)$_2$—O—, a group represented by general formula —Y$^{21}$—O—Y$^{22}$—, —Y$^{21}$—O—, —Y$^{21}$—C(=O)—O—, —C(=O)—O—Y$^{21}$, —[Y$^{21}$—C(=O)—O]$_{m'}$—Y$^{22}$— or —Y$^{21}$—O—C(=O)—Y$^{22}$—, [in the formulae, Y$^{21}$ and Y$^{22}$ each independently represents a divalent hydrocarbon group which may have a substituent, and O represents an oxygen atom; and m' represents an integer of 0 to 3.

In the case where the divalent linking group containing a hetero atom represents —C(=O)—NH—, —NH—, or —NH—C(=NH)—, H may be substituted with a substituent such as an alkyl group, an acyl group or the like. The substituent (an alkyl group, an acyl group or the like) preferably has 1 to 10 carbon atoms, more preferably 1 to 8, and most preferably 1 to 5.

In the formulae —Y$^{21}$—O—Y$^{22}$—, —Y$^{21}$—O—, —Y$^{21}$—C(=O)—O—, —C(=O)—O—Y$^{21}$, —[Y$^{21}$—C(=O)—O]$_{m'}$—Y$^{22}$— and —Y$^{21}$—O—C(=O)—Y$^{22}$—, Y$^{21}$ and Y$^{22}$ each independently represents a divalent hydrocarbon group which may have a substituent. Examples of the divalent hydrocarbon group include the same groups as those described above as the "divalent hydrocarbon group which may have a substituent" in the explanation of the aforementioned divalent linking group.

As Y$^{21}$, a linear aliphatic hydrocarbon group is preferable, more preferably a linear alkylene group, still more preferably a linear alkylene group having 1 to 5 carbon atoms, and a methylene group or an ethylene group is particularly desirable.

As Y$^{22}$, a linear or branched aliphatic hydrocarbon group is preferable, and a methylene group, an ethylene group or an alkylmethylene group is more preferable. The alkyl group within the alkylmethylene group is preferably a linear alkyl group having 1 to 5 carbon atoms, more preferably a linear alkyl group having 1 to 3 carbon atoms, and most preferably a methyl group.

In the group represented by the formula —[Y$^{21}$—C(=O)—O]$_{m'}$—Y$^{22}$—, m' represents an integer of 0 to 3, preferably an integer of 0 to 2, more preferably 0 or 1, and most preferably 1. Namely, it is particularly desirable that the group represented by the formula —[Y$^{21}$—C(=O)—O]$_{m'}$—Y$^{22}$— is a group represented by the formula —Y$^{21}$—C(=O)—O—Y$^{22}$—. Among these, a group represented by the formula —(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

In the present embodiment, Ya$^{21}$ preferably represents an ester bond [—C(=O)—O—], an ether bond (—O—), a linear or branched alkylene group, a combination of these, or a single bond.

In the formula (a2-1), Ra$^{21}$ represents an —SO$_2$— containing cyclic group, a lactone-containing cyclic group, a heterocyclic group or a carbonate-containing cyclic group.

An "—SO$_2$— containing cyclic group" refers to a cyclic group having a ring containing —SO$_2$— within the ring structure thereof, i.e., a cyclic group in which the sulfur atom (S) within —SO$_2$-forms part of the ring skeleton of the cyclic group. The ring containing —SO$_2$— within the ring skeleton thereof is counted as the first ring. A cyclic group in which the only ring structure is the ring that contains —SO$_2$— in the ring skeleton thereof is referred to as a monocyclic group, and a group containing other ring structures is described as a polycyclic group regardless of the structure of the other rings. The —SO$_2$— containing cyclic group may be either a monocyclic group or a polycyclic group.

As the —SO$_2$— containing cyclic group, a cyclic group containing —O—SO$_2$— within the ring skeleton thereof, i.e., a cyclic group containing a sultone ring in which —O—S— within the —O—SO$_2$— group forms part of the ring skeleton thereof is particularly desirable. More specific examples of the —SO$_2$-containing cyclic group include groups represented by general formulae (a5-r-1) to (a5-r-4) shown below.

[Chemical formula 15]

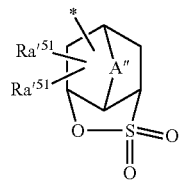
(a5-r-1)

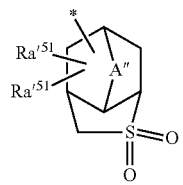
(a5-r-2)

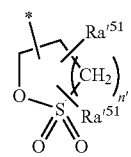
(a5-r-3)

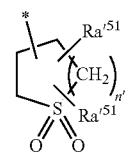
(a5-r-4)

In the formulae, each Ra'$^{51}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom or an alkyl group; A" represents an oxygen atom, a sulfur atom or an alkylene group having 1 to 5 carbon atoms which may contain an oxygen atom or a sulfur atom; and n' represents an integer of 0 to 2.

In the formulae (a5-r-1) to (a5-r-4), A" is the same as defined for A" in general formulae (a2-r-1) to (a2-r-7) described below. The alkyl group, alkoxy group, halogen atom, halogenated alkyl group, —COOR", —OC(=O)R" and hydroxyalkyl group for Ra'$^{51}$ are the same as defined for Ra'$^{21}$ in general formulae (a2-r-1) to (a2-r-7) described below.

Specific examples of the groups represented by the formulae (a5-r-1) to (a5-r-4) are shown below. In the formulae shown below, "Ac" represents an acetyl group.

[Chemical formula 16]

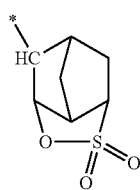
(r-sl-1-1)

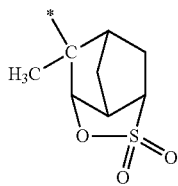
(r-sl-1-2)

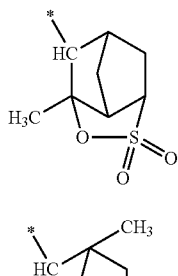
(r-sl-1-3)

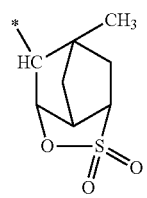
(r-sl-1-4)

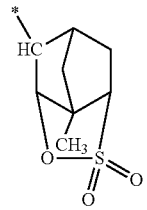
(r-sl-1-5)

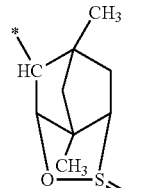
(r-sl-1-6)

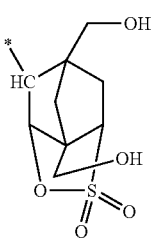
(r-sl-1-7)

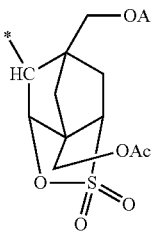
(r-sl-1-8)

39
-continued
(r-sl-1-9)
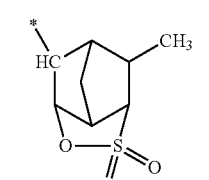
(r-sl-1-10)
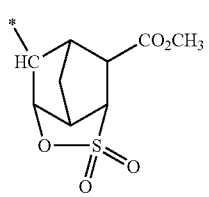
(r-sl-1-11)
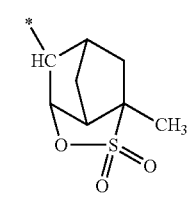
(r-sl-1-12)
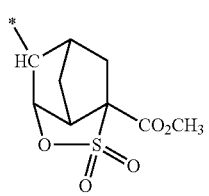
(r-sl-1-13)
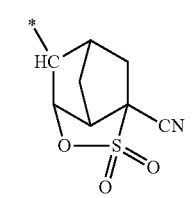
(r-sl-1-14)
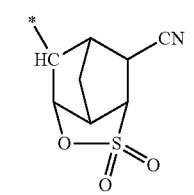
(r-sl-1-15)
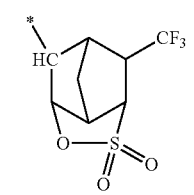
(r-sl-1-16)
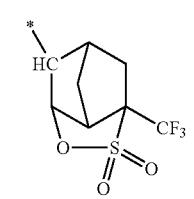
40
-continued
(r-sl-1-17)
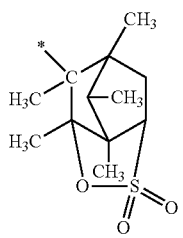
(r-sl-1-18)
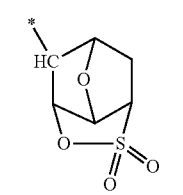
(r-sl-1-19)
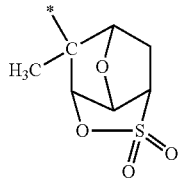
(r-sl-1-20)
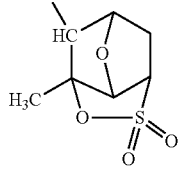
(r-sl-1-21)
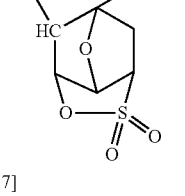
[Chemical formula 17]
(r-sl-1-22)
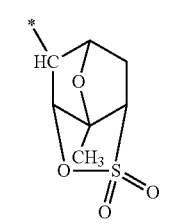
(r-sl-1-23)
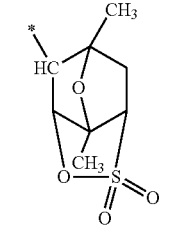

-continued (r-sl-1-24) 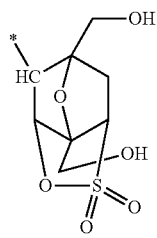

(r-sl-1-25) 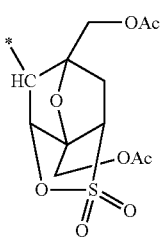

(r-sl-1-26) 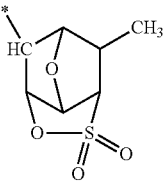

(r-sl-1-27) 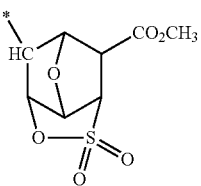

(r-sl-1-28) 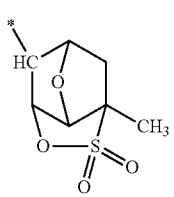

(r-sl-1-29) 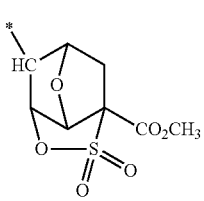

(r-sl-1-30) 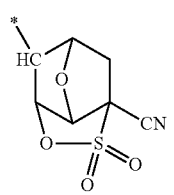

-continued (r-sl-1-31) 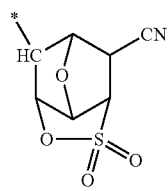

(r-sl-1-32) 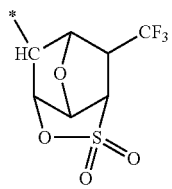

(r-sl-1-33) 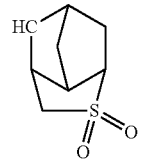

[Chemical formula 18]

(r-sl-2-1) 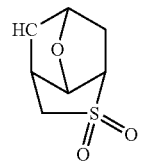

(r-sl-2-2) 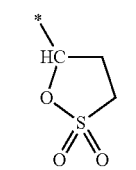

(r-sl-3-1) 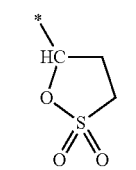

(r-sl-4-1) 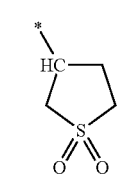

In the present embodiment, in the case where the structural unit (a2) contains a —SO$_2$— containing cyclic group, a group represented by the formula (a5-r-1) is preferable, a group represented by any one of the chemical formulae (r-sl-1-1), (r-sl-1-18), (r-sl-3-1) and (r-sl-4-1) is more preferable, and a group represented by the chemical formula (r-sl-1-1) is most preferable.

The term "lactone-containing cyclic group" refers to a cyclic group including a ring containing a —O—C(=O)— structure (lactone ring) in its ring skeleton. The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings. The lactone-containing cyclic group may be either a monocyclic group or a polycyclic group.

As the lactone-containing cyclic group, there is no particular limitation, and an arbitrary group may be used.

Specific examples include groups represented by general formulae (a2-r-1) to (a2-r-7) shown below. Hereinbelow, "*" represents a valence bond.

[Chemical formula 19]

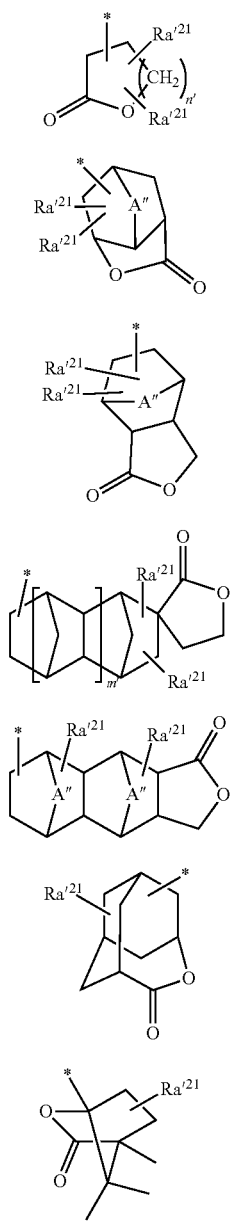

In the formulae, each $Ra'^{21}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom or an alkyl group; A" represents an oxygen atom, a sulfur atom or an alkylene group having 1 to 5 carbon atoms which may contain an oxygen atom or a sulfur atom; n' represents an integer of 0 to 2; and m' represents 0 or 1.

In the formulae (a2-r-1) to (a2-r-7) above, A" represents an oxygen atom (—O—), a sulfur atom (—S—) or an alkylene group having 1 to 5 carbon atoms which may contain an oxygen atom or a sulfur atom. As the alkylene group having 1 to 5 carbon atoms for A", a linear or branched alkylene group is preferable, and examples thereof include a methylene group, an ethylene group, an n-propylene group and an isopropylene group. Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$—, —CH$_2$—O—CH$_2$—, —S—CH$_2$— and —CH$_2$—S—CH$_2$—. As A", an alkylene group having 1 to 5 carbon atoms or —O— is preferable, more preferably an alkylene group having 1 to 5 carbon atoms, and most preferably a methylene group. Each $Ra'^{21}$ independently represents an alkyl group, an alkoxy group, a halogen atom, a halogenated alkyl group, —COOR", —OC(=O)R", a hydroxyalkyl group or a cyano group.

The alkyl group for $Ra'^{21}$ is preferably an alkyl group having 1 to 5 carbon atoms.

The alkoxy group for $Ra'^{21}$ is preferably an alkoxy group having 1 to 6 carbon atoms.

Further, the alkoxy group is preferably a linear or branched alkoxy group. Specific examples of the alkoxy groups include the aforementioned alkyl groups for $Ra'^{21}$ having an oxygen atom (—O—) bonded thereto.

As examples of the halogen atom for $Ra'^{21}$, a fluorine atom, chlorine atom, bromine atom and iodine atom can be given. Among these, a fluorine atom is preferable.

Examples of the halogenated alkyl group for $Ra'^{21}$ include groups in which part or all of the hydrogen atoms within the aforementioned alkyl group for $Ra'^{21}$ has been substituted with the aforementioned halogen atoms. As the halogenated alkyl group, a fluorinated alkyl group is preferable, and a perfluoroalkyl group is particularly desirable.

R" represents a hydrogen atom or an alkyl group. As the alkyl group for R", an alkyl group having 1 to 5 carbon atoms is preferable.

Specific examples of the groups represented by any one of the formulae (a2-r-1) to (a2-r-7) are shown below.

[Chemical formula 20]

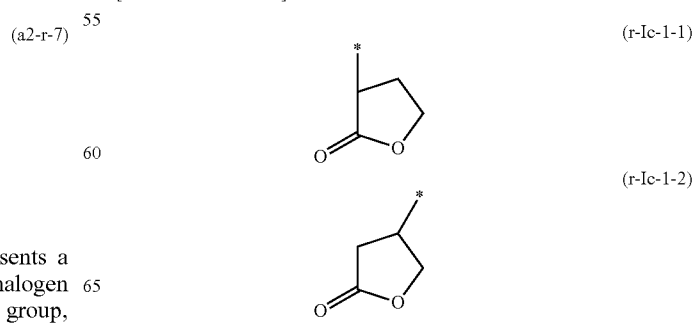

-continued
(r-Ic-1-3)
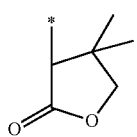
(r-Ic-1-4)
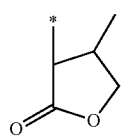
(r-Ic-1-5)
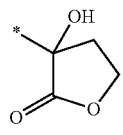
(r-Ic-1-6)
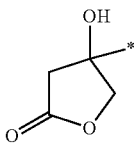
(r-Ic-1-7)
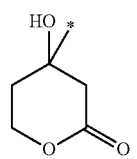
(r-Ic-2-1)
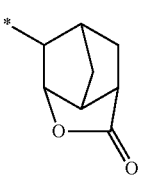
(r-Ic-2-2)
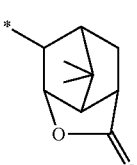
(r-Ic-2-3)
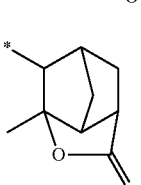
(r-Ic-2-4)
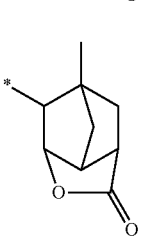
-continued
(r-Ic-2-5)
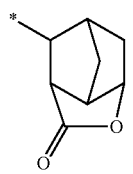
(r-Ic-2-6)
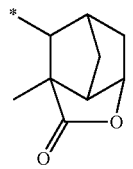
(r-Ic-2-7)
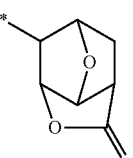
(r-Ic-2-8)
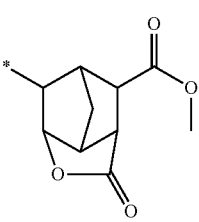
(r-Ic-2-9)
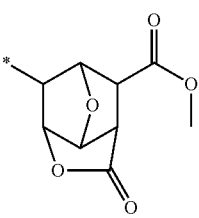
(r-Ic-2-10)
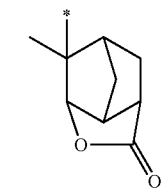
(r-Ic-2-11)
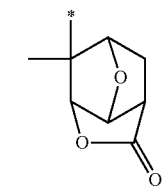
(r-Ic-2-12)
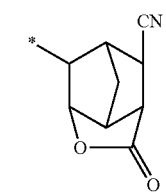

(r-Ic-2-13)
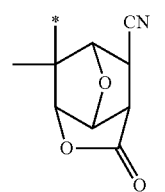
(r-Ic-3-1)
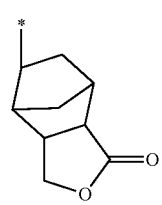
(r-Ic-3-2)
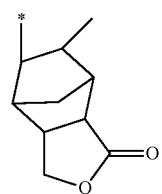
(r-Ic-3-3)
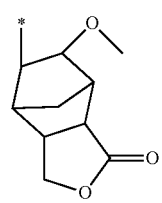
(r-Ic-3-4)
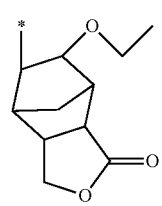
(r-Ic-3-5)
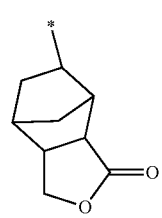
(r-Ic-4-1)
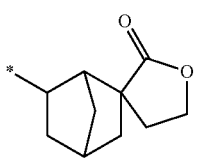
(r-Ic-4-2)
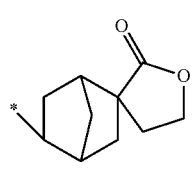
(r-Ic-4-3)
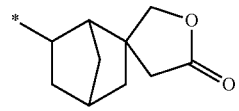
(r-Ic-4-4)
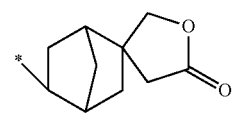
(r-Ic-4-5)
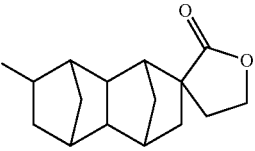
(r-Ic-4-6)
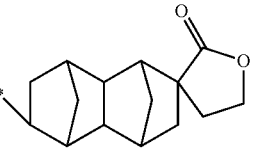
(r-Ic-4-7)
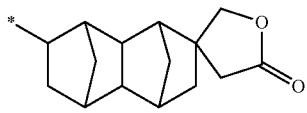
(r-Ic-4-8)
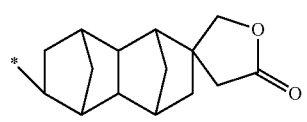
(r-Ic-4-9)
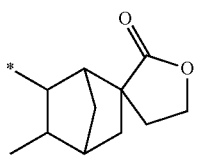
(r-Ic-5-1)
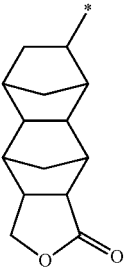
(r-Ic-5-2)

(r-Ic-5-3)

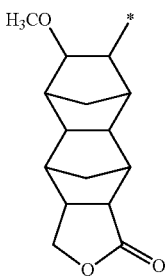

[Chemical formula 21]

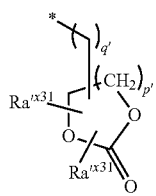
(ax3-r-1)

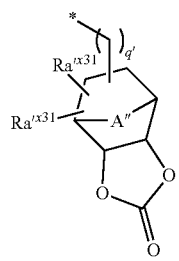
(ax3-r-2)

(r-Ic-5-4)

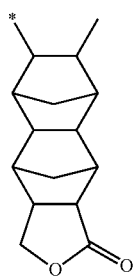

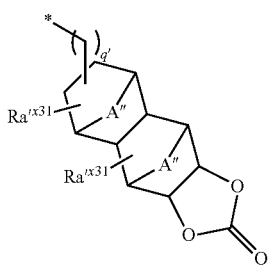
(ax3-r-3)

(r-Ic-6-1)

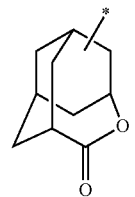

(r-Ic-7-1)

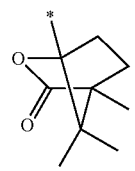

In the present embodiment, as the structural unit (a2), a group represented by the formula (a2-r-1) or (a2-r-2) is preferable, and a group represented by the chemical formula (r-lc-1-1) or (r-lc-2-7) is more preferable.

The term "carbonate-containing cyclic group" refers to a cyclic group including a ring containing a —O—C(=O)—O— structure (carbonate ring) in its ring skeleton. The term "carbonate ring" refers to a single ring containing a —O—C(=O)—O— structure, and this ring is counted as the first ring. A carbonate-containing cyclic group in which the only ring structure is the carbonate ring is referred to as a monocyclic group, and groups containing other ring structures are described as polycyclic groups regardless of the structure of the other rings. The carbonate-containing cyclic group may be either a monocyclic group or a polycyclic group.

The carbonate-containing cyclic group is not particularly limited, and an arbitrary group may be used.

Specific examples include groups represented by any one of general formulae (ax3-r-1) to (ax3-r-3) shown below.

In the formulae, $Ra'^{x31}$ each independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom or an alkyl group; A" represents an oxygen atom, a sulfur atom or an alkylene group having 1 to 5 carbon atoms which may contain an oxygen atom or a sulfur atom; and q' represents 0 or 1. p' is an integer of 0 to 3.

In the formulae (ax3-r-1) to (ax3-r-3), A" is the same as defined for A" in the formula (a2-r-1).

Examples of the alkyl group, alkoxy group, halogen atom, halogenated alkyl group, —COOR", —OC(=O)R" and hydroxyalkyl group for $Ra'^{31}$ include the same groups as those described above in the explanation of $Ra^{21}$ in the formulae (a2-r-1) to (a2-r-7).

Specific examples of the groups represented by the general formulae (ax3-r-1) to (ax3-r-3) are shown below.

[Chemical formula 22]

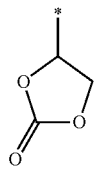
(r-cr-1-1)

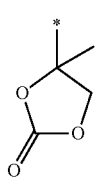
(r-cr-1-2)

-continued
(r-cr-1-3)
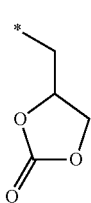
(r-cr-1-4)
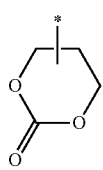
(r-cr-1-5)
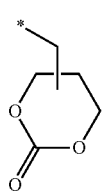
(r-cr-1-6)
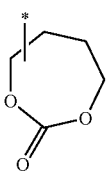
(r-cr-1-6)
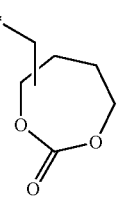
(r-cr-2-1)
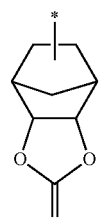
(r-cr-2-2)
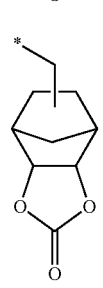
-continued
(r-cr-2-3)
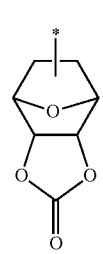
(r-cr-2-4)
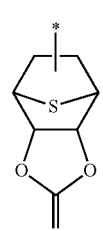
(r-cr-3-1)
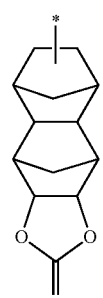
(r-cr-3-2)
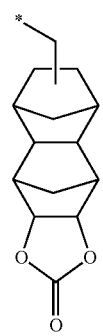
(r-cr-3-3)

(r-cr-3-4)

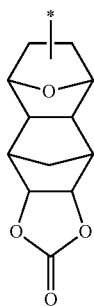

(r-cr-3-5)

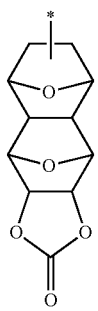

"Heterocyclic group" is a cyclic group containing one or more atoms other than the carbon atom in addition to the carbon atoms. Examples thereof include heterocyclic groups described later in the chemical formulae (r-hr-1) to (r-hr-16), nitrogen-containing hetero rings, and the like. Examples of the nitrogen-containing hetero ring include a cycloalkyl group having 3 to 8 carbon atoms which may be substituted with one or two oxo groups. Preferable examples of the cycloalkyl group include a group obtained by removing one hydrogen atom from 2,5-dioxopyrrolidine or 2,6-dioxopiperidine.

As the structural unit (a2) contained in the component (A), one type of a structural unit may be used, or two or more types thereof may be used.

When the component (A) contains the structural unit (a2), the amount of the structural unit (a2) based on the total of all the structural units constituting the component (A1) is preferably 1 to 80 mol %, more preferably 5 to 70 mol %, still more preferably 10 to 65 mol %, and most preferably 10 to 60 mol %. When the amount of the structural unit (a2) is not less than the lower limit of the above-mentioned range, the effect of using the structural unit (a2) can be satisfactorily achieved. On the other hand, when the amount of the structural unit (a2) is not more than the upper limit of the above-mentioned range, a good balance can be achieved with the other structural units, and various lithography properties and pattern shape can be improved.

The component (A1) may contain the following structural units (a3) and (a4) in addition to the above structural units (a1) and (a2).

(Structural Unit (a3))

The structural unit (a3) is a structural unit containing a polar group-containing aliphatic hydrocarbon group (provided that the structural units that fall under the definition of structural units (a1) and (a2) are excluded).

When the component (A1) includes the structural unit (a3), it is presumed that the hydrophilicity of the component (A) is enhanced, thereby contributing to improvement in resolution.

Examples of the polar group include a hydroxyl group, cyano group, carboxyl group, or hydroxyalkyl group in which part of the hydrogen atoms of the alkyl group have been substituted with fluorine atoms, although a hydroxyl group is particularly desirable.

Examples of the aliphatic hydrocarbon group include linear or branched hydrocarbon groups (preferably alkylene groups) of 1 to 10 carbon atoms, and cyclic aliphatic hydrocarbon groups (cyclic groups). The cyclic group may be either a monocyclic group or polycyclic group. These cyclic groups can be selected appropriately from the multitude of groups that have been proposed for the resins of resist compositions designed for use with ArF excimer lasers. The cyclic group is preferably a polycyclic group, more preferably a polycyclic group having 7 to 30 carbon atoms.

Of the various possibilities, structural units derived from an acrylate ester that include an aliphatic polycyclic group that contains a hydroxyl group, cyano group, carboxyl group or a hydroxyalkyl group in which part of the hydrogen atoms of the alkyl group has been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

As the structural unit (a3), there is no particular limitation as long as it is a structural unit containing a polar group-containing aliphatic hydrocarbon group, and an arbitrary structural unit may be used.

The structural unit (a3) is preferably a structural unit derived from an acrylate ester which may have the hydrogen atom bonded to the carbon atom on the α-position substituted with a substituent and contains a polar group-containing aliphatic hydrocarbon group.

When the hydrocarbon group within the polar group-containing aliphatic hydrocarbon group is a linear or branched hydrocarbon group having 1 to 10 carbon atoms, the structural unit (a3) is preferably a structural unit derived from a hydroxyethyl ester of acrylic acid. On the other hand, when the hydrocarbon group is a polycyclic group, structural units represented by general formulae (a3-1), (a3-2) or (a3-3) shown below are preferable.

[Chemical formula 23]

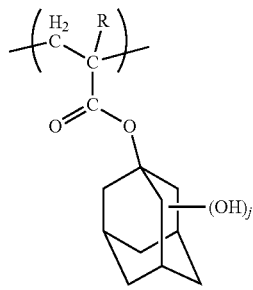

(a3-1)

-continued

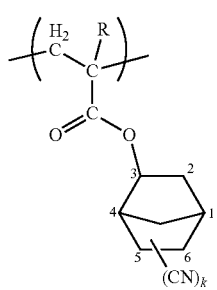

(a3-2)

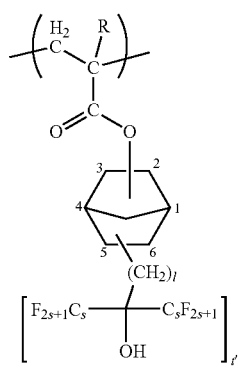

(a3-3)

In the formulae (a3-1) to (a3-3), R represents a hydrogen atom, an alkyl group having 1 to 5 carbon atoms, or a halogenated alkyl group having 1 to 5 carbon atoms; j is an integer of 1 to 3; k is an integer of 1 to 3; t' is an integer of 1 to 3; l is an integer of 1 to 5; and s is an integer of 1 to 3.

In the formulae (a3-1) to (a3-3), explanation with respect to R is the same as described above.

In the formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In the formula (a3-2), k is preferably 1. The cyano group is preferably bonded to the 5th or 6th position of the norbornyl group.

In the formula (a3-3), t' is preferably 1. l is preferably 1. s is preferably 1. Further, it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

As the structural unit (a3) contained in the component (A1), one type of the structural unit may be used, or two or more types thereof may be used.

The amount of the structural unit (a3) within the component (A1) based on the total of all the structural units constituting the component (A1) is preferably 5 to 50 mol %, more preferably 5 to 40 mol %, and still more preferably 5 to 25 mol %.

When the amount of the structural unit (a3) is not less than the lower limit of the above-mentioned range, the effect of using the structural unit (a3) can be satisfactorily achieved. On the other hand, when the amount of the structural unit (a3) is not more than the upper limit of the above-mentioned range, a good balance can be achieved with the other structural units.

(Structural Unit (a4))

The structural unit (a4) is a structural unit containing an acid non-dissociable cyclic group. When the component (A1) includes the structural unit (a4), dry etching resistance of the resist pattern to be formed is improved. Further, the hydrophobicity of the component (A1) is further improved.

Increase in the hydrophobicity contributes to improvement in terms of resolution, shape of the resist pattern and the like, particularly in an organic solvent developing process.

An "acid non-dissociable, cyclic group" in the structural unit (a4) refers to a cyclic group which is not dissociated by the action of an acid generated from the component (B) described later upon exposure, and remains in the structural unit.

As the structural unit (a4), a structural unit which contains a non-acid-dissociable aliphatic cyclic group, and is also derived from an acrylate ester is preferable. Examples of this cyclic group include the same groups as those described above in relation to the structural unit (a1), and any of the multitude of conventional groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecyl group, adamantyl group, tetracyclododecyl group, isobornyl group, and norbornyl group is particularly desirable.

These polycyclic groups may be substituted with a linear or branched alkyl group having 1 to 5 carbon atoms.

Specific examples of the structural unit (a4) include units with structures represented by general formulae (a4-1) to (a4-7) shown below.

[Chemical formula 24]

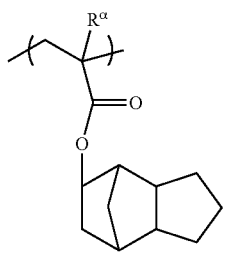

(a4-1)

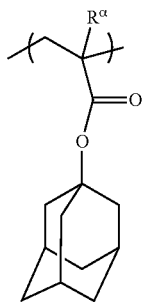

(a4-2)

(a4-3)
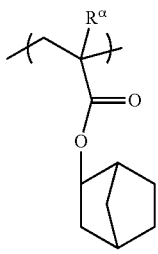

(a4-4)
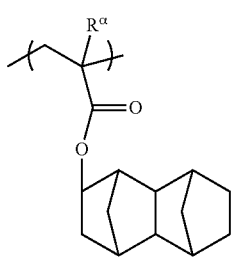

(a4-5)
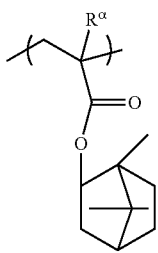

(a4-6)
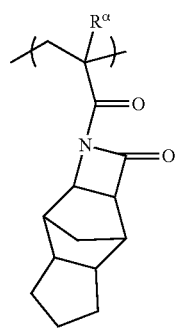

(a4-7)
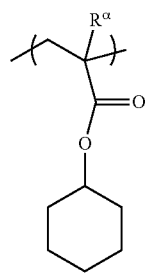

In the formulae (a4-1) to (a4-7), $R^\alpha$ represents a hydrogen atom, a methyl group or a trifluoromethyl group.

As the structural unit (a4) contained in the component (A1), 1 type of structural unit may be used, or 2 or more types may be used.

When the structural unit (a4) is included in the component (A1), the amount of the structural unit (a4) based on the total of all the structural units that constitute the component (A1) is preferably 1 to 30 mol %, and more preferably 10 to 20 mol %.

The component (A1) is preferably a copolymer having the structural units (a1) and (a2).

The component (A1) can be obtained, for example, by a conventional radical polymerization or the like of the monomers corresponding with each of the structural units, using a radical polymerization initiator such as azobisisobutyronitrile (AIBN) or dimethylazobis(isobutyrate).

Furthermore, in the component (A1), at the time of polymerization by using a chain transfer agent such as HS—$CH_2$—$CH_2$—$CH_2$—$C(CF_3)_2$—OH, a —$C(CF_3)_2$—OH group can be introduced at the terminals of the component (A1). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

In the present embodiment, the weight average molecular weight (Mw) (the polystyrene equivalent value determined by gel permeation chromatography) of the component (A1) is not particularly limited, but is preferably 1,000 to 50,000, more preferably 1,500 to 30,000, and most preferably 2,000 to 20,000.

When the weight average molecular weight is not more than the upper limit of the above-mentioned range, the resist composition exhibits a satisfactory solubility in a resist solvent. On the other hand, when the weight average molecular weight is not less than the lower limit of the above-mentioned range, dry etching resistance and the cross-sectional shape of the resist pattern become satisfactory.

As the component (A1), one type may be used alone, or two or more types may be used in combination.

In the component (A), the amount of the component (A1) based on the total weight of the component (A) is preferably 25% by weight or more, more preferably 50% by weight or more, still more preferably 75% by weight or more, and may be even 100% by weight. When the amount of the component (A1) is 25% by weight or more, various lithography properties are improved.

In the present embodiment, as the component (A), one type may be used, or two or more types of components may be used in combination.

In the present embodiment, the amount of the component (A) can be appropriately adjusted depending on the thickness of the resist film to be formed, and the like.

<Acid Generator Component; Component (B)>

In the present embodiment, the resist composition may further include an acid generator component (B) (hereafter, referred to as "component (B)") which generates an acid upon exposure. As the component (B), there is no particular limitation, and any of the known acid generators used in conventional chemically amplified resist compositions can be used.

Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators. Among these, it is preferable to use an onium salt acid generator.

As the onium salt acid generator, a compound represented by general formula (b-1) below (hereafter, sometimes referred to as "component (b-1)"), a compound represented by general formula (b-2) below (hereafter, sometimes referred to as "component (b-2)") or a compound represented by general formula (b-3) below (hereafter, sometimes referred to as "component (b-3)") may be used.

[Chemical formula 25]

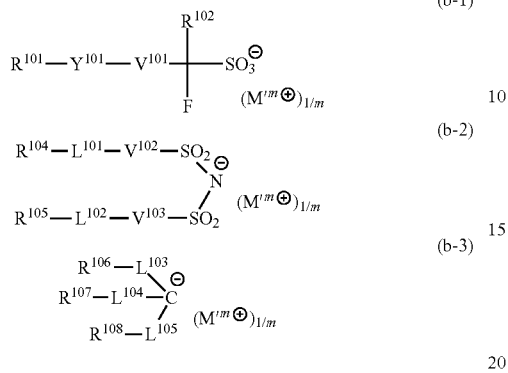

In the formulae (b-1) to (b-3), $R^{101}$ and $R^{104}$ to $R^{108}$ each independently represents a cyclic group which may have a substituent, a chain-like alkyl group which may have a substituent or a chain-like alkenyl group which may have a substituent, provided that $R^{104}$ and $R^{105}$ may be mutually bonded to form a ring; $R^{106}$ and $R^{107}$ may be mutually bonded to form a ring; $R^{102}$ represents a fluorine atom or a fluorinated alkyl group having 1 to 5 carbon atoms; $Y^{101}$ represents a single bond or a divalent linking group containing an oxygen atom; $V^{101}$ to $V^{103}$ each independently represents a single bond, an alkylene group or a fluorinated alkylene group; $L^{101}$ to $L^{102}$ each independently represents a single bond or an oxygen atom; $L^{103}$ to $L^{105}$ each independently represents a single bond, —CO— or —SO$_2$—; and $M'^{m+}$ represents an organic cation having a valency of m.

{Anion Moiety}
Anion Moiety of Component (b-1)
In the formula (b-1), $R^{101}$ represents a cyclic group which may have a substituent, a chain-like alkyl group which may have a substituent or a chain-like alkenyl group which may have a substituent.

(Cyclic Group which May have a Substituent in $R^{101}$)
The cyclic group is preferably a cyclic hydrocarbon group, and the cyclic hydrocarbon group may be either an aromatic hydrocarbon group or an aliphatic hydrocarbon group.

As the aromatic hydrocarbon group for $R^{101}$, groups in which one hydrogen atom has been removed from an aromatic hydrocarbon ring described above in relation to the divalent aromatic hydrocarbon group for Va$^1$ in the formula (a1-1) or an aromatic compound containing two or more aromatic ring can be mentioned, and a phenyl group or a naphthyl group is preferable.

As the cyclic aliphatic hydrocarbon group for $R^{101}$, groups in which one hydrogen atom has been removed from a monocycloalkane or a polycycloalkane exemplified above in the explanation of the divalent aliphatic hydrocarbon group for Va$^1$ in the formula (a1-1) can be mentioned, and an adamantyl group or a norbornyl group is preferable.

Further, the cyclic hydrocarbon group for $R^{101}$ may contain a hetero atom like as a heterocycle, and specific examples thereof include lactone-containing cyclic groups represented by the general formulae (a2-r-1) to (a2-r-7), —SO$_2$— containing cyclic groups represented by the formulae (a5-r-1) to (a5-r-4) and heterocycles shown below as (r-hr-1) to (r-hr-16).

[Chemical formula 26]

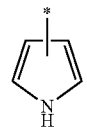
(r-hr-1)

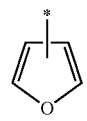
(r-hr-2)

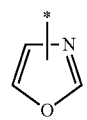
(r-hr-3)

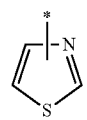
(r-hr-4)

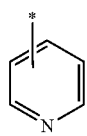
(r-hr-5)

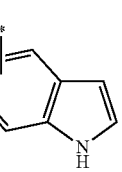
(r-hr-6)

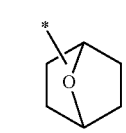
(r-hr-7)

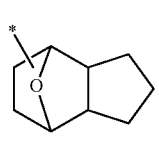
(r-hr-8)

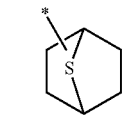
(r-hr-9)

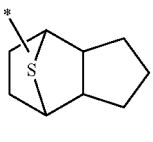
(r-hr-10)

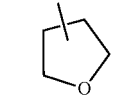
(r-hr-11)

-continued

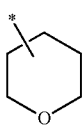
(r-hr-12)

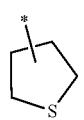
(r-hr-13)

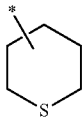
(r-hr-14)

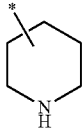
(r-hr-15)

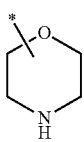
(r-hr-16)

As the substituent for the cyclic hydrocarbon group for $R^{101}$, an alkyl group, an alkoxy group, a halogen atom, a halogenated alkyl group, a hydroxyl group, a carbonyl group, a nitro group or the like can be used.

The alkyl group as the substituent is preferably an alkyl group having 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, isopropoxy group, n-butoxy group or tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Example of the aforementioned halogenated alkyl group for the substituent includes a group in which a part or all of the hydrogen atoms within an alkyl group having 1 to 5 carbon atoms (e.g., a methyl group, an ethyl group, a propyl group, an n-butyl group or a tert-butyl group) have been substituted with the aforementioned halogen atoms.

(Chain-Like Alkyl Group which May have a Substituent in $R^{101}$)

The chain-like alkyl group for $R^{101}$ may be linear or branched.

The linear alkyl group preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched alkyl group preferably has 3 to 20 carbon atoms, more preferably 3 to 15, and most preferably 3 to 10.

Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

(Chain-Like Alkenyl Group which May have a Substituent in $R^{101}$)

The chain-like alkenyl group for $R^{101}$ may be linear or branched, and preferably has 2 to 10 carbon atoms, more preferably 2 to 5 carbon atoms, still more preferably 2 to 4 carbon atoms, and most preferably 3 carbon atoms. Examples of linear alkenyl groups include a vinyl group, a propenyl group (an allyl group) and a butynyl group. Examples of branched alkenyl groups include a 1-methylpropenyl group and a 2-methylpropenyl group.

Among the above-mentioned examples, as the chain-like alkenyl group, a propenyl group is particularly desirable.

As the substituent for the chain-like alkyl group or alkenyl group for $R^{101}$, an alkoxy group, a halogen atom, a halogenated alkyl group, a hydroxyl group, a carbonyl group, a nitro group, an amino group, a cyclic group for $R^{101}$ or the like can be used.

Among these examples, as $R^{101}$, a cyclic group which may have a substituent is preferable, and a cyclic hydrocarbon group which may have a substituent is more preferable.

Specifically, a phenyl group, a naphthyl group, a group in which one or more hydrogen atoms have been removed from a polycycloalkane, a lactone-containing cyclic group represented by any one of the formulae (a2-r-1) to (a2-r-7), and an —$SO_2$— containing cyclic group represented by any one of the formulae (a5-r-1) to (a5-r-4).

In the formula (b-1), $Y^{101}$ represents a single bond or a divalent linking group containing an oxygen atom.

In the case where $Y^{101}$ is a divalent linking group containing an oxygen atom, $Y^{101}$ may contain an atom other than an oxygen atom. Examples of atoms other than an oxygen atom include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an oxycarbonyl group (—O—C(=O)—), an amido bond (—C(=O)—NH—), a carbonyl group (—C(=O)—) and a carbonate bond (—O—C(=O)—O—); and combinations of the aforementioned non-hydrocarbon, oxygen atom-containing linking groups with an alkylene group. Furthermore, the combinations may have a sulfonyl group (—$SO_2$—) bonded thereto. As the combination, the linking group represented by the formulae (y-al-1) to (y-al-7) shown below can be mentioned.

[Chemical formula 27]

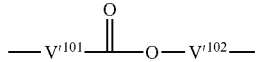
(y-al-1)

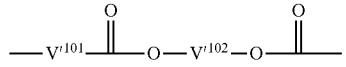
(y-al-2)

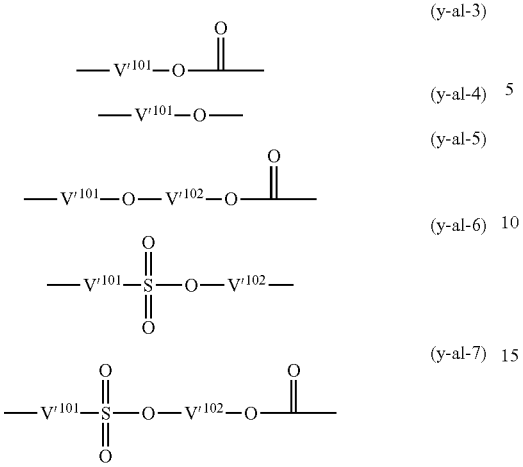

(y-al-3)

(y-al-4)

(y-al-5)

(y-al-6)

(y-al-7)

In the formulae (y-al-1) to (y-al-7), $V'^{101}$ represents a single bond or an alkylene group having 1 to 5 carbon atoms; $V'^{102}$ represents a divalent saturated hydrocarbon group having 1 to 30 carbon atoms.

The divalent saturated hydrocarbon group for $V'^{102}$ is preferably an alkylene group having 1 to 30 carbon atoms.

The alkylene group for $V'^{101}$ and $V'^{102}$ may be a linear alkylene group or a branched alkylene group, and a linear alkylene group is preferable.

Specific examples of the alkylene group for $V'^{101}$ and $V'^{102}$ include a methylene group [—$CH_2$—]; an alkylmethylene group, such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$— and —$C(CH_2CH_3)_2$; an ethylene group [—$CH_2CH_2$—]; and alkylethylene group, such as —$CH(CH_3)CH_2$—, —$CH(CH_3)CH(CH_3)$—, —$C(CH_3)_2CH_2$— and —$CH(CH_2CH_3)CH_2$—; a trimethylene group (n-propylene group) [—$CH_2CH_2CH_2$—]; an alkyltrimethylene group, such as —$CH(CH_3)CH_2CH_2$— and —$CH_2CH(CH_3)CH_2$—; a tetramethylene group [—$CH_2CH_2CH_2CH_2$—]; an alkyltetramethylene group, such as —$CH(CH_3)CH_2CH_2CH_2$—, —$CH_2CH(CH_3)CH_2CH_2$—; and a pentamethylene group [—$CH_2CH_2CH_2CH_2CH_2$—].

Further, part of methylene group within the alkylene group for $V'^{101}$ and $V'^{102}$ may be substituted with a divalent aliphatic cyclic group having 5 to 10 carbon atoms. The aliphatic cyclic group is preferably a divalent group in which one hydrogen atom has been removed from the cyclic aliphatic hydrocarbon group for $Ra^{t3}$ in the formula (a1-r-1), and a cyclohexylene group, 1,5-adamantylene group or 2,6-adamantylene group is preferable.

$Y^{101}$ is preferably a divalent linking group containing an ether bond or an ester bond, and groups represented by the formulae (y-al-1) to (y-al-5) are preferable.

In the formula (b-1), $V^{101}$ represents a single bond, an alkylene group or a fluorinated alkylene group. The alkylene group and the fluorinated alkylene group for $V^{101}$ preferably have 1 to 4 carbon atoms. Examples of the fluorinated alkylene group for $V^{101}$ include a group in which part or all of the hydrogen atoms within the alkylene group for $V^{101}$ have been substituted with fluorine. Among these examples, as $V^{101}$, a single bond or a fluorinated alkylene group having 1 to 4 carbon atoms is preferable.

In the formula (b-1), $R^{102}$ represents a fluorine atom or a fluorinated alkyl group having 1 to 5 carbon atoms. $R^{102}$ is preferably a fluorine atom or a perfluoroalkyl group having 1 to 5 carbon atoms, and more preferably a fluorine atom.

As specific examples of anion moieties of the formula (b-1), in the case where $Y^{101}$ a single bond, a fluorinated alkyl sulfonate anion such as a trifluoromethanesulfonate anion or a perfluorobutanesulfonate anion can be mentioned; and in the case where $Y^{101}$ represents a divalent linking group containing an oxygen atom, anions represented by formulae (an-1) to (an-3) shown below can be mentioned.

[Chemical formula 28]

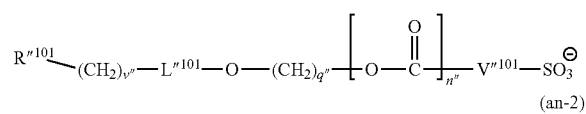

(an-1)

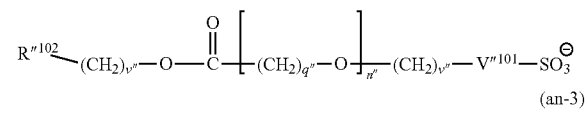

(an-2)

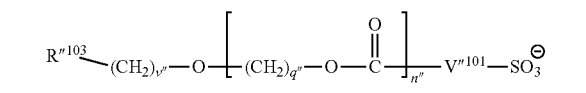

(an-3)

In the formulae, $R'''^{101}$ represents an aliphatic cyclic group which may have a substituent, a group represented by any one of the formulae (r-hr-1) to (r-hr-6) or a chain-like alkyl group which may have a substituent; $R'''^{102}$ represents an aliphatic cyclic group which may have a substituent, a lactone-containing cyclic group represented by any one of the formulae (a2-r-1) to (a2-r-7) or an —$SO_2$— containing cyclic group represented by any one of the general formulae (a5-r-1) to (a5-r-4); $R'''^{103}$ represents an aromatic cyclic group which may have a substituent, an aliphatic cyclic group which may have a substituent or a chain-like alkenyl group which may have a substituent; $V'''^{101}$ represents a fluorinated alkylene group; $L'''^{101}$ represents —$C(=O)$— or —$SO_2$—; v" represents an integer of 0 to 3; q" represents an integer of 1 to 20; and n" represents 0 or 1.

As the aliphatic cyclic group for $R'''^{101}$, $R'''^{102}$ and $R'''^{103}$ which may have a substituent, the same groups as the cyclic aliphatic hydrocarbon group for $R^{101}$ described above are preferable. As the substituent, the same groups as those described above for substituting the cyclic aliphatic hydrocarbon group for $R^{101}$ can be mentioned.

As the aromatic cyclic group for $R'''^{103}$ which may have a substituent, the same groups as the aromatic hydrocarbon group for the cyclic hydrocarbon group represented by $R^{101}$ described above are preferable. The substituent is the same as defined for the substituent for the aromatic hydrocarbon group represented by $R^{101}$.

As the chain-like alkyl group for $R'''^{101}$ which may have a substituent, the same groups as those described above for $R^{101}$ are preferable. As the chain-like alkenyl group for $R'''^{103}$ which may have a substituent, the same groups as those described above for $R^{101}$ are preferable. $V'''^{101}$ is preferably a fluorinated alkylene group having 1 to 3 carbon atoms, and most preferably —$CF_2$—, —$CF_2CF_2$—, —$CHFCF_2$—, —$CF(CF_3)CF_2$— or —$CH(CF_3)CF_2$—.

Anion Moiety of Component (b-2)

In the formula (b-2), $R^{104}$ and $R^{105}$ each independently represents a cyclic group which may have a substituent, a chain-like alkyl group which may have a substituent or a chain-like alkenyl group which may have a substituent, and is the same as defined for $R^{101}$ in the formula (b-1). $R^{104}$ and $R^{105}$ may be mutually bonded to form a ring.

As $R^{104}$ and $R^{105}$, a chain-like alkyl group which may have a substituent is preferable, and a linear or branched alkyl group or a linear or branched fluorinated alkyl group is more preferable.

The chain-like alkyl group preferably has 1 to 10 carbon atoms, more preferably 1 to 7 carbon atoms, and still more preferably 1 to 3 carbon atoms. The smaller the number of carbon atoms of the chain-like alkyl group for $R^{104}$ and $R^{105}$, the more the solubility in a resist solvent is improved. Therefore, smaller number is preferable. Further, in the chain-like alkyl group for $R^{104}$ and $R^{105}$, it is preferable that the number of hydrogen atoms substituted with fluorine atoms is as large as possible because the acid strength increases and the transparency to high energy radiation of 200 nm or less or electron beam is improved. The fluorination ratio of the chain-like alkyl group is preferably 70 to 100%, more preferably 90 to 100%, and it is particularly desirable that the chain-like alkyl group be a perfluoroalkyl group in which all hydrogen atoms are substituted with fluorine atoms.

In the formula (b-2), $V^{102}$ and $V^{103}$ each independently represents a single bond, an alkylene group or a fluorinated alkylene group, and is the same as defined for $V^{101}$ in formula (b-1).

In the formula (b-2), $L^{101}$ and $L^{102}$ each independently represents a single bond or an oxygen atom.

Anion Moiety of Component (b-3)

In the formula (b-3), $R^{106}$ to $R^{108}$ each independently represents a cyclic group which may have a substituent, a chain-like alkyl group which may have a substituent or a chain-like alkenyl group which may have a substituent, and is the same as defined for $R^{101}$ in the formula (b-1).

$L^{103}$ to $L^{105}$ each independently represents a single bond, —CO— or —$SO_2$—.

{Cation Moiety}

In the formulae (b-1), (b-2) and (b-3), $M'^{m+}$ represents an organic cation having a valency of m, preferably a sulfonium cation or an iodonium cation, and most preferably a cation represented by any one of formulae (ca-1) to (ca-4) shown below.

[Chemical formula 29]

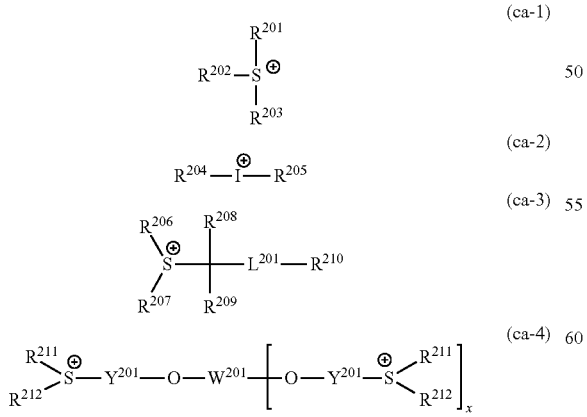

In the formulae (ca-1) to (ca-4), $R^{201}$ to $R^{207}$, $R^{211}$ and $R^{212}$ independently represents an aryl group, an alkyl group, or an alkenyl group, which each may have a substituent, provided that two of $R^{201}$ to $R^{203}$, $R^{206}$ and $R^{207}$, or $R^{211}$ and $R^{212}$ may be mutually bonded to form a ring with the sulfur atom; $R^{208}$ and $R^{209}$ each independently represents a hydrogen atom or an alkyl group having 1 to 5 carbon atoms; $R^{210}$ represents an aryl group which may have a substituent, an alkyl group which may have a substituent, an alkenyl group which may have a substituent or an —$SO_2$— containing cyclic group which may have a substituent; $L^{201}$ represents —C(=O)— or —C(=O)—O—; $Y^{201}$ each independently represents an arylene group, an alkylene group or an alkenylene group; x represents 1 or 2; and $W^{201}$ represents a linking group having a valency of (x+1).

As the aryl group for $R^{201}$ to $R^{207}$, $R^{210}$ and $R^{212}$, an unsubstituted aryl group having 6 to 20 carbon atoms can be mentioned, and a phenyl group or a naphthyl group is preferable.

The alkyl group for $R^{201}$ to $R^{207}$, $R^{211}$ and $R^{212}$ is preferably a chain-like or cyclic alkyl group having 1 to 30 carbon atoms. The alkenyl group for $R^{201}$ to $R^{207}$, $R^{211}$ and $R^{212}$ preferably has 2 to 10 carbon atoms.

Specific examples of the substituent which $R^{201}$ to $R^{207}$ and $R^{210}$ to $R^{212}$ may have include an alkyl group, a halogen atom, a halogenated alkyl group, a carbonyl group, a cyano group, an amino group, an aryl group, an arylthio group and groups represented by formulae (ca-r-1) to (ca-r-7) shown below.

The aryl group within the arylthio group as the substituent is the same as defined for $R^{101}$, and specific examples include a phenylthio group and a biphenylthio group.

[Chemical formula 30]

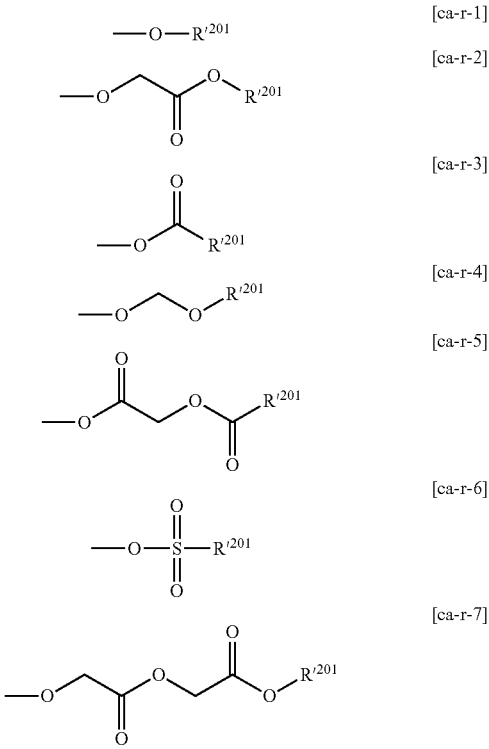

In the formulae (ca-r-1) to (ca-r-7), $R'^{201}$ each independently represents a hydrogen atom, a cyclic group which may have a substituent, a chain-like alkyl group which may have a substituent or a chain-like alkenyl group which may have a substituent.

As the cyclic group which may have a substituent, the chain-like alkyl group which may have a substituent and the chain-like alkenyl group which may have a substituent for $R'^{201}$, the same groups as those described above for $R^{101}$ in the formula (b-1) can be mentioned. As the cyclic group which may have a substituent and chain-like alkyl group which may have a substituent, the same groups as those described above for the acid dissociable group represented by the formula (a1-r-2) can be also mentioned.

When $R^{201}$ to $R^{203}$, $R^{206}$, $R^{207}$, $R^{211}$ and $R^{212}$ are mutually bonded to form a ring with the sulfur atom, these groups may be mutually bonded via a hetero atom such as a sulfur atom, an oxygen atom or a nitrogen atom, or a functional group such as a carbonyl group, —SO—, —SO$_2$—, —SO$_3$—, —COO—, —CONH— or —N(R$_N$)— (wherein R$_N$ represents an alkyl group having 1 to 5 carbon atoms). The ring containing the sulfur atom in the skeleton thereof is preferably a 3 to 10-membered ring, and most preferably a 5 to 7-membered ring. Specific examples of the ring formed include a thiophene ring, a thiazole ring, a benzothiophene ring, a thianthrene ring, a benzothiophene ring, a dibenzothiophene ring, a 9H-thioxanthene ring, a thioxanthone ring, a phenoxathiin ring, a tetrahydrothiophenium ring, and a tetrahydrothiopyranium ring.

$R^{208}$ and $R^{209}$ each independently represents a hydrogen atom or an alkyl group having 1 to 5 carbon atoms, and preferably a hydrogen atom or an alkyl group having 1 to 3 carbon atoms, provided that, in the case of an alkyl group, the groups may be mutually bonded to form a ring.

$R^{210}$ represents an aryl group which may have a substituent, an alkyl group which may have a substituent, an alkenyl group which may have a substituent, or an —SO$_2$— containing cyclic group which may have a substituent.

Examples of the aryl group for $R^{210}$ include an unsubstituted aryl group having 6 to 20 carbon atoms, and a phenyl group or a naphthyl group is preferable.

As the alkyl group for $R^{210}$, a chain-like or cyclic alkyl group having 1 to 30 carbon atoms is preferable.

The alkenyl group for $R^{210}$ preferably has 2 to 10 carbon atoms.

As the —SO$_2$— containing cyclic group for $R^{210}$ which may have a substituent, the same "—SO$_2$— containing cyclic groups" as those described above for Ra$^{21}$ in the general formula (a2-1) can be mentioned, and the group represented by the general formula (a5-r-1) is preferable.

Each $Y^{201}$ independently represents an arylene group, an alkylene group or an alkenylene group.

Examples of the arylene group for $Y^{201}$ include groups in which one hydrogen atom has been removed from an aryl group given as an example of the aromatic hydrocarbon group for $R^{101}$ in the formula (b-1).

The alkylene group and the alkenylene group for $Y^{201}$ are the same as defined for the aliphatic hydrocarbon group as the divalent hydrocarbon group represented by Va$^1$ in the general formula (a1-1).

In the formula (ca-4), x represents 1 or 2.

$W^{201}$ represents a linking group having a valency of (x+1), i.e., a divalent or trivalent linking group.

As the divalent linking group for $W^{201}$, a divalent hydrocarbon group which may have a substituent is preferable, and as examples thereof, the same hydrocarbon groups as those described above for Ya$^{21}$ in the general formula (a2-1) can be mentioned. The divalent linking group for $W^{201}$ may be linear, branched or cyclic, and cyclic is more preferable. Among these, an arylene group having two carbonyl groups, each bonded to the terminal thereof is preferable. Examples of the arylene group include a phenylene group and a naphthylene group, and a phenylene group is particularly desirable.

As the trivalent linking group for $W^{201}$, a group in which one hydrogen atom has been removed from the aforementioned divalent linking group for $W^{201}$ and a group in which the divalent linking group has been bonded to another divalent linking group can be mentioned. The trivalent linking group for $W^{201}$ is preferably a group in which 2 carbonyl groups are bonded to an arylene group.

Specific examples of preferable cations represented by the formula (ca-1) include cations represented by formulae (ca-1-1) to (ca-1-63) shown below.

[Chemical formula 31]

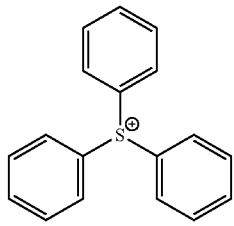

(ca-1-1)

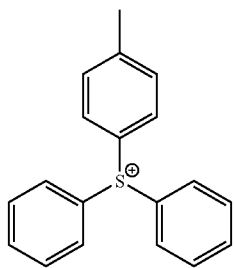

(ca-1-2)

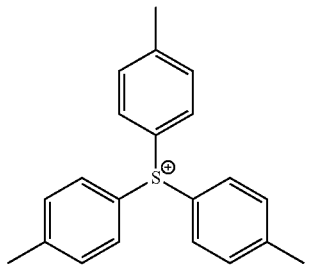

(ca-1-3)

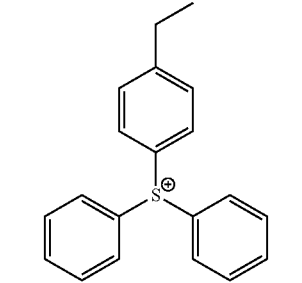

(ca-1-4)

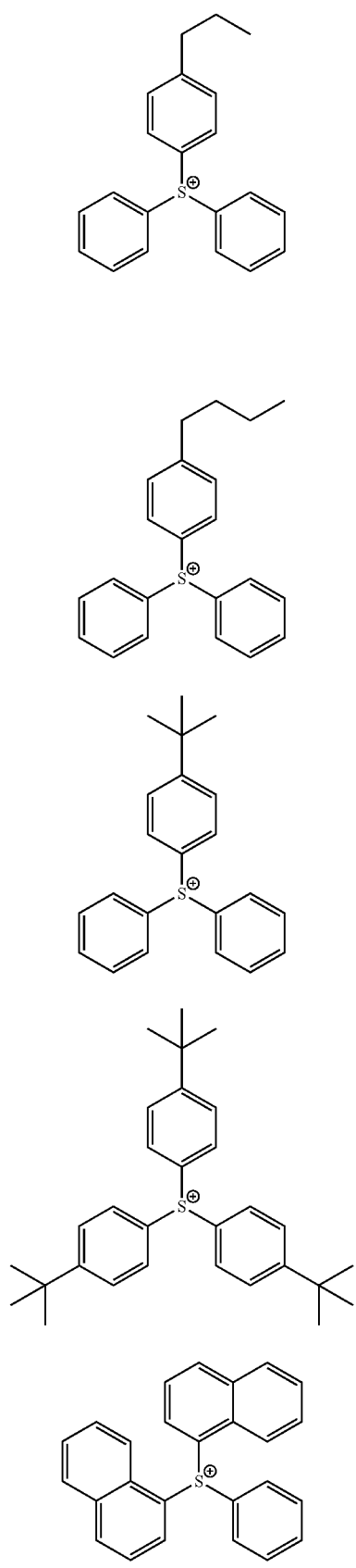
(ca-1-5)
(ca-1-6)
(ca-1-7)
(ca-1-8)
(ca-1-9)
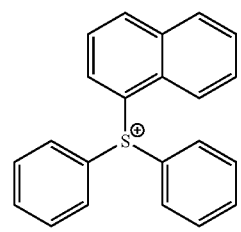
(ca-1-10)
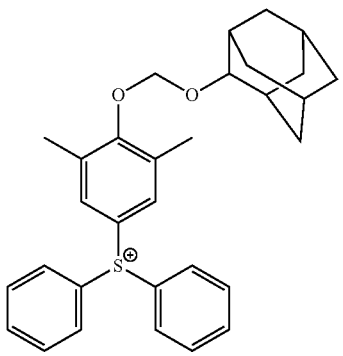
(ca-1-11)
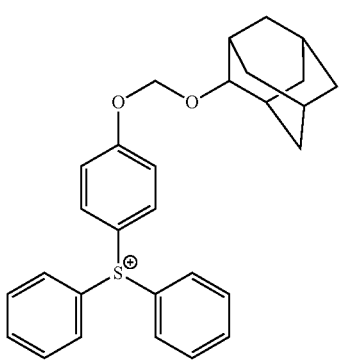
(ca-1-12)
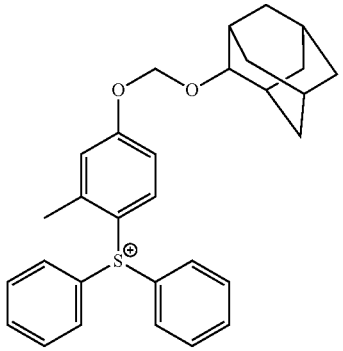
(ca-1-13)
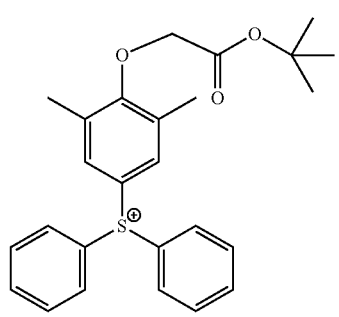
(ca-1-14)

(ca-1-15)
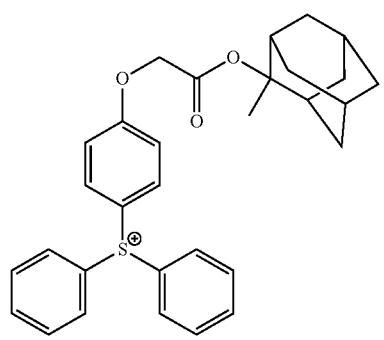
(ca-1-16)
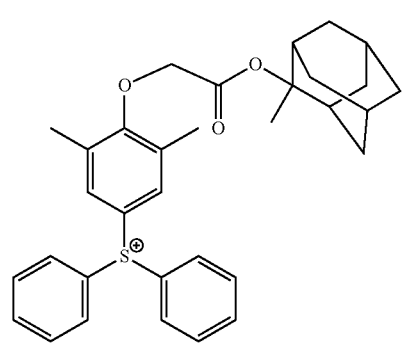
[Chemical formula 32]
(ca-1-17)
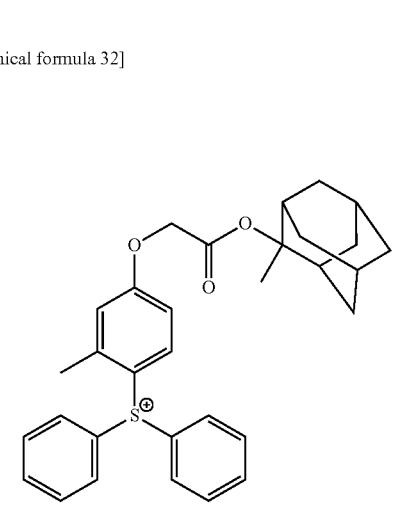
(ca-1-18)
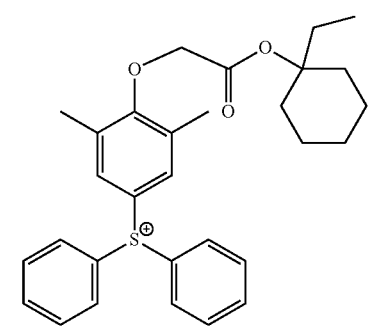
(ca-1-19)
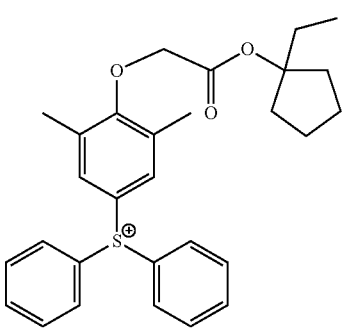
(ca-1-20)
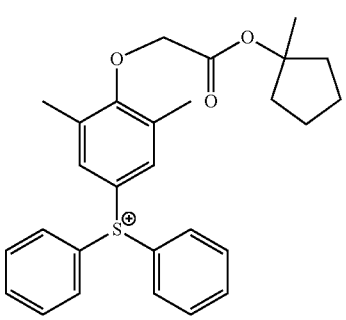
(ca-1-21)
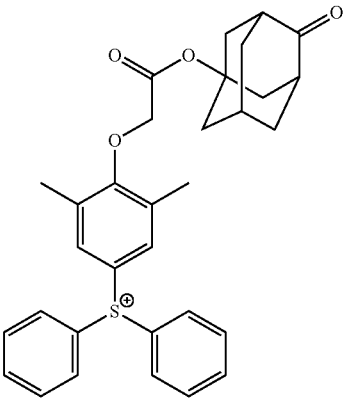
(ca-1-22)
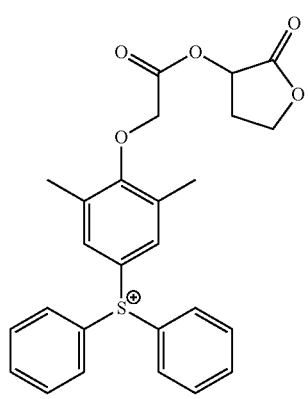

(ca-1-23)
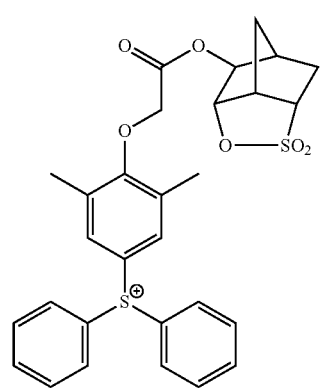
(ca-1-24)
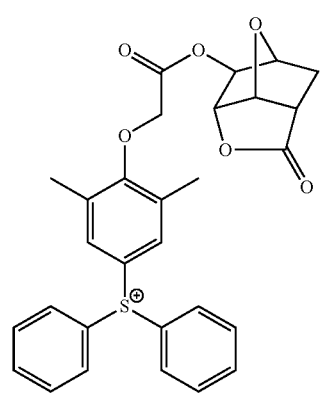
(ca-1-25)
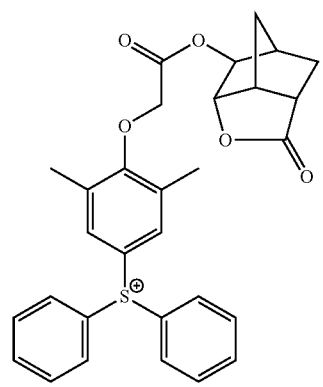
(ca-1-26)
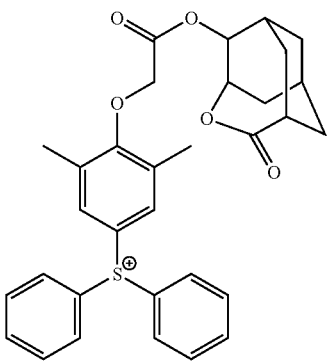
(ca-1-27)
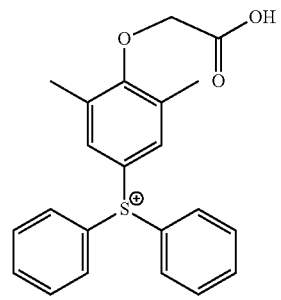
(ca-1-28)
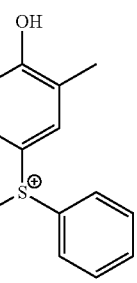
(ca-1-29)
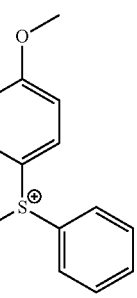
(ca-1-30)
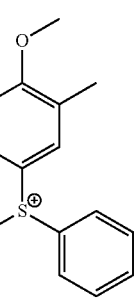
(ca-1-31)
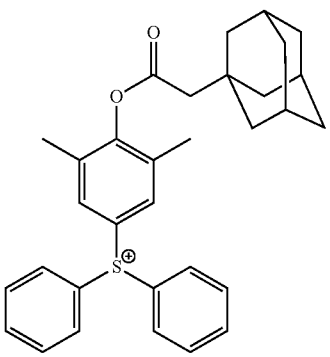

(ca-1-32) 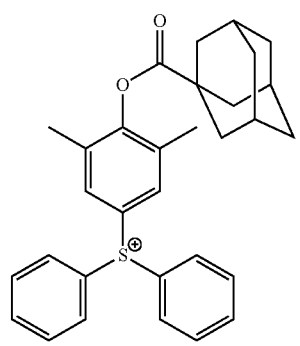
(ca-1-33) 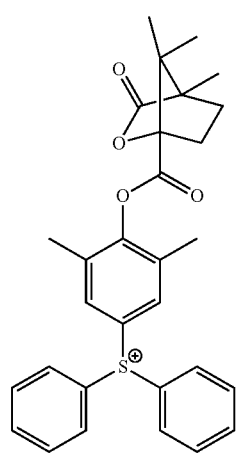
[Chemical formula 33]
(ca-1-34) 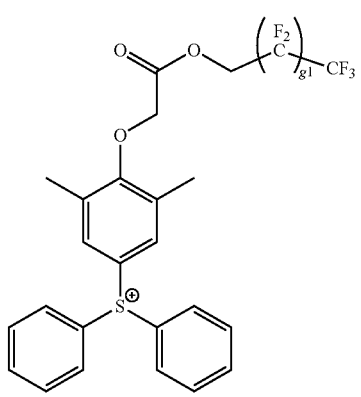
(ca-1-35) 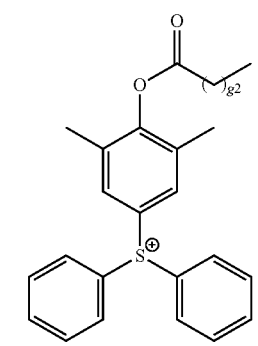
(ca-1-36) 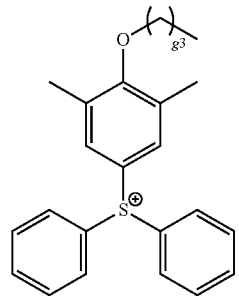
(ca-1-37) 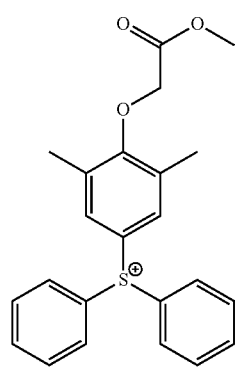
(ca-1-38) 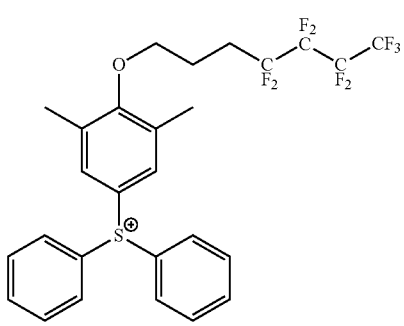
(ca-1-39) 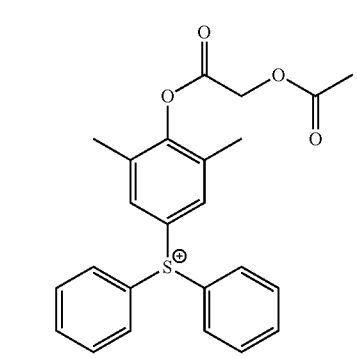

(ca-1-40)
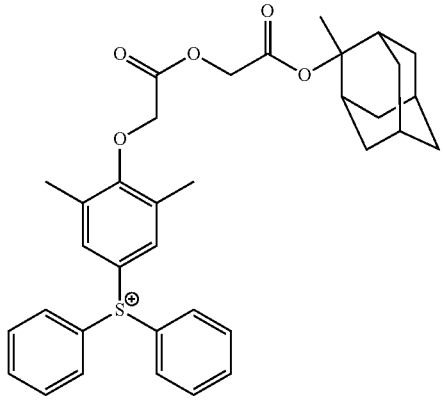
(ca-1-41)
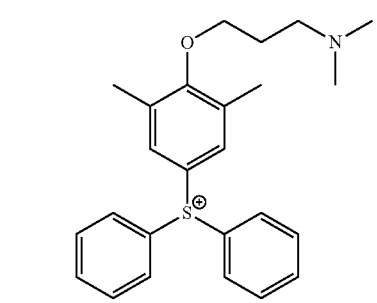
(ca-1-42)
(ca-1-43)
(ca-1-44)
(ca-1-45)
(ca-1-46)
(ca-1-47)
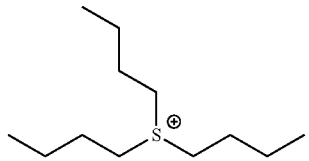
(ca-1-48)
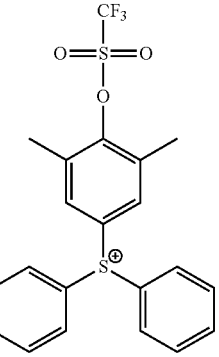
In the formulae (ca-1-34) to (ca-1-36), g1, g2 and g3 represent recurring numbers, wherein g1 is an integer of 1 to 5, g2 is an integer of 0 to 20, and g3 is an integer of 0 to 20.
[Chemical formula 34]
(ca-1-49)
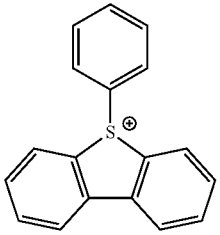
(ca-1-50)
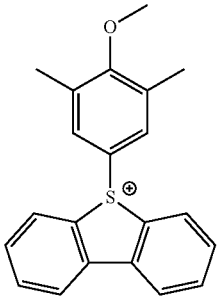
(ca-1-51)
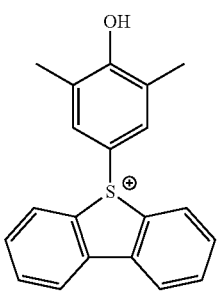

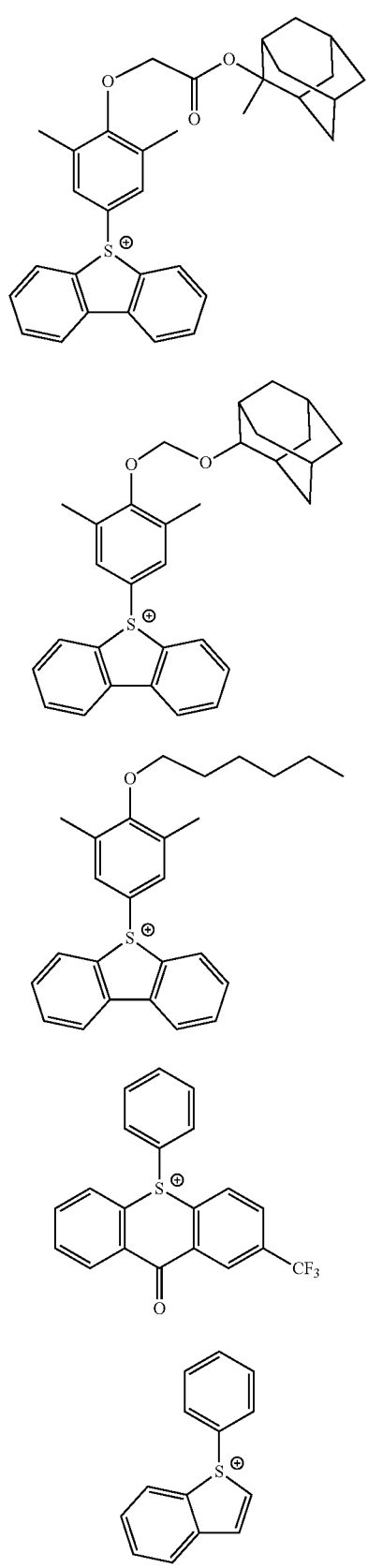
(ca-1-52)
(ca-1-53)
(ca-1-54)
(ca-1-55)
(ca-1-56)
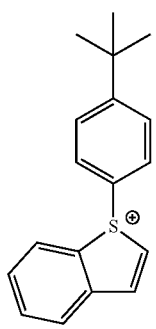
(ca-1-57)
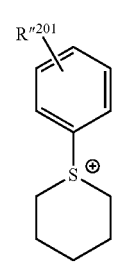
(ca-1-58)
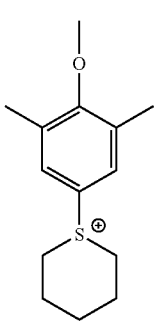
(ca-1-59)
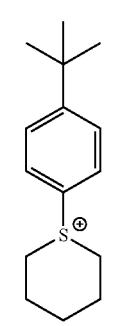
(ca-1-60)
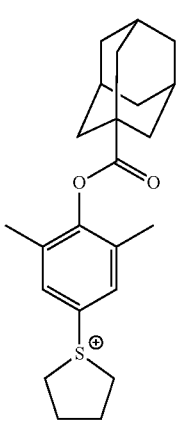
(ca-1-61)

(ca-1-62)

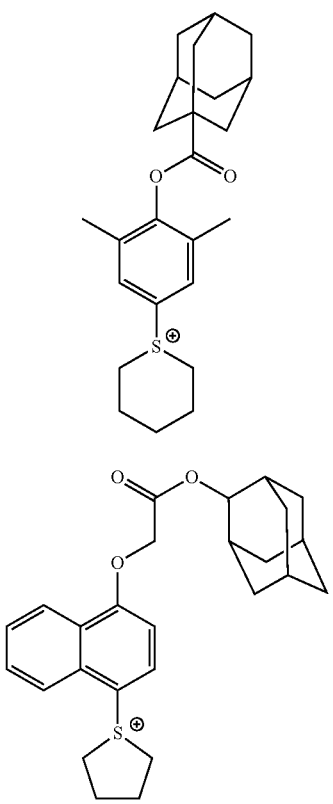

(ca-1-63)

(ca-3-4)

(ca-3-5)

(ca-3-6)

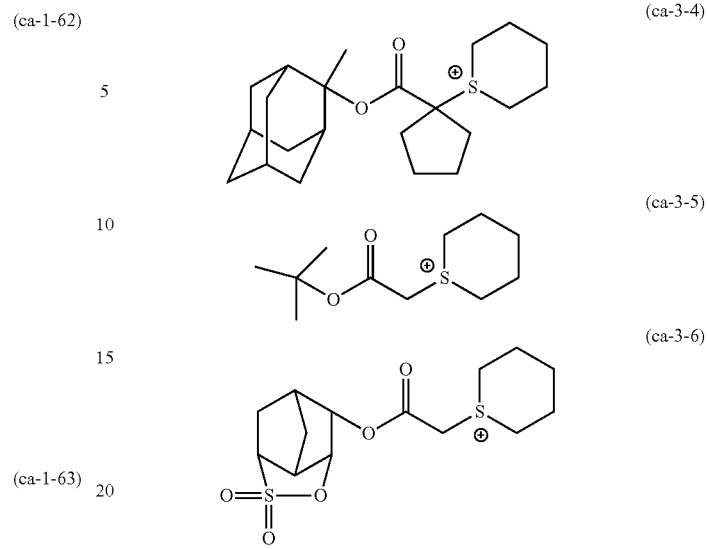

Specific examples of preferable cations represented by the formula (ca-4) include cations represented by formulae (ca-4-1) and (ca-4-2) shown below.

[Chemical formula 36]

(ca-4-1)

(ca-4-2)

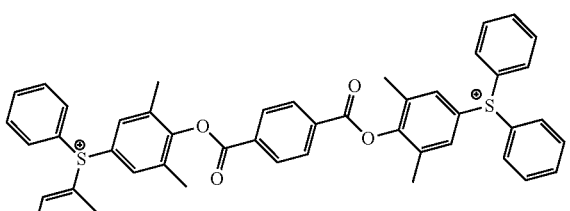

In the formula (ca-1-58), $R''^{201}$ represents a hydrogen atom or a substituent, and as the substituent, the same groups as those described above for substituting $R^{201}$ to $R^{207}$ and $R^{210}$ to $R^{212}$ can be mentioned.

Specific examples of preferable cations represented by the formula (ca-3) include cations represented by formulae (ca-3-1) to (ca-3-6) shown below.

[Chemical formula 35]

(ca-3-1)

(ca-3-2)

(ca-3-3)

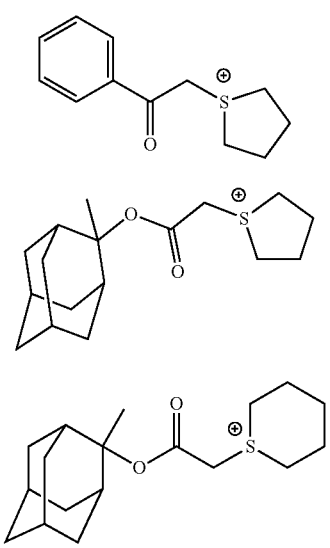

As the component (B), one type of these acid generators may be used alone, or two or more types may be used in combination.

When the resist composition of the present embodiment contains the component (B), the amount of the component (B) relative to 100 parts by weight of the component (A) is preferably 0.5 to 60 parts by weight, more preferably 1 to 50 parts by weight, and still more preferably 1 to 40 parts by weight. When the amount of the component (B) is within the above-mentioned range, formation of a resist pattern can be satisfactorily performed. Further, by virtue of the above-mentioned range, when each of the components are dissolved in an organic solvent, a uniform solution can be obtained and the storage stability becomes satisfactory.

<Basic Compound Component; Component (D)>

Moreover, in the present embodiment, the resist composition may include an acid diffusion control agent component (hereafter, frequently referred to as "component (D)"), in addition to the component (A), or in addition to the component (A) and the component (B).

The component (D) functions as an acid diffusion control agent, i.e., a quencher which traps the acid generated from the component (B) and the like upon exposure.

In the present embodiment, the component (D) may be a photodecomposable base (D1) (hereafter, referred to as "component (D1)") which is decomposed upon exposure and then loses the ability of controlling of acid diffusion, or a nitrogen-containing organic compound (D2) (hereafter, referred to as "component (D2)") which does not fall under the definition of component (D1).

[Component (D1)]

When a resist pattern is formed using a resist composition containing the component (D1), the contrast between exposed portions and unexposed portions is improved.

The component (D1) is not particularly limited, as long as it is decomposed upon exposure and then loses the ability of controlling of acid diffusion. As the component (D1), at least one compound selected from the group consisting of a compound represented by general formula (d1-1) shown below (hereafter, referred to as "component (d1-1)"), a compound represented by general formula (d1-2) shown below (hereafter, referred to as "component (d1-2)") and a compound represented by general formula (d1-3) shown below (hereafter, referred to as "component (d1-3)") is preferably used.

At exposed portions, the components (d1-1) to (d1-3) are decomposed and then lose the ability of controlling of acid diffusion (i.e., basicity), and therefore the components (d1-1) to (d1-3) cannot function as a quencher, whereas at unexposed portions, the components (d1-1) to (d1-3) function as a quencher.

[Chemical formula 37]

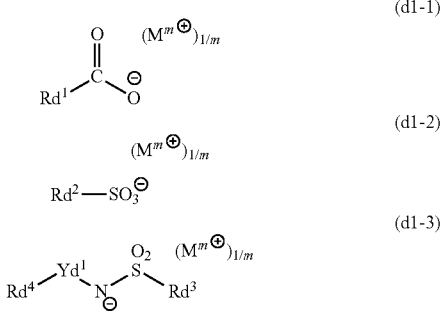

In the formulae, $Rd^1$ to $Rd^4$ represent a cyclic group which may have a substituent, a chain-like alkyl group which may have a substituent or a chain-like alkenyl group which may have a substituent, provided that, the carbon atom adjacent to the sulfur atom within the $Rd^2$ in the formula (d1-2) has no fluorine atom bonded thereto; $Yd^1$ represents a single bond or a divalent linking group; and $M^{m+}$ each independently represents an organic cation having a valency of m.

{Component (d1-1)}

Anion Moiety

In the formula (d1-1), $Rd^1$ represents a cyclic group which may have a substituent, a chain-like alkyl group which may have a substituent or a chain-like alkenyl group which may have a substituent, and is the same groups as those defined above for $R^{101}$.

Among these, as the group for $Rd^1$, an aromatic hydrocarbon group which may have a substituent, an aliphatic cyclic group which may have a substituent and a chain-like hydrocarbon group which may have a substituent are preferable. As the substituents which these groups may have, a hydroxy group, a fluorine atom or a fluorinated alkyl group is preferable.

The aromatic hydrocarbon group is preferably a phenyl group or a naphthyl group.

Examples of the aliphatic cyclic group include groups in which one or more hydrogen atoms have been removed from a polycycloalkane such as adamantane, norbornane, isobornane, tricyclodecane or tetracyclododecane.

As the chain-like hydrocarbon group, a chain-like alkyl group is preferable. The chain-like alkyl group preferably has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl or a decyl group, and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group or a 4-methylpentyl group.

In the case where the chain-like alkyl group is a fluorinated alkyl group having a fluorine atom or a fluorinated alkyl group as a substituent, the fluorinated alkyl group preferably has 1 to 11 carbon atoms, more preferably 1 to 8 carbon atoms, and still more preferably 1 to 4 carbon atoms. The fluorinated alkyl group may contain an atom other than fluorine. Examples of the atom other than a fluorine atom include an oxygen atom, a carbon atom, a hydrogen atom, a sulfur atom and a nitrogen atom.

As $Rd^1$, a fluorinated alkyl group in which part or all of the hydrogen atoms constituting a linear alkyl group have been substituted with fluorine atom(s) is preferable, and a fluorinated alkyl group in which all of the hydrogen atoms constituting a linear alkyl group have been substituted with fluorine atoms (i.e., a linear perfluoroalkyl group) is more preferable.

Specific examples of preferable anion moieties for the component (d1-1) are shown below.

[Chemical formula 38]

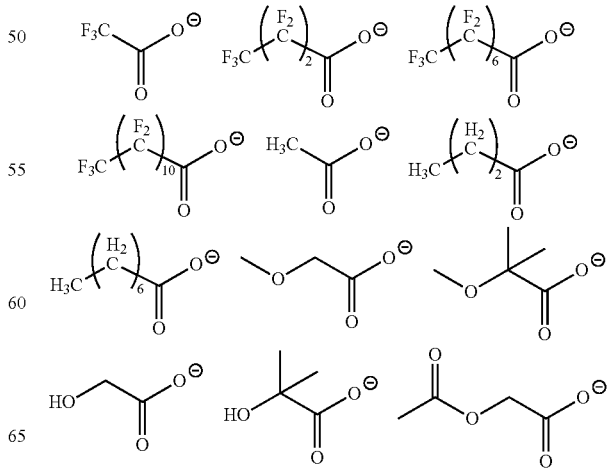

-continued

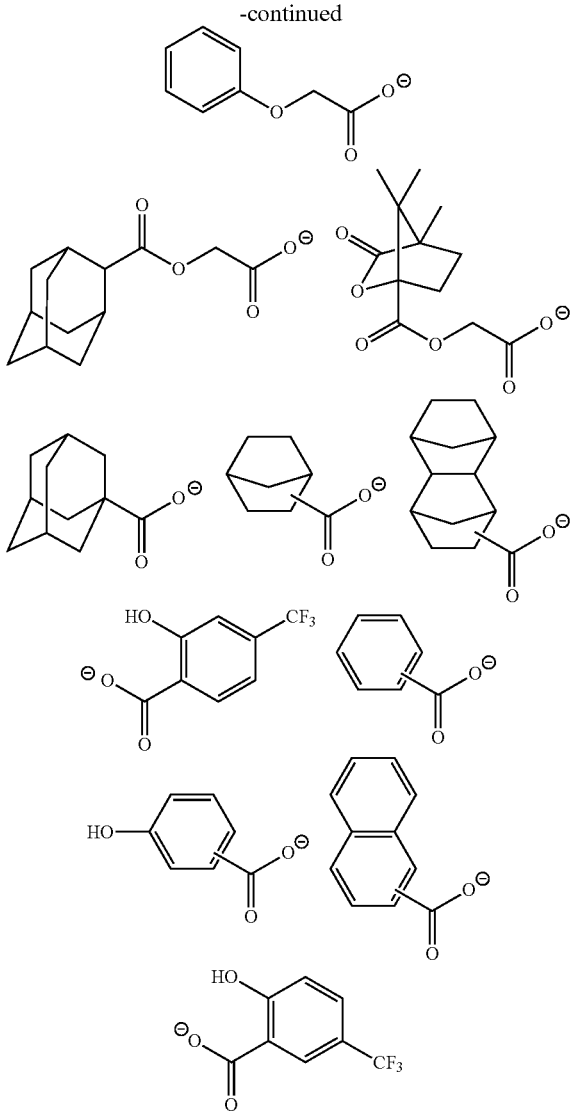

Cation Moiety

In the formula (d1-1), M⁺ represents an organic cation having a valency of m.

The organic cation for $M^{m+}$ is not particularly limited, and examples thereof include the same cation moieties as those represented by the formulae (ca-1) to (ca-4), and cation moieties represented by the formulae (ca-1-1) to (ca-1-63) are preferable.

As the component (d1-1), one type of compound may be used, or two or more types of compounds may be used in combination.

{Component (d1-2)}

Anion Moiety

In the formula (d1-2), $Rd^2$ represents a cyclic group which may have a substituent, a chain-like alkyl group which may have a substituent or a chain-like alkenyl group which may have a substituent, and is the same groups as those defined above for $R^{101}$.

The carbon atom adjacent to the sulfur atom within $Rd^2$ group has no fluorine atom bonded thereto (i.e., the carbon atom adjacent to the sulfur atom within $Rd^2$ group does not substituted with a fluorine atom). As a result, the anion of the component (d1-2) becomes an appropriately weak acid anion, thereby improving the quenching ability of the component (D).

As $Rd^2$, an aliphatic cyclic group which may have a substituent is preferable, and a group in which one or more hydrogen atoms have been removed from adamantane, norbornane, isobornane, tricyclodecane, tetracyclododecane or a group in which one or more hydrogen atoms have been removed from camphor or the like (which may have a substituent) is more preferable.

The hydrocarbon group for $Rd^2$ may have a substituent.

As the substituent, the same groups as those described above for substituting the hydrocarbon group (e.g., aromatic hydrocarbon group, aliphatic hydrocarbon group) for $Rd^1$ in the formula (d1-1) can be mentioned.

Specific examples of preferable anion moieties for the component (d1-2) are shown below.

[Chemical formula 39]

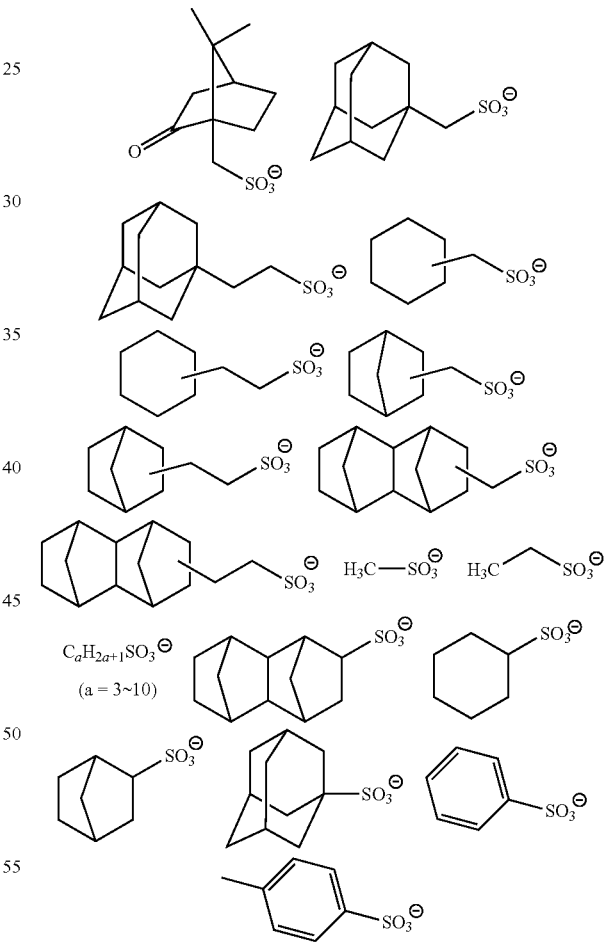

Cation Moiety

In the formula (d1-2), $M^{m+}$ is an organic cation having a valency of m, and is the same as defined for $M^{m+}$ in the formula (d1-1).

As the component (d1-2), one type of compound may be used, or two or more types of compounds may be used in combination.

{Component (d1-3)}
Anion Moiety

In the formula (d1-3), $Rd^3$ represents a cyclic group which may have a substituent, a chain-like alkyl group which may have a substituent or a chain-like alkenyl group which may have a substituent, and is the same groups as those defined above for $R^{101}$, and a cyclic group containing a fluorine atom, a chain-like alkyl group or a chain-like alkenyl group is preferable. Among these, a fluorinated alkyl group is preferable, and the same fluorinated alkyl groups as those described above for $Rd^1$ are more preferable.

In the formula (d1-3), $Rd^4$ represents a cyclic group which may have a substituent, a chain-like alkyl group which may have a substituent or a chain-like alkenyl group which may have a substituent, and is the same groups as those defined above for $R^{101}$.

Among these, an alkyl group which may have substituent, an alkoxy group which may have substituent, an alkenyl group which may have substituent or a cyclic group which may have substituent is preferable.

The alkyl group for $Rd^4$ is preferably a linear or branched alkyl group having 1 to 5 carbon atoms, and specific examples include a methyl group, an ethyl group, a propyl group, an isopropyl group, an n-butyl group, an isobutyl group, a tert-butyl group, a pentyl group, an isopentyl group, and a neopentyl group. Part of the hydrogen atoms within the alkyl group for $Rd^4$ may be substituted with a hydroxy group, a cyano group or the like.

The alkoxy group for $Rd^4$ is preferably an alkoxy group having 1 to 5 carbon atoms, and specific examples thereof include a methoxy group, an ethoxy group, an n-propoxy group, an iso-propoxy group, an n-butoxy group and a tert-butoxy group. Among these, a methoxy group and an ethoxy group are preferable.

As the alkenyl group for $Rd^4$, the same groups as those described above for $R^{101}$ can be mentioned, and a vinyl group, a propenyl group (an allyl group), a 1-methylpropenyl group and a 2-methylpropenyl group are preferable. These groups may have an alkyl group having 1 to 5 carbon atoms or a halogenated alkyl group having 1 to 5 carbon atoms as a substituent.

As the cyclic group for $Rd^4$, the same groups as those described above for $R^{101}$ can be mentioned. Among these, as the cyclic group, an alicyclic group (e.g., a group in which one or more hydrogen atoms have been removed from a cycloalkane such as cyclopentane, cyclohexane, adamantane, norbornane, isobornane, tricyclodecane or tetracyclododecane) or an aromatic group (e.g., a phenyl group or a naphthyl group) is preferable. When $Rd^4$ is an alicyclic group, the resist composition can be satisfactorily dissolved in an organic solvent, thereby improving the lithography properties. Alternatively, when $Rd^4$ is an aromatic group, the resist composition exhibits an excellent photoabsorption efficiency in a lithography process using EUV or the like as the exposure source, thereby resulting in the improvement of the sensitivity and the lithography properties.

In the formula (d1-3), Yd' represents a single bond or a divalent linking group.

The divalent linking group for $Yd^1$ is not particularly limited, and examples thereof include a divalent hydrocarbon group (aliphatic hydrocarbon group, or aromatic hydrocarbon group) which may have a substituent and a divalent linking group containing a hetero atom. As such groups, the same divalent linking groups as those described above for $Ya^{21}$ in the formula (a2-1) can be mentioned.

As $Yd^1$, a carbonyl group, an ester bond, an amide bond, an alkylene group or a combination of these is preferable. As the alkylene group, a linear or branched alkylene group is more preferable, and a methylene group or an ethylene group is still more preferable.

Specific examples of preferable anion moieties for the component (d1-3) are shown below.

[Chemical formula 40]

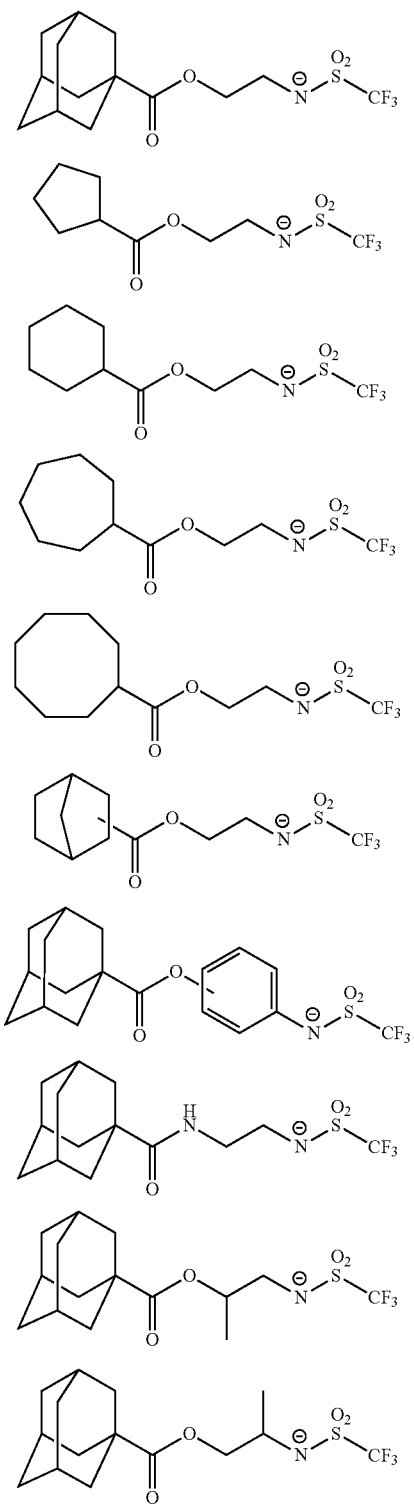

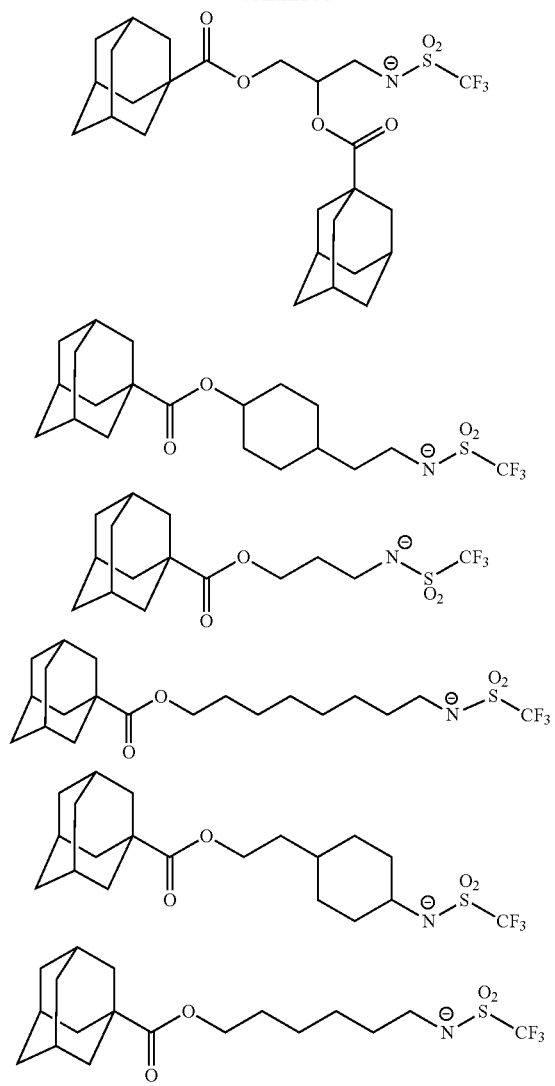

[Chemical Formula 41]

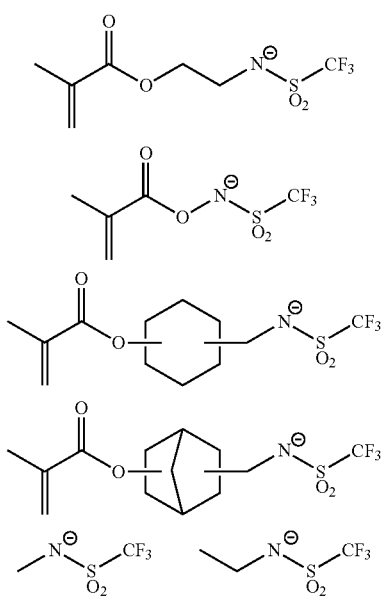

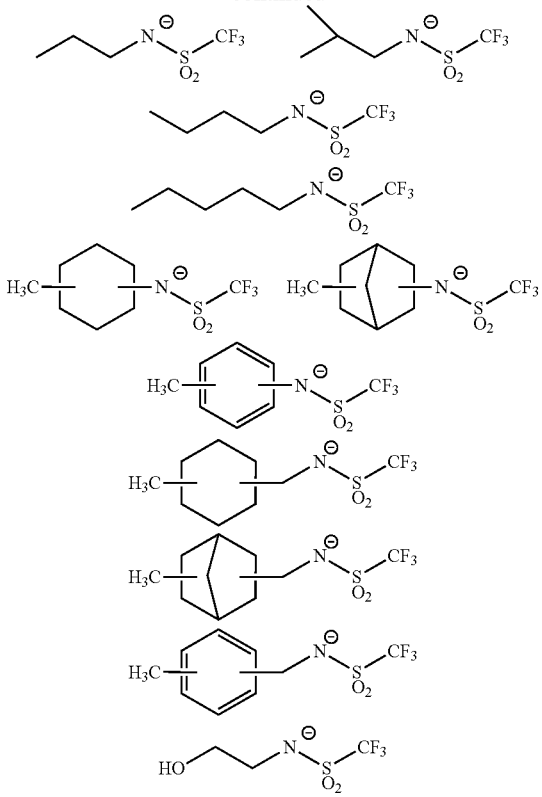

Cation Moiety

In the formula (d1-3), $M^{m+}$ is an organic cation having a valency of m, and is the same as defined for $M^{m+}$ in the formula (d1-1).

As the component (d1-3), one type of compound may be used, or two or more types of compounds may be used in combination.

As the component (D1), one type of the components (d1-1) to (d1-3), or at least two types of the components (d1-1) to (d1-3) can be used in combination.

The amount of the component (D1) relative to 100 parts by weight of the component (A) is preferably 0.5 to 10.0 parts by weight, more preferably 0.5 to 8.0 parts by weight, and still more preferably 1 to 8 parts by weight.

When the amount of the component (D1) is not less than the lower limit of the above-mentioned range, excellent lithography properties and excellent resist pattern shape can be obtained. On the other hand, when the amount of the component (D1) is not more than the upper limit of the above-mentioned range, sensitivity can be maintained at a satisfactory level, and through-put becomes excellent.

The production methods of the components (d1-1) and (d1-2) are not particularly limited, and the components (d1-1) and (d1-2) can be produced by conventional methods.

The amount of the component (D1) relative to 100 parts by weight of the component (A) is preferably 0.5 to 10.0 parts by weight, more preferably 0.5 to 8.0 parts by weight, and still more preferably 1.0 to 8.0 parts by weight. When the amount of the component (D1) is not less than the lower limit of the above-mentioned range, excellent lithography properties and excellent resist pattern shape can be obtained. On the other hand, when the amount of the component (D) is not more than the upper limit of the above-mentioned range, sensitivity can be maintained at a satisfactory level, and through-put becomes excellent.

(Component (D2))

The component (D) may contain a nitrogen-containing organic compound (D2) (hereafter, referred to as component (D2)) which does not fall under the definition of component (D1).

The component (D2) is not particularly limited, as long as it functions as an acid diffusion control agent, and does not fall under the definition of the component (D1). As the component (D2), any of the conventionally known compounds may be selected for use. Among these, an aliphatic amine, particularly a secondary aliphatic amine or tertiary aliphatic amine is preferable.

An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of not more than 12 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, and tri-n-octanolamine. Among these, trialkylamines of 5 to 10 carbon atoms are preferable, and tri-n-pentylamine and tri-n-octylamine are particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl] amine and triethanolamine triacetate, and triethanolamine triacetate is preferable.

Further, as the component (D2), an aromatic amine may be used.

Examples of aromatic amines include aniline, pyridine, 4-dimethylaminopyridine, pyrrole, indole, pyrazole, imidazole and derivatives thereof, as well as diphenylamine, triphenylamine, tribenzylamine, 2,6-diisopropylaniline and N-tert-butoxycarbonylpyrrolidine.

As the component (D2), one type of compound may be used alone, or two or more types may be used in combination.

The component (D2) is typically used in an amount of 0.01 to 5.0 parts by weight, relative to 100 parts by weight of the component (A). When the amount of the component (D) is within the above-mentioned range, the shape of the resist pattern and the post exposure stability of the latent image formed by the pattern-wise exposure of the resist layer are improved.

As the component (D), one type of compound may be used, or two or more types of compounds may be used in combination.

In the present embodiment, when the resist composition contains the component (D), the amount of the component (D) relative to 100 parts by weight of the component (A) is preferably 0.1 to 15 parts by weight, more preferably 0.3 to 12 parts by weight, and still more preferably 0.5 to 12 parts by weight. When the amount of the component (D) is not less than the lower limit of the above-mentioned range, various lithography properties (such as LWR) of the resist composition are improved. Further, a resist pattern having an excellent shape can be obtained. On the other hand, when the amount of the component (D) is not more than the upper limit of the above-mentioned range, sensitivity can be maintained at a satisfactory level, and through-put becomes excellent.

[Specific Compound (E)]

In the present embodiment, in the resist composition, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or an oxo acid of phosphorus or a derivative thereof can be added.

Examples of suitable organic carboxylic acids include acetic acid, malonic acid, citric acid, malic acid, succinic acid, benzoic acid, and salicylic acid.

Examples of the oxo acid of phosphorus include phosphoric acid, phosphonic acid and phosphinic acid. Among these, phosphonic acid is particularly desirable.

Examples of the derivatives of the oxo acid of phosphorus include esters in which a hydrogen atom within the above-mentioned oxo acids is substituted with a hydrocarbon group. Examples of the hydrocarbon group include an alkyl group having 1 to 5 carbon atoms and an aryl group having 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethylphosphonate, di-n-butyl phosphonate, phenylphosphonic acid, diphenyl phosphonate and dibenzyl phosphonate.

Examples of phosphinic acid derivatives include phosphinic acid esters and phenylphosphinic acid.

As the component (E), one type may be used alone, or two or more types may be used in combination.

The component (E) is typically used in an amount of 0.01 to 5.0 parts by weight, relative to 100 parts by weight of the component (A).

[Component (F)]

In the present embodiment, the resist composition of the present embodiment may contain a fluorine additive (hereafter, referred to as "component (F)") for imparting water repellency to the resist film.

As the component (F), for example, a fluorine-containing polymeric compound described in Japanese Unexamined Patent Application, First Publication No. 2010-002870, Japanese Unexamined Patent Application, First Publication No. 2010-032994, Japanese Unexamined Patent Application, First Publication No. 2010-277043, Japanese Unexamined Patent Application, First Publication No. 2011-13569, and Japanese Unexamined Patent Application, First Publication No. 2011-128226 can be used.

Specific examples of the component (F) include polymers having a structural unit (f1) represented by general formula (f1-1) shown below. As the polymer, a polymer (homopolymer) consisting of a structural unit (f1) represented by formula (f1-1) shown below; a copolymer of a structural unit (f1) represented by formula (f1-1) shown below and the structural unit (a1); and a copolymer of a structural unit (f1) represented by formula (f1-1) shown below, a structural unit derived from acrylic acid or methacrylic acid and the structural unit (a1) are preferable. As the structural unit (a1) to be copolymerized with a structural unit (f1) represented by formula (f1-1) shown below, a structural unit derived from 1-ethyl-1-cyclooctyl (meth)acrylate or a structural unit represented by the formula (a1-2-01) is preferable.

[Chemical formula 42]

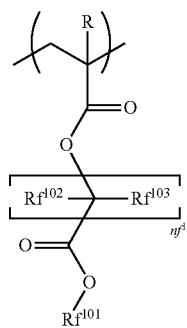

(f1-1)

In the formula (f1-1), R represents a hydrogen atom, an alkyl group of 1 to 5 carbon atoms, or a halogenated alkyl group of 1 to 5 carbon atoms; $Rf^{102}$ and $Rf^{103}$ each independently represents a hydrogen atom, a halogen atom, an alkyl group having 1 to 5 carbon atoms, or a halogenated alkyl group having 1 to 5 carbon atoms, provided that $Rf^{102}$ and $Rf^{103}$ may be the same or different; $nf^1$ represents an integer of 1 to 5; and $Rf^{101}$ represents an organic group containing a fluorine atom.

In the formula (f1-1), R is the same as defined above. As R, a hydrogen atom or a methyl group is preferable.

In the formula (f1-1), examples of the halogen atom for $Rf^{102}$ and $Rf^{103}$ include a fluorine atom, a chlorine atom, a bromine atom and an iodine atom, and a fluorine atom is particularly desirable. Examples of the alkyl group having 1 to 5 carbon atoms for $Rf^{102}$ and $Rf^{103}$ include the same alkyl group having 1 to 5 carbon atoms as those described above for R, and a methyl group or an ethyl group is preferable. Specific examples of the halogenated alkyl group having 1 to 5 carbon atoms represented by $Rf^{102}$ or $Rf^{103}$ include groups in which part or all of the hydrogen atoms of the aforementioned alkyl groups having 1 to 5 carbon atoms have been substituted with halogen atoms. Examples of the halogen atom include a fluorine atom, a chlorine atom, a bromine atom and an iodine atom, and a fluorine atom is particularly desirable. Among these, as $Rf^{102}$ and $Rf^{103}$, a hydrogen atom, a fluorine atom or an alkyl group having 1 to 5 carbon atoms is preferable, and a hydrogen atom, a fluorine atom, a methyl group or an ethyl group is more preferable.

In the formula (f1-1), $nf^1$ represents an integer of 1 to 5, preferably an integer of 1 to 3, and more preferably 1 or 2.

In the formula (f1-1), $Rf^{101}$ represents an organic group containing a fluorine atom, and is preferably a hydrocarbon group containing a fluorine atom.

The hydrocarbon group containing a fluorine atom may be linear, branched or cyclic, and preferably has 1 to 20 carbon atoms, more preferably 1 to 15 carbon atoms, and most preferably 1 to 10 carbon atoms.

It is preferable that the hydrocarbon group having a fluorine atom has 25% or more of the hydrogen atoms within the hydrocarbon group fluorinated, more preferably 50% or more, and most preferably 60% or more, as the hydrophobicity of the resist film during immersion exposure is enhanced.

Among these, as $Rf^{101}$, a fluorinated hydrocarbon group having 1 to 5 carbon atoms is preferable, and a methyl group, $—CH_2—CF_3$, $—CH_2—CF_2—CF_3$, $—CH(CF_3)_2$, $—CH_2—CH_2—CF_3$, and $—CH_2—CH_2—CF_2—CF_2—CF_2—CF_3$ are most preferable.

The weight average molecular weight (Mw) (the polystyrene equivalent value determined by gel permeation chromatography) of the component (F) is preferably 1,000 to 50,000, more preferably 5,000 to 40,000, and most preferably 10,000 to 30,000. When the weight average molecular weight is not more than the upper limit of the above-mentioned range, the resist composition exhibits a satisfactory solubility in a resist solvent. On the other hand, when the weight average molecular weight is not less than the lower limit of the above-mentioned range, dry etching resistance and the cross-sectional shape of the resist pattern become satisfactory.

Further, the dispersity (Mw/Mn) of the component (F) is preferably 1.0 to 5.0, more preferably 1.0 to 3.0, and most preferably 1.2 to 2.5.

As the component (F), one type may be used alone, or two or more types may be used in combination.

The component (F) is generally used in an amount of 0.5 to 10 parts by weight, relative to 100 parts by weight of the component (A).

In the present embodiment, if desired, other miscible additives can also be added to the resist composition. Examples of such miscible additives include additive resins for improving the performance of the resist film, dissolution inhibitors, plasticizers, stabilizers, colorants, halation prevention agents, and dyes.

[Component (S)]

In the present embodiment, the resist composition can be prepared by dissolving the materials for the resist composition in an organic solvent (hereafter, frequently referred to as "component (S)").

The component (S) may be any organic solvent which can dissolve the respective components to give a uniform solution, and one or more kinds of any organic solvent can be appropriately selected from those which have been conventionally known as solvents for a chemically amplified resist.

Examples thereof include lactones such as γ-butyrolactone; ketones such as acetone, methyl ethyl ketone (MEK), cyclohexanone, methyl-n-pentyl ketone (2-heptanone) and methyl isopentyl ketone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene; and dimethylsulfoxide (DMSO).

These solvents can be used individually, or in combination as a mixed solvent.

Among these, PGMEA, PGME, γ-butyrolactone and EL are preferable.

Further, among the mixed solvents, a mixed solvent obtained by mixing PGMEA with a polar solvent is preferable.

The mixing ratio (weight ratio) of the mixed solvent can be appropriately determined, taking into consideration the compatibility of the PGMEA with the polar solvent, but is preferably 1:9 to 9:1, more preferably 2:8 to 8:2.

Specifically, when EL or cyclohexanone is mixed as the polar solvent, the PGMEA:EL or cyclohexanone weight ratio is preferably 1:9 to 9:1, and more preferably 2:8 to 8:2. Alternatively, when PGME is mixed as the polar solvent, the PGMEA:PGME weight ratio is preferably 1:9 to 9:1, more preferably 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably 70:30 to 95:5.

The amount of the component (S) is not particularly limited, and is appropriately adjusted to a concentration which enables coating of a coating solution to a substrate In general, the organic solvent is used in an amount such that the solid content of the resist composition is 1 to 20% by weight, and preferably 2 to 15% by weight.

Solution Including Acid or Thermal Acid Generator

The solution including an acid or a thermal acid generator used in the embodiment is described. Examples of the solution including an acid or a thermal acid generator include solutions in which an acid or a thermal acid generator (hereinafter, these are referred to as "acid component") and the base component are dissolved in a solvent.

Acid (Acid Component (T0))

In the embodiment, the "acid" itself has acidity and acts as a proton donor (hereinafter, referred to as "acid component (T0)"). Examples of the component (T0) include acids in which salts are not formed.

Examples of the component (T0) include acid components such as a fluorinated alkyl group-containing carboxylic acid, a higher fatty acid, a higher alkyl sulfonic acid, a higher alkyl aryl sulfonic acid, and a camphor sulfonic acid.

Examples of the fluorinated alkyl group-containing carboxylic acid include $C_{10}F_{21}COOH$.

Examples of the higher fatty acid include a higher fatty acid having an alkyl group having 8 to 20 carbon atoms, and specifically, a dodecanoic acid, a tetradecanoic acid, and a stearic acid are exemplified.

The alkyl group having 8 to 20 carbon atoms may be linear or branched, a phenylene group or an oxygen atom may be interposed in the chain, and a hydrogen atom in the alkyl group may be partially substituted with a hydroxyl group or a carboxy group.

Examples of the higher alkyl sulfonic acid include a sulfonic acid having an alkyl group whose average carbon number is preferably 9 to 21 and more preferably 12 to 18, and specifically, a decane sulfonic acid, a dodecane sulfonic acid, a tetradecane sulfonic acid, a pentadecane sulfonic acid, and a stearic acid sulfonic acid are exemplified.

Examples of the higher alkyl aryl sulfonic acid include an alkyl benzene sulfonic acid and an alkyl naphthalene sulfonic acid having an alkyl group, whose average carbon number is preferably 6 to 18 and more preferably 9 to 15, and specifically, a dodecyl benzene sulfonic acid and a decyl naphthalene sulfonic acid are exemplified.

Examples of other acid components include an alkyl diphenyl ether disulfonic acid having an alkyl group whose average carbon number is preferably 6 to 18 and more preferably 9 to 15, and specifically, a dodecyl diphenyl ether disulfonic acid is exemplified.

Thermal Acid Generator (Acid Component (T1))

The thermal acid generator (hereinafter, referred to as "acid component (T1)") is a component which generates an acid by heating. As the thermal acid generator component which generates an acid by heating, many types of thermal acid generators have been known, for example, an onium salt-based acid generator including an iodonium salt and a sulfonium salt; an oxime sulfonate-based acid generator; bisalkyl or bisaryl sulfonyl diazomethanes; a diazomethane-based acid generator including poly(bissulfonyl)diazomethanes; a nitrobenzylsulfonate-based acid generator; an iminosulfonate-based acid generator; and a disulfone-based acid generator. These acid generators are also known as a photoacid generator, but functions as a thermal acid generator as well. Thus, as the acid generator component which can be used in the embodiment, an arbitrary component selected from the components conventionally known as an acid generator for a chemically amplified resist composition in the related art can be used.

Among these, as the acid component (T1), compounds represented by any one of the following general formulae (T1-1) to (T1-3) are preferable.

[Chemical formula 43]

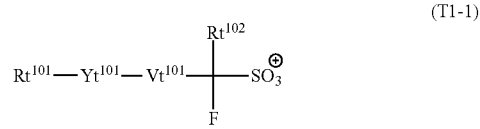

(T1-1)

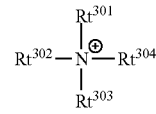

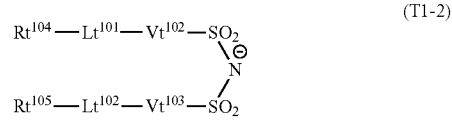

(T1-2)

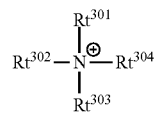

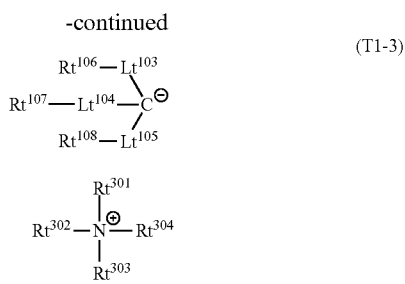

In general formulae (T1-1) to (T1-3), $Rt^{101}$ and $Rt^{104}$ to $Rt^{108}$ each independently represent a cyclic group which may have a substituent, a chin-like alkyl group which may have a substituent, or a chain-like alkenyl group which may have a substituent. $Rt^{104}$ and $Rt^{105}$ may be bonded to each other to form a ring. Any two of $Rt^{106}$ to $Rt^{107}$ may be bonded to each other to form a ring. $Rt^{102}$ represents a fluorine atom or a fluorinated alkyl group having 1 to 5 carbon atoms. $Yt^{101}$ represents a single bond or a divalent linking group including an oxygen atom. $Vt^{101}$ to $Vt^{103}$ each independently represent a single bond, an alkylene group, or a fluorinated alkylene group. $Lt^{101}$ and $Lt^{102}$ each independently represent a single bond or an oxygen atom. $Lt^{103}$ to $Lt^{105}$ each independently represent a single bond, —CO—, or —SO$_2$—. $Rt^{301}$ to $Rt^{304}$ each independently represent a hydrogen atom, or a linear, branched or cyclic fluorinated alkyl group having 1 to 12 carbon atoms. $Rt^{301}$ to $Rt^{303}$ may be bonded to each other to form a ring with a nitrogen atom in the formula.

Anion Moiety

Anion Moiety of Component (T1-1)

In general formula (T1-1), $Rt^{101}$ represents a cyclic group which may have a substituent, a chain-like alkyl group which may have a substituent, or a chain-like alkenyl group which may have a substituent.

In general formula (T1-1), the description for $Rt^{101}$ is the same as the description for $R^{101}$ in general formula (b-1) shown above.

In general formula (T1-1), $Yt^{101}$ represents a single bond or a divalent linking group including an oxygen atom.

The description for $Yt^{101}$ in general formula (T1-1) is the same as the description for $Y^{101}$ in general formula (b-1) shown above.

In general formula (T1-1), $Vt^{11}$ represents a single bond, an alkylene group, or a fluorinated alkylene group. The alkylene group or the fluorinated alkylene group for $Vt^{101}$ preferably has 1 to 4 carbon atoms. As the fluorinated alkylene group for $Vt^{101}$, a group in which a hydrogen atom in the alkylene group for $Vt^{101}$ is partially or entirely substituted with a fluorine atom is exemplified. Among these, $Vt^{101}$ preferably represents a single bond or a fluorinated alkylene group having 1 to 4 carbon atoms.

In general formula (T1-1), $Rt^{102}$ represents a fluorine atom or a fluorinated alkyl group having 1 to 5 carbon atoms. $Rt^{102}$ preferably represents a fluorine atom, or a perfluoroalkyl group having 1 to 5 carbon atoms, and more preferably a fluorine atom.

Specific examples of the anion moiety of the component (T1-1) include a fluorinated alkyl sulfonate anion such as a trifluoromethane sulfonate anion and a perfluorobutane sulfonate anion, in a case where $Yt^{101}$ represents a single bond; and an anion represented by any one of general formulae (an-1) to (an-3) shown above, in a case where $Yt^{101}$ represents a divalent linking group including an oxygen atom.

Anion moiety of component (T1-2) In general formula (T1-2), $Rt^{104}$ and $Rt^{105}$ each independently represent a cyclic group which may have a substituent, a chain-like alkyl group which may have a substituent, or a chain-like alkenyl group which may have a substituent, and respective examples thereof include the same group as those exemplified for $Rt^{101}$ in general formula (T1-1). However, $Rt^{104}$ and $Rt^{105}$ may be bonded to each other to form a ring.

As for $Rt^{104}$ and $Rt^{105}$, a chain-like alkyl group which may have a substituent is preferable, and a linear or branched alkyl group or a linear or branched fluorinated alkyl group is more preferable.

The number of carbon atoms in the chain-like alkyl group is preferably 1 to 10, more preferably 1 to 7, and still more preferably 1 to 3. In the aforementioned range of the carbon number, the smaller number of carbon atoms of the chain-like alkyl group for $Rt^{104}$ and $Rt^{105}$ is preferable in order to improve solubility in a resist solvent. In addition, in the chain-like alkyl group for $Rt^{104}$ and $Rt^{101}$, the larger number of hydrogen atom which is substituted with a fluorine atom is preferable in order to increase the strength of an acid and improve transparency to high energy light of 200 nm or less or electron beams. The ratio of the fluorine atom in the chain-like alkyl group, that is, a fluorination rate, is preferably 70% to 100%, more preferably 90% to 100%, and most preferably a perfluoroalkyl group in which a hydrogen atom is entirely substituted with a fluorine atom.

In general formula (T1-2), $Vt^{102}$ and $Vt^{103}$ each independently represent a single bond, an alkylene group, or a fluorinated alkylene group, and respective examples thereof include the same groups as those exemplified for $Vt^{101}$ in general formula (T1-1).

In general formula (T1-2), $Lt^{101}$ to $Lt^{102}$ each independently represent a single bond or an oxygen atom.

Anion Moiety of (T1-3) Component

In general formula (T1-3), $Rt^{106}$ to $Rt^{108}$ each independently represent a cyclic group which may have a substituent, a chain-like alkyl group which may have a substituent, or a chain-like alkenyl group which may have a substituent, and respective examples thereof include the same groups as those exemplified for $Rt^{101}$ in general formula (T1-1).

$Lt^{103}$ to $Lt^{105}$ each independently represent a single bond, —CO— or —SO$_2$—.

Cation Moiety

In cation moiety in general formulae (T1-1) to (T1-3), $Rt^{301}$ to $Rt^{304}$ each independently represent a hydrogen atom or a linear, branched, or cyclic fluorinated alkyl group having 1 to 12 carbon atoms. $Rt^{301}$ to $Rt^{303}$ may be bonded to each other to form a ring with a nitrogen atom in the formula. As the ring to be formed, one ring including a nitrogen atom in the formula in its ring skeleton is preferably 3- to 10-membered ring including a nitrogen atom and particularly preferably 5- to 7-membered ring. Specific examples of the ring to be formed include a pyridine ring. Hereinafter, preferred and specific examples of the cation moiety of the compounds represented by general formulae (T1-1) to (T1-3) are described.

[Chemical formula 44]

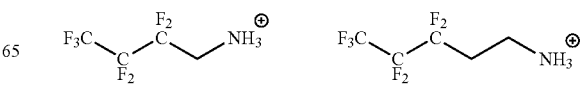

-continued

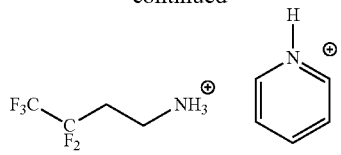

As a preferable example of the acid component (T1), a compound represented by general formula (T1-1) shown above is preferable, and as an anion moiety of the compound represented by general formula (T1-1) shown above, an anion moiety represented by formula (an-1) shown above is preferable.

In the embodiment, as the acid component (T1), the aforementioned compound (T1-2) is preferable.

In the acid generated from the aforementioned compound (T1-2), since the diffusion length of the acid is long and the acid strength is strong, in the step C, the organic solvent-soluble region and the organic solvent-insoluble region can be formed satisfactorily in the hole-unformed portion of the first contact hole pattern.

As the solution including an acid or a thermal acid generator, either of the aforementioned acid component (T0) or (T1) may be used alone or two or more thereof may be used in combination. Among these, the acid component (T1) is preferable.

In the solution including an acid or a thermal acid generator of the embodiment, the content of the acid component (T0) or (T1) is preferably 0.1 to 5 parts by mass, more preferably 0.15 to 3 parts by mass, and still more preferably 0.15 to 1.5 parts by mass with respect to 100 parts by mass of the base component (Tp) described below.

Base Component (Tp)

In the embodiment, a base component which is preferably included in the solution including an acid or a thermal acid generator is described. The base component which is preferably included in the solution including an acid or a thermal acid generator may be referred to as "base component (Tp)". The base component (Tp) is not particularly limited, as long as the component improves coatability of the solution including an acid or a thermal acid generator and can be removed in organic solvent developing in the step D, in other words, dissolved in an organic solvent.

In the embodiment, the base component (Tp) preferably includes a polymer compound (Tp1) including a structural unit having a hydrocarbon group which may have a substituent. Examples of the structural unit having a hydrocarbon group which may have a substituent include structural units represented by the following general formula (Tp)-1.

[Chemical formula 45]

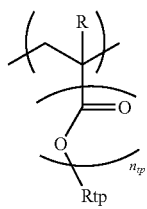

(Tp)-1

In the formula, R represents a hydrogen atom, an alkyl group having 1 to 5 carbon atoms, or a halogenated alkyl group having 1 to 5 carbon atoms, and Rtp represents a hydrocarbon group which may have a substituent. $n_{tp}$ represents 0 or 1.

In general formula (Tp)-1, R represents a hydrogen atom, an alkyl group having 1 to 5 carbon atoms, or a halogenated alkyl group having 1 to 5 carbon atoms, and R in formula (Tp)-1, which has the same description as for R in general formula (a1-1) shown above, preferably represents a hydrogen atom or a methyl group.

In general formula (Tp)-1, Rtp represents a hydrocarbon group which may have a substituent.

Examples of the hydrocarbon group for Rtp include an alkyl group having 1 to 20 carbon atoms, an alkyl group having 1 to carbon atoms; and a linear, or branched alkyl group. Specific examples thereof include a methyl group, an ethyl group, a propyl group, an isopropyl group, an n-butyl group, an isobutyl group, a tert-butyl group, a pentyl group, an isopentyl group, a neopentyl group, a 1,1-dimethyl ethyl group, a 1,1-diethyl propyl group, a 2,2-dimethyl propyl group, and a 2,2,-dimethyl butyl group.

In a case where Rtp is a cyclic hydrocarbon group, Rtp may be aliphatic, aromatic, or polycyclic or monocyclic. As a monocyclic alicyclic hydrocarbon group, a group in which one hydrogen atom is removed from monocycloalkane is preferable. The monocycloalkane preferably has 3 to 8 carbon atoms, and specific examples thereof include cyclopentane, cyclohexane, and cyclooctane. As a polycyclic alicyclic hydrocarbon group, a group in which one hydrogen atom is removed from polycycloalkane is preferable, the polycycloalkane preferably has 7 to 12 carbon atoms, and specific examples thereof include adamantane, norbornane, isobornane, tricyclodecane, and tetracyclododecane.

In a case where Rtp is an aromatic hydrocarbon group, specific examples thereof to be included include an aromatic hydrocarbon ring such as, benzene, biphenyl, fluorene, naphthalene, anthracene, and phenanthrene; and an aromatic heterocyclic ring in which a carbon atom configuring the aromatic hydrocarbon ring is partially substituted with a hetero atom. Examples of the hetero atom in the aromatic heterocyclic ring include an oxygen atom, a sulfur atom, and a nitrogen atom.

Specific examples of the aromatic hydrocarbon group include a group in which one hydrogen atom is removed from the aromatic hydrocarbon ring (an aryl group); and a group in which one hydrogen atom of the aryl group is substituted with an alkylene group (for example, an arylalkyl group such as a benzyl group, a phenethyl group, a 1-naphthylmethyl group, a 2-naphthylmethyl group, a 1-naphthylethyl group, and a 2-naphthylethyl group). The number of carbon atom in the alkylene group (an alkyl chain in the arylalkyl group) is preferably 1 to 4, more preferably 1 to 2, and particularly preferably 1.

Rtp may have a substituent or may have not. The examples of the substituent include an alkyl group, an alkoxy group, a halogen atom, a halogenated alkyl group, a hydroxyl group, and a carbonyl group.

The alkyl group as the substituent preferably has 1 to 5 carbon atoms and a methyl group, an ethyl group, a propyl group, an n-butyl group, or a tert-butyl group is most preferable.

The alkoxy group as the substituent preferably has 1 to 5 carbon atoms, a methoxy group, an ethoxy group, an n-propoxy group, an iso-propoxy group, an n-butoxy group, or a tert-butoxy group is preferable, and a methoxy group or an ethoxy group is most preferable.

Examples of the halogen atom as the substituent include a fluorine atom, a chlorine atom, a bromine atom, and an iodine atom, and a fluorine atom is preferable.

Examples of the halogenated alkyl group as the substituent include a group in which a hydrogen atom in the alkyl group is partially or entirely substituted with the halogen atom.

The cyclic aliphatic hydrocarbon group may be substituted with a substituent in which a part of a carbon atom configuring its ring structure includes a hetero atom. As the substituent including the hetero atom, —O—, —C(=O)—O—, —S—, —S(=O)$_2$—, or —S(=O)$_2$—O— is preferable.

Preferred examples of the structural unit represented by general formula (Tp)-1 include a structural unit ((Tp)-1-1) including a polar group-containing aliphatic hydrocarbon group having a polar group as a substituent, a structural unit ((Tp)-1-2) derived from hydroxystyrene, a structural unit ((Tp)-1-3) derived from styrene, a structural unit ((Tp)-1-4) including a chain-like or cyclic aliphatic hydrocarbon group, and a structural unit ((Tp)-1-5) derived from vinylalcohol.

In the embodiment, as the structural unit (Tp)-1-1, a structural unit (a3) including the aforementioned polar group-containing aliphatic hydrocarbon group is preferable, and among these, a structural unit represented by general formula (a3-1) or (a3-3) show above is preferable.

As the structural unit (Tp)-1-2, a structural unit represented by the following general formula (Tp)-1-2-1 is exemplified. As the structural unit (Tp)-1-3, a structural unit represented by the following general formula (Tp)-1-3-1 is exemplified.

[Chemical formula 46]

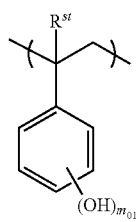

(Tp)-1-2-1

In general formula (Tp)-1-2-1, $R^{st}$ represents a hydrogen atom or a methyl group, and $m_{01}$ represents an integer of 1 to 3.

[Chemical formula 47]

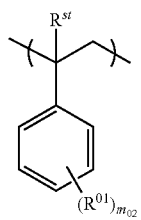

(Tp)-1-3-1

In general formula (Tp)-1-3-1, $R^{st}$ represents a hydrogen atom or a methyl group, $R^{01}$ represents an alkyl group having 1 to 5 carbon atoms, and $m_{02}$ represents an integer of 0 or 1 to 3.

In general formula (Tp)-1-2-1 shown above, $R^{st}$ represents a hydrogen atom or a methyl group, and a hydrogen atom is preferable.

$m_{01}$ represents an integer of 1 to 3. Among these, $m_{01}$ preferably represents 1.

The position of the hydroxyl group may be any one of the o-position, the m-position, and the p-position, and from a viewpoint of easy availability and a low price, m preferably represents 1 and the hydroxyl group is preferably in the p-position. In a case where $m_{01}$ is 2 or 3, an arbitrary substitution position may be combined.

In general formula (Tp)-1-3-1 shown above, $R^{st}$ represents a hydrogen atom or a methyl group and a hydrogen atom is preferable.

The aforementioned $R^{01}$ represents a linear or branched alkyl group having 1 to 5 carbon atoms, and examples thereof include a methyl group, an ethyl group, a propyl group, an isopropyl group, an n-butyl group, an isobutyl group, a tert-butyl group, a pentyl group, an isopentyl group, and a neopentyl group. Industrially, a methyl group or an ethyl group is preferable.

The aforementioned $m_{02}$ represents an integer of 0 or 1 to 3. Among these, $m_{02}$ is preferably 0 or 1 and industrially, particularly preferably 0.

In addition, in a case where $m_{02}$ represents 1, the substitution position of $R^{01}$ may be the o-position, the m-position, and the p-position, and further in a case where $m_{02}$ is 2 or 3, an arbitrary substitution position may be combined.

Examples of the structural unit (Tp)-1-4 include a structural unit represented by any one of general formulae (a4-1) to (a4-7) shown above and a structural unit represented by the following general formula (Tp)-1-4-1.

[Chemical formula 48]

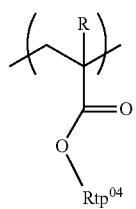

(Tp)-1-4-1

In general formula (Tp)-1-4-1, R represents a hydrogen atom, an alkyl group having 1 to 5 carbon atoms, or a halogenated alkyl group having 1 to 5 carbon atoms, and $Rtp^{04}$ represents a linear alkyl group having 1 to 10 carbon atoms.

Preferred examples of the polymer compound (Tp1) included in the base component (Tp) include a copolymer of the structural unit represented by (Tp)-1-2-1 and the structural unit represented by (Tp)-1-3-1, a copolymer of the structural unit represented by (Tp)-1-2 and the structural unit represented by (Tp)-1-3, a copolymer including the two or more structural units represented by (Tp)-1-1, and a copolymer including the two or more structural units represented by (Tp)-1-4.

By configuring the aforementioned base component (Tp), it is possible to prevent dissolution of the first resist pattern or entire mixture of the first layer and the layer including the acid diffusion control agent. In addition to the above, it is possible to improve solubility in an organic solvent in organic solvent developing in the following step.

In the solution including an acid or a thermal acid generator, one of the aforementioned base component (Tp) may be used alone or two or more thereof may be used in combination.

Solvent

In the embodiment, a solvent preferably included in the solution including an acid or a thermal acid generator (hereinafter, referred to as "solvent (Ts)") is described.

In the step B, the solution including an acid or a thermal acid generator is applied so as to cover the first resist pattern, thereby forming a first layer. Thus, the solvent (Ts) included in the solution including an acid or a thermal acid generator does not preferably dissolve the first resist pattern.

Specifically, water, an ether-based solvent, or linear monovalent alcohol having 1 to 10 carbon atoms is preferably adopted.

The ether-based solvent is an organic solvent including C—O—C in the structure. Examples thereof include diethyl ether, 1-(isopentyloxy)-3-methyl butane, diisopropyl ether, and tetrahydrofuran.

The alcohol-based solvent is preferably monovalent alcohol having 6 to 8 carbon atoms, and the monovalent alcohol may be linear, branched, or cyclic. Specific examples thereof include 1-hexanol, 1-heptanol, 1-octanol, 2-hexanol, 2-heptanol, 2-octanol, 3-hexanol, 3-heptanol, 3-octanol, 4-octanol, benzyl alcohol, 4-methyl pentane-2-ol, and 2-methyl butane-1-ol. Among these, 4-methyl-2-pentanol or 2-methyl butane-1-ol is more preferable.

The use amount of the solvent (Ts) is not particularly limited and appropriately set at the concentration applicable to the first resist pattern, depending on the film thickness to be applied. In general, the solvent is used such that the solid content of the solution including an acid or a thermal acid generator is within the range of 0.1% to 10% by mass and preferably within the range of 1% to 5% by mass.

Solution Including an Acid Diffusion Control Agent

The solution including an acid diffusion control agent used in the step B1 (hereinafter, referred to as "solution (Q1)") is not particularly limited as long as the solution can control the action of an acid.

As the solution (Q1), a solution in which an acid diffusion control agent and the base component (Qp) are dissolved in a solvent (Qs) can be used.

The acid diffusion control agent contained in the solution (Q1) is not particularly limited as long as the agent can act as a quencher which traps an acid of the acid component in the first layer. In the embodiment, a nitrogen-containing organic compound component described as a component (D2) in the resist composition is preferably adopted.

Among these, alkylamine is preferable, trialkylamine having 5 to 10 carbon atoms is more preferable, and tri-n-pentylamine or tri-n-octylamine is particularly preferable.

In addition, the acid diffusion control agent may be an ionic nitrogen-containing organic compound component, or preferably a compound including a cation moiety represented by the following general formula (Cd) and an anion moiety represented by general formula (d1-1) shown above.

[Chemical formula 49]

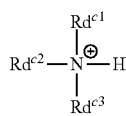

(Cd)

In general formula (Cd), $Rd^{c1}$ to $Rd^{c3}$ each independently represent an alkyl group which may have a substituent.

In general formula (Cd), $Rd^{c1}$ to $Rd^{c3}$ each independently represent an alkyl group which may have a substituent. Each $Rd^{c1}$ to $Rd^{c3}$ independently preferably represent a linear alkyl group having 1 to 5 carbon atoms.

In the solution (Q1), one acid diffusion control agent described above may be used alone or two or more thereof may be used in combination.

In the embodiment, in the solution including acid diffusion control agent, the content of the acid diffusion control agent is preferably 10 to 30 parts by mass, more preferably 12 to 25 parts by mass, and still more preferably 15 to 20 parts by mass with respect to 100 parts by mass of the base component (Qp) described below.

Base Component (Qp)

A preferable base component (Qp) contained in the solution (Q1) preferably includes the aforementioned polymer compound (Tp1).

Preferred examples of the base component (Qp) include a copolymer of the structural unit represented by general formula (Tp)-1-2 shown above and the structural unit represented by general formula (Tp)-1-3 shown above, a copolymer including the two or more structural unit represented by general formula (Tp)-1-4 shown above, and a copolymer of the structural unit represented by general formula (Tp)-1-1 shown above and the structural unit represented by general formula (Tp)-1-4 shown above.

By configuring the aforementioned base component (Qp), it is possible to prevent dissolution of the first resist pattern or entire mixture of the first layer and the layer including the acid diffusion control agent. In addition to the above, it is possible to improve solubility in an organic solvent in organic solvent developing in the following step.

In the solution (Q1), one base component (Qp) described above may be used alone or two or more thereof may be used in combination.

In the embodiment, the solvent (Ts) and the solvent (Qs) exemplified above may be the same as or different from each other.

In a case where the solvents are different from each other, for example, as the solvent (Ts), monovalent alcohol-based solvent may be selected and as the solvent (Qs), an ether-based solvent may be adopted, as the solvent (Ts), monovalent alcohol-based solvent may be selected and as the solvent (Qs), an ether-based solvent may be adopted, as the solvent (Ts), water may be selected and as the solvent (Qs), an ether-based solvent may be adopted, or as the solvent (Ts), monovalent alcohol-based solvent may be selected and as the solvent (Qs), water may be adopted.

The use amount of the solvent (Qs) is not particularly limited, and appropriately set at the concentration applicable to the first layer, depending on the film thickness to be applied. In general, the solvent (Qs) is used such that the solid content of the solution (Q1) is within the range of 0.1% to 10% by mass and preferably within the range of 1% to 5% by mass.

EXAMPLES

Hereinafter, the invention is described in detail using Examples, and the invention is not limited to these Examples.

Preparation of Positive-type Resist Composition

The respective components shown in the following Table 1 were mixed with each other to prepare a positive-type resist composition.

TABLE 1

| Component (A) | Component (B) | Component (D) | Component (E) | Component (F) | Component (S) |
|---|---|---|---|---|---|
| (A)-1 [100] | (B)-1 [10] | (D)-1 [7] | (E)-1 [2] | (F)-1 [2] | (S)-1 [4000] |

In the above Table 1, each symbol indicates the following. The numerical value within the brackets indicates a blending amount (parts by mass).

(A)-1: The following polymer compound (A)-1.
(B)-1: The following compound (B)-1.
(D)-1: The following compound (D)-1.
(E)-1: Salicylic acid.
(F)-1: The following polymer compound (F)-1.
(S)-1: A mixed solvent of PGMEA/PGME/cyclohexanone (mass ratio 45/30/25).

[Chemical formula 50]

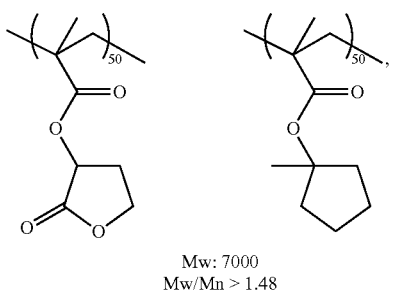

(A)-1

Mw: 7000
Mw/Mn > 1.48

[Chemical formula 51]

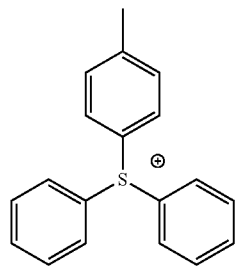

(B)-1

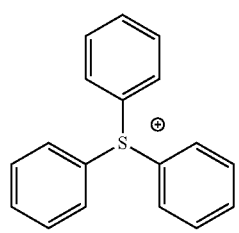

(D)-1

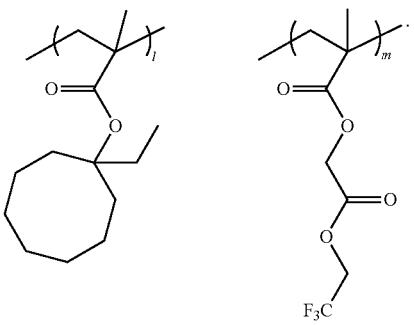

(F)-1

(Molar ratio: 1/m = 23/77),
Mw is 23100, Mw/Mn is 1.78

Preparation of Solution Including Thermal Acid Generator

The respective components were mixed with each other to prepare a solution including a thermal acid generator according to the following Table 2.

TABLE 2

| Solution including thermal acid generator | Polymer component | Acid component | Solvent component |
|---|---|---|---|
| 1 | Polymer 1 [100] | Acid component 1 [43] | Solvent component 1 [20265] |
| 2 | Polymer 1 [100] | Acid component 2 [40] | Solvent component 1 [19860] |
| 3 | Polymer 1 [100] | Acid component 2 [12] | Solvent component 1 [19888] |
| 4 | Polymer 1 [100] | Acid component 2 [2] | Solvent component 1 [19898] |

In the above Table 2, each symbol indicates the following. The numerical value within the brackets indicates a blending amount (parts by mass).

Polymer 1: The following polymer 1.
Aid components 1 and 2: The following acid components 1 and 2
Solvent component 1: 4-methyl-2-pentanol

[Chemical formula 52]

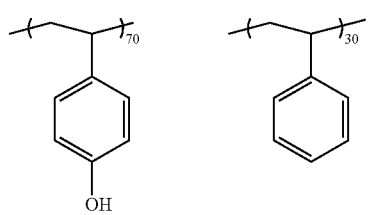

Polymer 1

Mw = 2800, Mw/Mn = 1.14

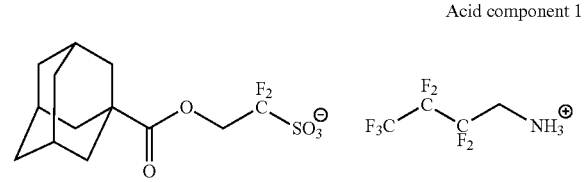

Acid component 1

Acid component 2

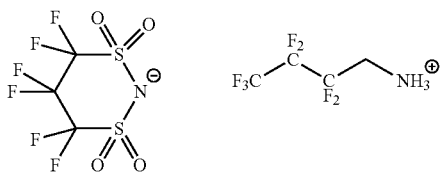

Preparation of Solution Including Acid Diffusion Control Agent

The respective components shown in the following Table 3 were mixed with each other to prepare a solution including an acid diffusion control agent.

TABLE 3

| Solution including an acid diffusion control agent | Polymer component | Acid diffusion control agent component | Solvent component |
|---|---|---|---|
| 1 | Polymer 2 [100] | Acid diffusion control agent component 1 [11.11] | Solvent component 2 [11000] |

In the above Table 3, each symbol indicates the following. The numerical value within the brackets indicates a blending amount (parts by mass).
Polymer 2: The following polymer 2.
Acid diffusion control agent component 1: Tri-n-octylamine
Solvent component 2: Isoamyl ether

[Chemical formula 53]

Polymer 2

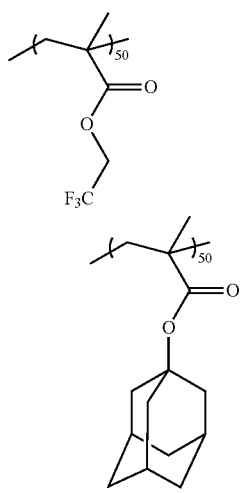

Mw = 16900, Mw/Mn = 1.67

Formation of Resist Pattern
Step A

An organic antireflection film composition "ARC29A" (trade name, manufactured by Brewer Science, Inc.) was applied to a 12-inch silicon wafer using a spinner, baked on a hot plate at 205° C. for 60 seconds, and dried to form an organic antireflection film having a film thickness of 89 nm, thereby preparing a support.

Next, the obtained positive-type resist composition was applied to the organic antireflection film using a spinner, prebaked (PAB) on hot plate at a temperature of 110° C. for 60 seconds, and dried to form a resist film having a film thickness of 90 nm.

Next, the resist film was selectively irradiated with ArF excimer laser (193 nm) via a mask pattern (binary mask; mask size of 50 nm) using exposure equipment NSR-S609B (manufactured by NIKON CORPORATION, NA=1.07 Dipole with polano).

Next, the resist film was alkali developed at 23° C. for seconds using 2.38% by mass of a tetramethylammonium hydroxide (TMAH) aqueous solution "NMD-3" (trade name, manufactured by TOKYO OHKA KOGYO Co., Ltd.).

As a result, a first contact hole pattern (may be referred to as "first CH pattern") including a hole portion and a hole-unformed portion having a size respectively shown in Table 4 was formed.

Step B

Each of the obtained solutions including a thermal acid generator 1 to 4 is applied to the silicon wafer with the first CH pattern formed, which is obtained in the step A, so as to cover the first CH pattern using a spinner (1500 rpm), and a structure including the first CH pattern and a first layer which covers the first CH pattern was obtained.

Step B1

The solution including an acid diffusion control agent was applied by spin coating so as to cover the structure obtained in the step B.

Step C

The structure to which the solution including an acid diffusion control agent was applied in the step B1 was baked for 60 seconds at each heating temperature shown in Table 4.

Step D

After the step C, the baked structure was developed in an organic solvent for 13 seconds using butyl acetate. Thus, a second contact hole pattern (referred to as "second CH pattern") was formed on a hole-unformed portion while maintaining a hole portion of the first CH pattern.

Evaluation of Resist Pattern

A pitch of the first CH pattern, a hole diameter of the second CH pattern, and a width of the organic solvent-insoluble region were measured with respect to the formed resist pattern. The result thereof is shown in Table 4.

Figure 4:
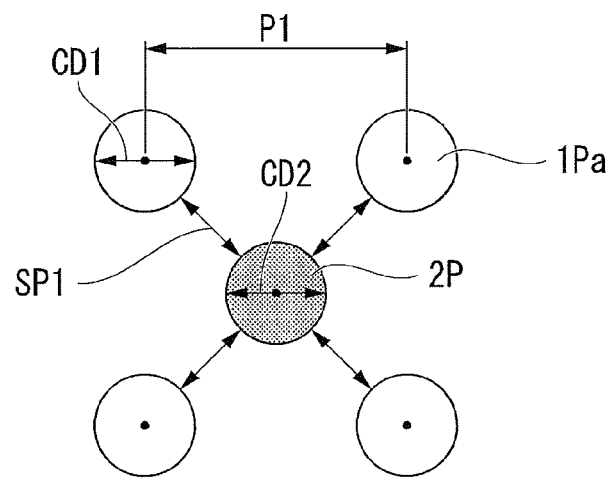
FIG. 4 is a view illustrating a pitch of the resist pattern formed by the method for forming a resist pattern of the invention.

FIG. 4 is a schematic view of the resist pattern which can be formed by the method for forming a resist pattern of the invention. In FIG. 4, 1Pa indicates a hole portion of the first CH pattern and 2P indicates a hole portion of the second CH pattern.

The pitch of the first pattern shown in Table 4 is a portion shown by P1 in FIG. 4, the hole diameter of the first pattern is a portion shown by CD1 in FIG. 4, and the width of the organic solvent-insoluble region is a portion shown by SP1 in FIG. 4.

TABLE 4

| First layer (Applied film thickness) | Heating temperature of step C (° C.) | Pitch of first CH pattern (nm) | Hole diameter of first CH pattern [pattern height] (nm) | Width of organic solvent-insoluble region (nm) |
|---|---|---|---|---|
| Reference Example 1 | — | — | 110 | 65 [50] | — |

TABLE 4-continued

| First layer (Applied film thickness) | Heating temperature of step C (° C.) | Pitch of first CH pattern (nm) | Hole diameter of first CH pattern [pattern height] (nm) | Width of organic solvent-insoluble region (nm) |
|---|---|---|---|---|
| | | | 72 [50] | — |
| | | | 77 [50] | — |
| Example 1 Solution including a thermal acid generator 1 (18 nm) | 110 | 110 | 65 [38] | 20 |
| | | | 77 [30] | 10 |
| Example 2 Solution including a thermal acid generator 2 (17 nm) | 80 | 110 | 65 [50] | >23 |
| | | | 77 [30] | 15 |
| Example 3-1 Solution including a thermal acid generator 3 (16 nm) | 80 | 110 | 65 [35] | 20 |
| | | | 72 [40] | 15 |
| | | | 77 [35] | 15 |
| Example 3-2 Solution including a thermal acid generator 3 (16 nm) | 90 | 110 | 65 [50] | 15 |
| | | | 72 [40] | 15 |
| | | | 77 [40] | 15 |
| Example 3-3 Solution including a thermal acid generator 3 (16 nm) | 100 | 110 | 65 [40] | 20 |
| | | | 72 [35] | 15 |
| | | | 77 [35] | 10 |
| Example 3-4 Solution including a thermal acid generator 3 (16 nm) | 110 | 110 | 65 [40] | 20 |
| | | | 72 [40] | 20 |
| | | | 77 [40] | 15 |

As shown in Table 4, it was possible to form a resist pattern in which the second CH pattern is formed in the hole-unformed portion of the first CH pattern according to the method for forming a resist pattern of the present invention.

Result of SEM Photographing of Resist Pattern

Figure 5E:
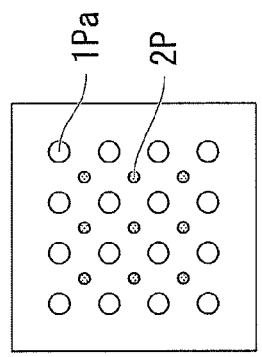
FIGS. 5A to 5H are views and electron microscope photographs illustrating a result of Examples of the invention.
Figure 5F:
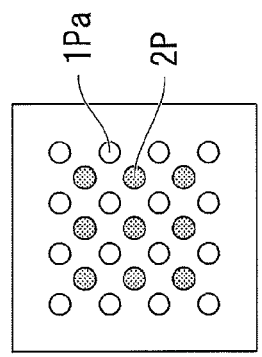
Figure 5G:
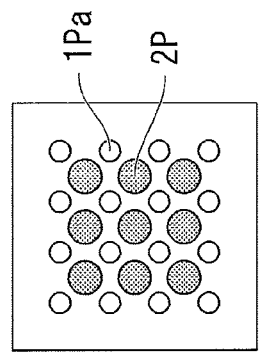
Figure 5H:
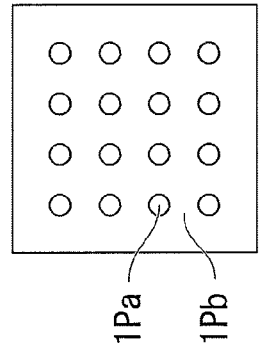
Figure 5A:
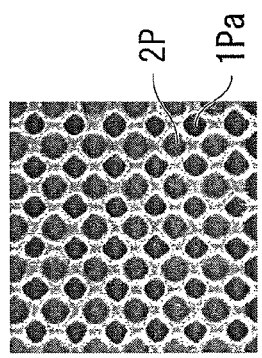

FIG. 5A illustrates a scanning electron microscope photo of the resist pattern in a case where the hole diameter formed in Reference Example 1 is 77 nm.

Figure 5B:
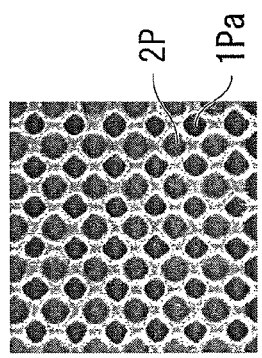

FIG. 5B illustrates a scanning electron microscope photo of the resist pattern in a case where the hole diameter formed in Example 3-2 is 77 nm.

Figure 5C:
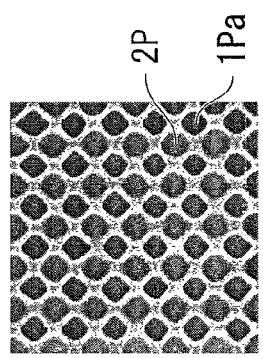

FIG. 5C illustrates a scanning electron microscope photo of the resist pattern in a case where the hole diameter formed in Example 3-3 is 77 nm.

Figure 5D:
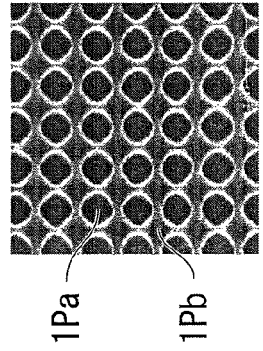

FIG. 5D illustrates a scanning electron microscope photo of the resist pattern in a case where the hole diameter formed in Example 3-4 is 77 nm.

FIGS. 5E, 5F, 5G, and 5H are respectively schematic views of the FIGS. 5A, 5B, 5C, and 5D and show the formation array of the first CH pattern 1Pa and the second CH pattern 2P. As shown in FIGS. 5A to 5D, in Example 3-2 to Example 3-4, it was possible to form the second CH pattern 2P in the portion shown by a hole-unformed portion 1Pb in Reference Example 1.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method for forming a resist pattern comprising:
   forming a first contact hole pattern including a hole portion and a hole-unformed portion, which includes forming a positive-type resist film on a support, exposing the positive-type resist film, and alkali developing the exposed positive-type resist film;
   preparing a structure including the first contact hole pattern and a first layer which covers the first contact hole pattern, which includes forming a first layer by applying a solution including an acid or a thermal acid generator onto the first contact hole pattern so as to cover the first contact hole pattern and be in contact with a surface in a radial direction of the hole portion of the first contact hole pattern;
   forming an organic solvent-soluble region and an organic solvent-insoluble region in the hole-unformed portion of the alkali-developed resist film by heating the structure to cause the action of an acid generated from the thermal acid generator or an acid in the first layer and reduce solubility of the alkali-developed resist film in the periphery of the hole portion of the first contact hole pattern in an organic solvent, wherein the organic solvent-insoluble region is formed in the periphery of the hole portion of the first contact hole pattern by the reduction of solubility of the alkali-developed resist film in an organic solvent, and the organic solvent-soluble region is the remaining hole- unformed portion of the alkali-developed resist film excluding the organic solvent-insoluble region; and
   forming a second contact hole pattern in the hole-unformed portion of the alkali-developed resist film, which includes developing the heated structure by an organic solvent to remove the organic solvent-soluble region in the hole-unformed portion of the alkali-developed resist film while maintaining the hole portion of the first contact hole pattern.

2. The method for forming a resist pattern according to claim 1, wherein the thermal acid generator includes a compound represented by general formula (T1-2) shown below:

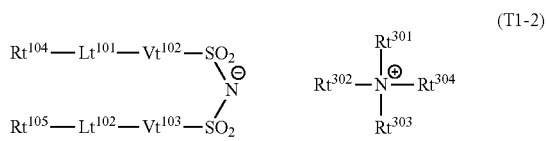

(T1-2)

wherein $Rt^{104}$ to $Rt^{105}$ each independently represent a cyclic group which may have a substituent, a chain-like alkyl group which may have a substituent, or a chain-like alkenyl group which may have a substituent; $Rt^{104}$ and $Rt^{105}$ may be bonded to each other to form a ring; $Vt^{102}$ and $Vt^{103}$ each independently represent a single bond, an alkylene group, or a fluorinated alkylene group; $Lt^{101}$ and $Lt^{102}$ each independently represent a single bond or an oxygen atom; $Rt^{301}$ to $Rt^{304}$ each independently represent a hydrogen atom or a linear, branched, or cyclic fluorinated alkyl group having 1 to 12 carbon atoms; and $Rt^{301}$ to $Rt^{303}$ may be bonded to each other to form a ring with a nitrogen atom in the formula.

3. The method for forming a resist pattern according to claim 1, further comprising:
applying a solution including an acid diffusion control agent onto the first layer after preparing the structure including the first contact hole pattern and a first layer which covers the first contact hole pattern; and before forming the organic solvent-soluble region and an organic solvent-insoluble region on the hole-unformed portion.

4. The method for forming a resist pattern according to claims 1, wherein the structure is heated at a temperatre of 80° C. to 150° C.

* * * * *